United States Patent
Lin

(10) Patent No.: US 11,137,672 B2
(45) Date of Patent: Oct. 5, 2021

(54) MASK AND METHOD FOR FORMING THE SAME

(71) Applicant: TAIWAN SEMICONDUCTOR MANUFACTURING CO., LTD., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 115 days.

(21) Appl. No.: 16/512,795

(22) Filed: Jul. 16, 2019

(65) Prior Publication Data

US 2021/0018828 A1   Jan. 21, 2021

(51) Int. Cl.
  *G03F 1/24* (2012.01)
  *G03F 1/48* (2012.01)

(52) U.S. Cl.
  CPC . *G03F 1/24* (2013.01); *G03F 1/48* (2013.01)

(58) Field of Classification Search
  CPC .................................... G03F 1/24; G03F 1/48
  USPC .......................................................... 430/5
  See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2010/0084375 A1* | 4/2010 | Hosoya | G03F 1/24 216/24 |

* cited by examiner

*Primary Examiner* — Christopher G Young
(74) *Attorney, Agent, or Firm* — McClure, Qualey & Rodack, LLP

(57) ABSTRACT

A method of forming a mask includes forming a reflective multilayer over a substrate; forming a capping layer over the reflective multilayer, in which the capping layer includes a ruthenium-containing material and a low carbon solubility material that has a carbon solubility lower than a carbon solubility of the ruthenium-containing material; forming an absorption layer over the capping layer; and etching the absorption layer until exposing the capping layer.

20 Claims, 49 Drawing Sheets

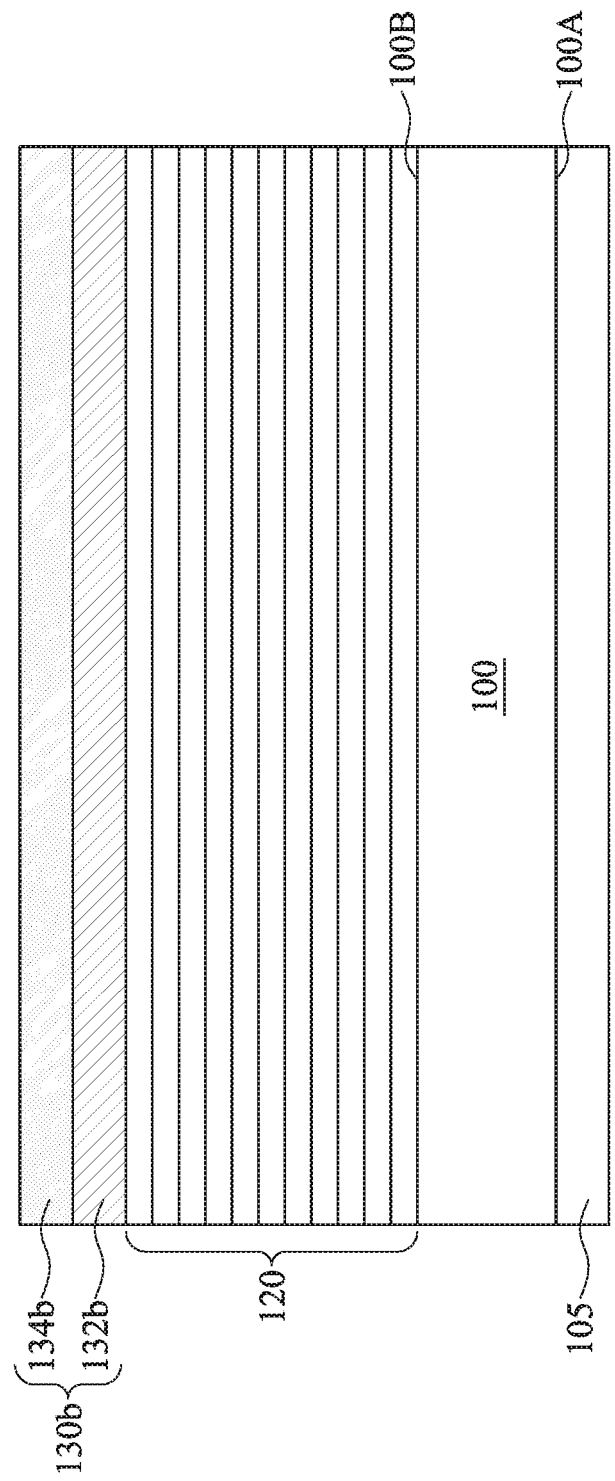

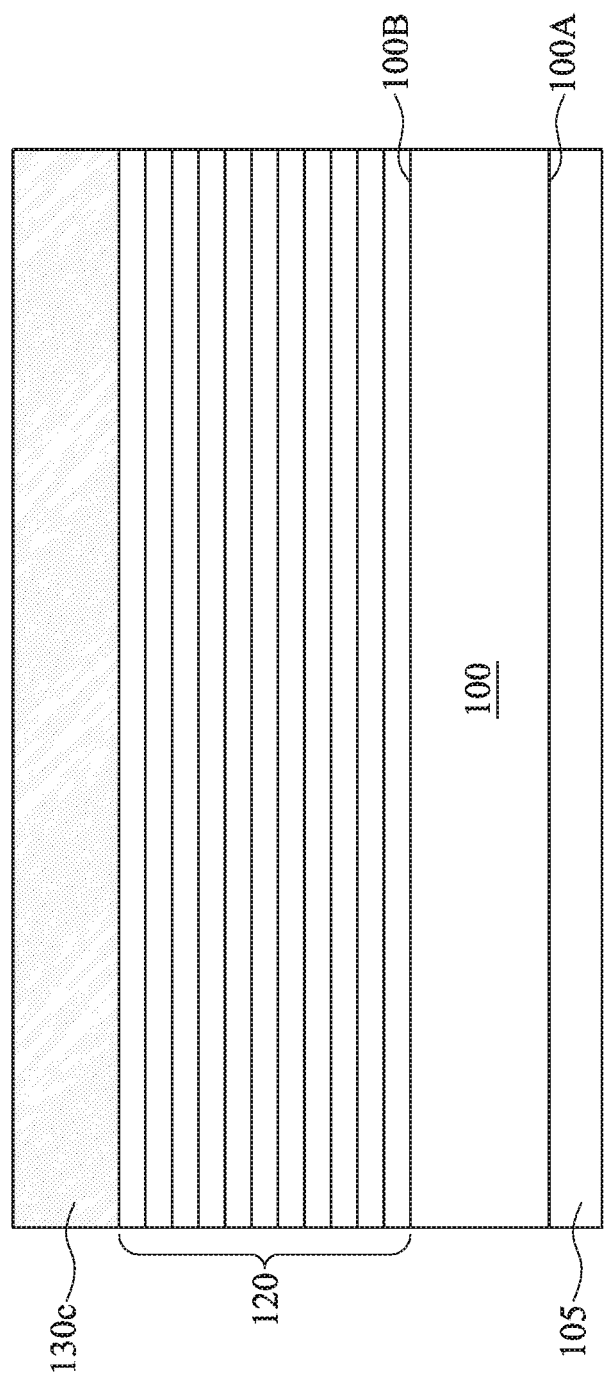

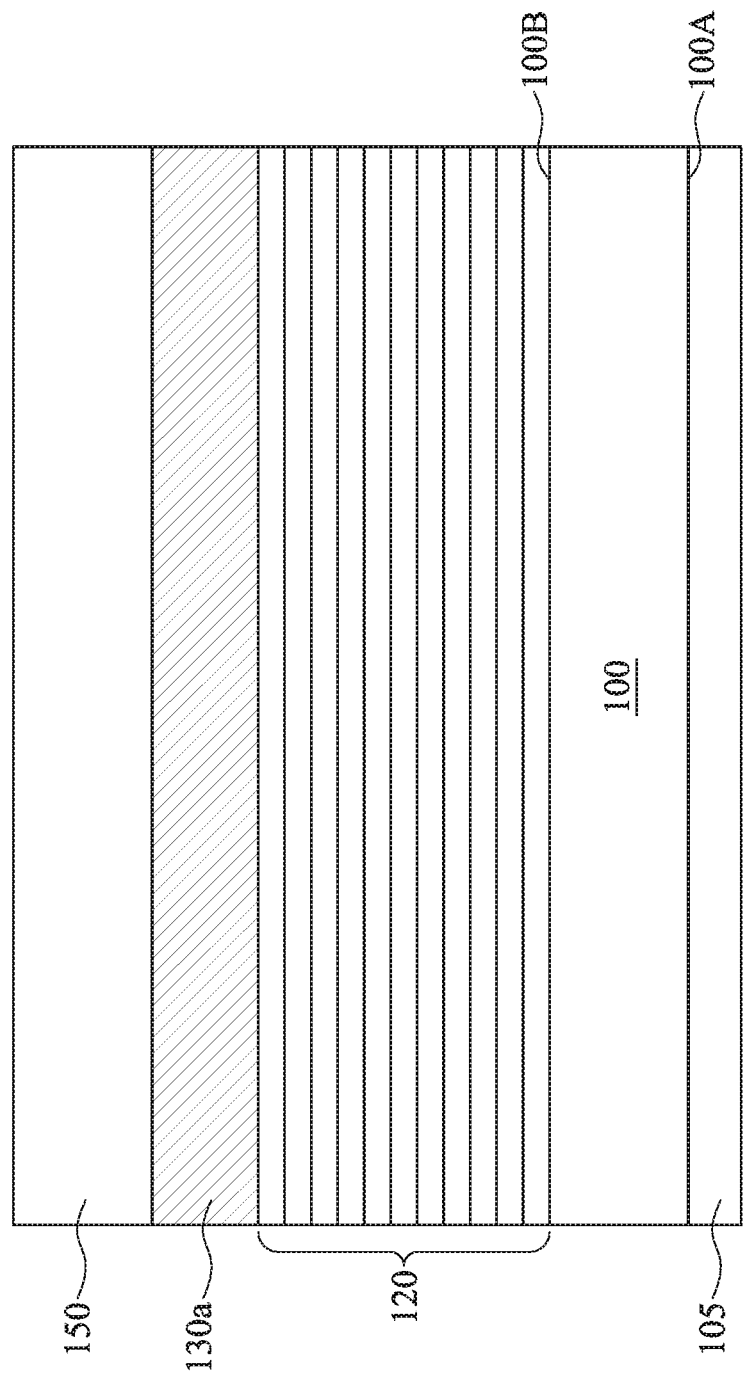

MASK AND METHOD FOR FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

EUVL employs scanners using light in the extreme ultraviolet (EUV) region, having a wavelength of about 1-100 nm. Some EUV scanners provide 4× reduction projection printing, similar to some optical scanners, except that EUV scanners use reflective rather than refractive optics, i.e., mirrors instead of lenses. EUV scanners provide desired patterns on wafers by transferring mask patterns defined by an absorber layer. Currently, binary intensity masks (BIM) accompanied by on-axis illumination (ONI) are employed in EUVL. In order to achieve adequate aerial image contrast for future nodes, e.g., nodes with a minimum pitch of 32 nm and 22 nm, etc., several techniques, e.g., attenuated phase-shifting mask (AttPSM) and alternating phase-shifting mask (AltPSM), have been developed to obtain resolution enhancement for EUVL. But each technique has limitations that need to be overcome. For example, an absorption layer may not fully absorb incident light and a portion of the incident light is reflected from the absorption layer. Also the thickness of the absorption layer causes the shadowing effect. All of these limitations often result in reduced aerial image contrast, which may lead to poor pattern profiles and poor resolution, particularly as pattern features continue to decrease in size. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14A and 14B are cross-sectional views of a method for manufacturing a mask at various stages in accordance with some embodiments of the present disclosure.

FIGS. 15A and 15B are cross-sectional views of a method for manufacturing a mask at various stages in accordance with some embodiments of the present disclosure.

FIGS. 23 to 27 are cross-sectional views of a method for manufacturing a mask at various stages in accordance with some embodiments of the present disclosure.

DETAILED DESCRIPTION

Figure 1:
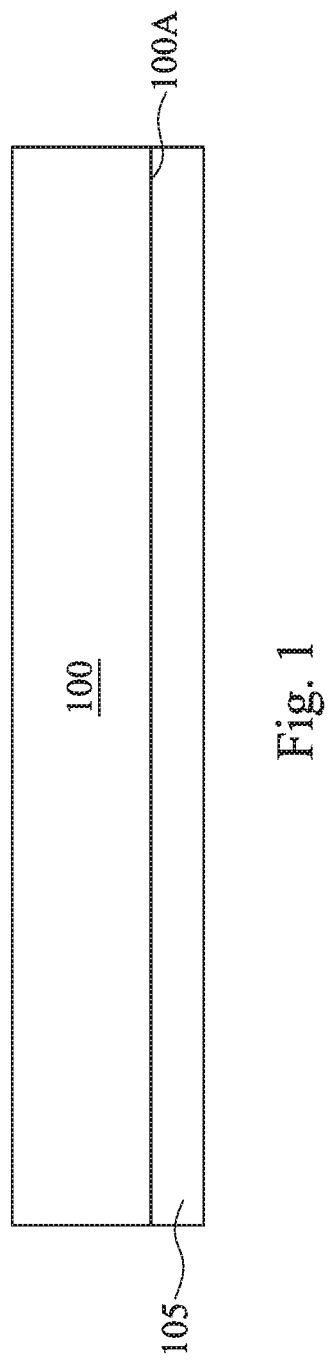
FIGS. 1 to 13 are cross-sectional views of a method for manufacturing a mask at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, fins may be patterned to produce a relatively close spacing between features, for which the above disclosure is well suited. In addition, spacers used in forming fins of FinFETs can be processed according to the above disclosure.

In one example associated with lithography patterning, a photomask (or mask) to be used in a lithography process has a circuit pattern defined thereon and is to be transferred to wafers. In advanced lithography technologies, an extreme ultraviolet (EUV) lithography process is implemented with a reflective mask. It is important that the EUV mask be as clean and defect-free as possible.

FIGS. 1 to 13 are cross-sectional views of a method for manufacturing a mask at various stages in accordance with some embodiments of the present disclosure. The following description refers to a mask and a mask fabrication process. The mask fabrication process includes two steps, namely, a blank mask fabrication process and a mask patterning process. During the blank mask fabrication process, a blank mask is formed by deposing suitable layers (e.g., multiple reflective layers) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

Reference is made to FIG. 1. A substrate 100 is received. In some embodiments, the substrate 100 may be made of low thermal expansion material (LTEM). In some embodiments, the LTEM material may include quartz, silicon, silicon carbide, and a silicon oxide-titanium oxide compound. Alternatively, the LTEM material may include $TiO_2$ doped $SiO_2$, and/or other low thermal expansion materials known in the art. During operation, the LTEM substrate 100 serves to reduce image distortion due to mask heating. In some embodiments, the LTEM substrate 100 includes materials with a low defect level and a smooth surface. In addition, a conductive layer 105 may be coated on a first surface 100A of the substrate 100 (see FIG. 2) for the purpose of electrostatic chucking. The conductive layer 105 may include chromium nitride (CrN), tantalum nitride (TaN), tantalum boron nitride (TaBN), and/or tantalum oxynitride (TaON), though other compositions are possible.

Figure 2:
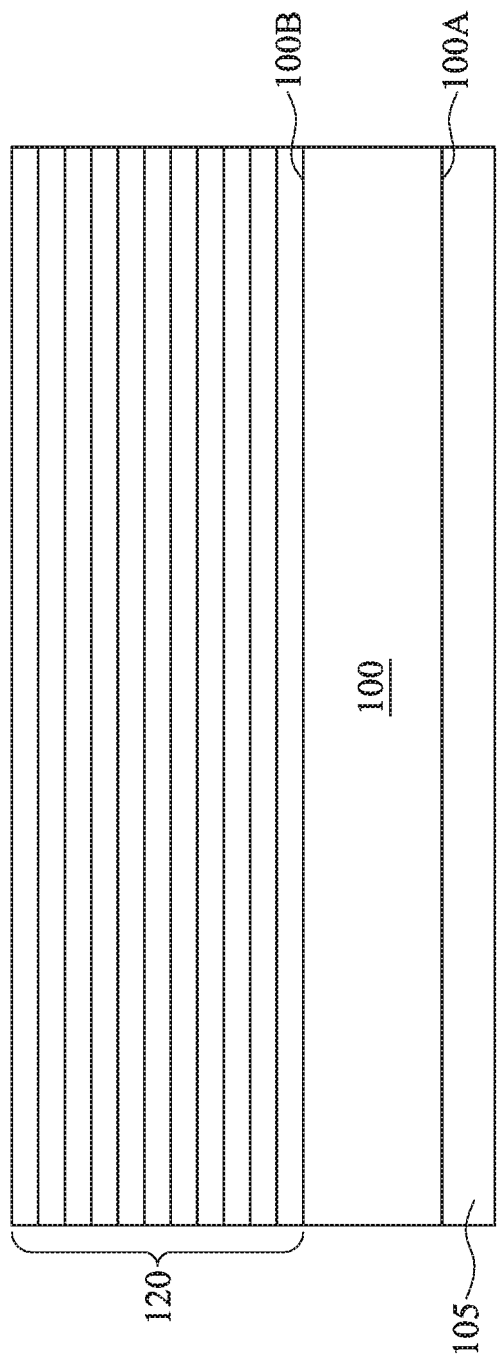

Reference is made to FIG. 2. A reflective multilayer (ML) 120 is formed on a second surface 100B of the substrate 100. According to Fresnel equations, light reflection occurs when light propagates across the interface between two materials of different refractive indices. Light reflection is larger when the difference of refractive indices is larger. To increase light reflection, one may also increase the number of interfaces by forming a multilayer of alternating materials and let light to be reflected from different interfaces interfere constructively by choosing an appropriate thickness for each layer inside the multilayer. However, the absorption of the employed materials for the multilayer limits the highest reflectivity that can be achieved. The reflective ML 120 includes a plurality of film pairs, such as molybdenum-silicon (Mo/Si) film pairs (e.g., a layer of molybdenum above or below a layer of silicon in each film pair). Alternatively, the reflective ML 120 may include molybdenum-beryllium (Mo/Be) film pairs, or any two materials or material combinations with a large difference in refractive indices and small extinction coefficients. The thickness of each layer of the reflective ML 120 depends on the wavelength of the incident light and the angle of incidence on the mask. For a specified angle of incidence, the thickness of the reflective ML 120 is adjusted to achieve maximal constructive interference for lights reflected at different interfaces of the reflective ML 120. In some embodiments, the number of film pairs of the reflective ML 120 is in a range of about 20 to about 80, however any number of film pairs is possible. In some embodiments, the reflective ML 120 includes forty pairs of layers of Mo/Si. Bach Mo/Si film pair has a thickness of about 7 nm, e.g., 3 nm for Mo and 4 nm for Si. In some embodiments of the present disclosure, a reflectivity of about 70% may be achieved.

According to the above descriptions, the reflective ML 120 may be formed by various methods, including a physical vapor deposition (PVD) process such as ion beam deposition (IBD) evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD), and/or other suitable methods.

Reference is made to FIGS. 3, 14A, 15A, 16A, 17A, 11A, 19A, 20A, 21A, and 22A. FIGS. 3, 14A, 15A, 16A, 17A, 18A, 19A, 20A, 21A, and 22A are methods for manufacturing capping layers at various stages on the reflective ML 120 in accordance with some embodiments of the present disclosure, respectively.

Figure 3:
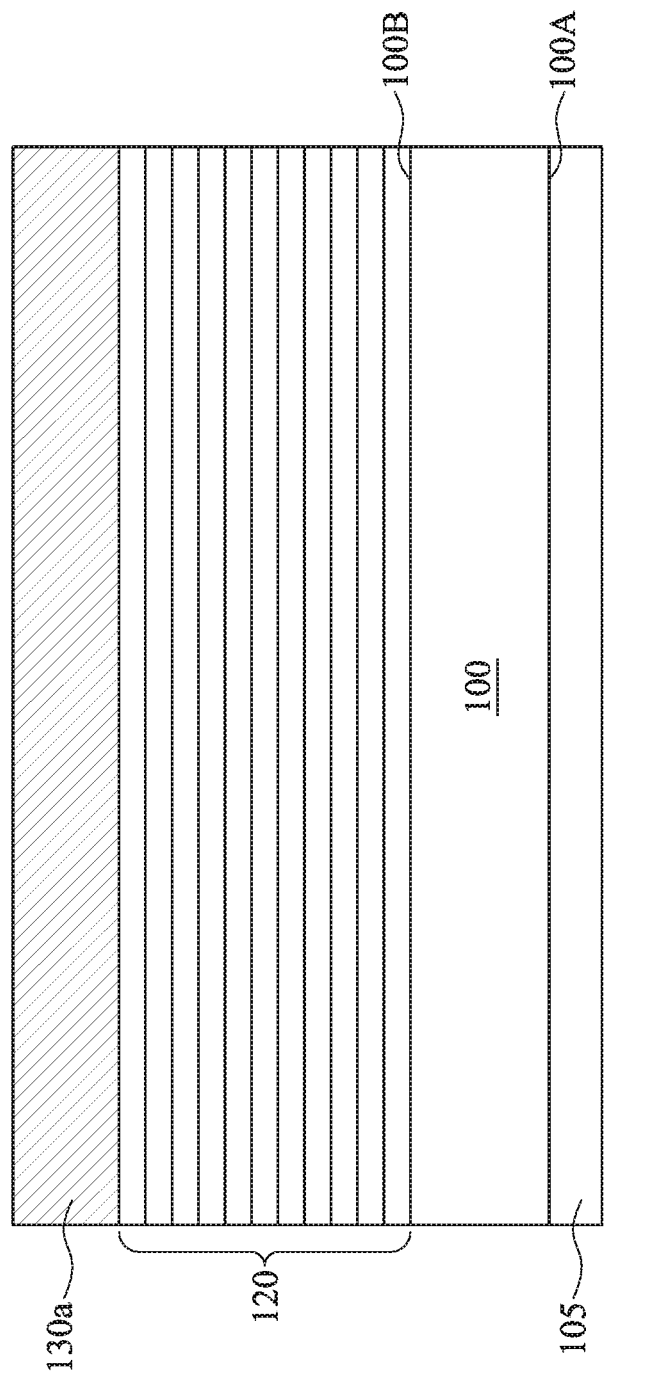

As shown in FIG. 3, a capping layer 130a is deposited on the reflective ML 120. The capping layer 130a has different etching characteristics from an absorption layer 150 (see FIG. 4) which will be formed on the capping layer 130a in a subsequent step. The capping layer 130a provides protection to the reflective ML 120, similar to the way in which an etch stop layer provides protection in a subsequent patterning or a repairing process of an absorber layer. Furthermore, the capping layer 130a is also designed to function as an anti-carbon barrier layer to protect the reflective ML 120 from carbon buildup formed thereon, in which such carbon buildup may absorb the light (radiation) projected onto a mask 200a. Therefore, the capping layer will not degrade the EUV reflectivity of the reflective ML 120.

It has been found that when an EUV mask is exposed to the atmosphere, a thin layer of carbon buildup accumulates on the surface of the mask. For example, the mask 200a may be placed in storage for a few days between the times it is used. While in storage, the exposure to the atmosphere causes carbon to form on the mask. This layer of carbon buildup is typically less than 5 nanometers thick. Moreover, this layer accumulates from the carbon of $CO_2$ gas, $C_xH_y$ gas, or any carbon-containing gas within the atmosphere. The thin carbon buildup adversely affects the reflective properties of the mask 200a. In some instances, $C_xH_y$ gas may dissociate/diffuse into metal due to surface adsorption of the metal, after which carbon buildup occurs on the surface of the metal.

In some embodiments, the capping layer 130a includes a low-oxygen reactive material and a low-carbon solubility material, of which the low-oxygen reactive material is less reactive with oxygen than the low-carbon solubility material, and the low-carbon solubility material has a carbon solubility lower than a carbon solubility of the low-oxygen reactive material. The capping layer 130a serves as a diffusion barrier which reduces the carbon poisoning of the capping layer 130a. Therefore, the capping layer 130a containing the low-carbon solubility material may lower the dissociation/diffusion of the carbon into metal and reduce the carbon buildup on the surface of the capping layer 130a, such that the reflective properties of the mask 200a may be improved.

In some embodiments, the low-oxygen reactive material includes ruthenium in which the carbon solubility thereof is about 0.3 atomic percentage, and the carbon solubility of the low-carbon solubility material is less than about 0.3 atomic percentage. In some embodiments, the low-carbon solubility material includes a niobium-containing material. In some embodiments, the low-carbon solubility material includes RuNb, RuTi, RuZr, RuY, RuB, or combinations thereof. In some embodiments, an atomic percentage content of the low-carbon solubility material in the capping layer 130a is in a range from about 5% to about 80%. In some embodiments, after an oxidizing of the capping layer, a volume expansion of the low-carbon solubility material due to the oxidizing is greater than that of the low-carbon solubility material. In some embodiments, if the atomic percentage content of the low-carbon solubility material in the capping layer 130a is greater than about 80%, after the oxidizing of the capping layer, the capping may crack due to the volume expansion of the low-carbon solubility material relative to the low-carbon solubility material, which in turn adversely affects the performance of the mask 200a. In some embodiments, if the atomic percentage content of the low-carbon solubility material in the capping layer 130a is less than about 5%, there is an insufficient amount of the low-carbon solubility material to lower the dissociation/diffusion of the carbon in the capping layer 130a and also to lower the formation of the carbon buildup on the surface of the capping layer 130a, which in turn adversely affects the performance of the mask 200a.

In some embodiments, the low-carbon solubility material is evenly distributed in the capping layer 130a and in contact with the absorption layer 150 and/or the reflective ML 120. In some embodiments, the low-oxygen reactive material is evenly distributed in the capping layer 130a and in contact with the absorption layer 150 and/or the reflective ML 120.

The oxidation to the mask may come from various sources, such as dry plasma-oxygen assisted etching, environment moisture, mask repairing and mask cleaning. For example, it was observed that the oxidative media used in EUV mask cleaning will induce a strong oxidation reaction of the reflective ML 120 and changes the local silicon of the reflective ML 120 to silica, which causes the deformation of the reflective ML 120 of the EUV mask 200a.

In the present disclosure, the capping layer 130a is designed and formed to have a strong anti-oxidation capability such that oxidation of the reflective ML 120 is effectively prevented, and is therefore also referred to as anti-oxidation barrier layer. In addition to the anti-oxidation capability, the capping layer 130a is designed with enough resistance to various chemicals and durability during various chemical processes, such as cleaning and etching. In some examples, ozonated water used to make the reflective mask 200a in a subsequent process introduces damage to the capping layer made of Ru and results in a significant EUV reflectivity drop. It was further observed that after Ru oxidation, Ru oxide is easily etched away by an etchant, such as $Cl_2$ or $F_2$ gas. Furthermore, the capping layer 130a is properly designed without degrading the reflectivity to the EUV light used during a lithography process. In the various embodiments, the capping layer 130a is designed and formed with those considerations in mind and to address identified issues.

In some embodiments, the capping layer 130a is designed with composition and morphology to effectively prevent the diffusion of oxygen to the reflective ML 120 through the capping layer 130a. Particularly, the capping layer 130a has an amorphous structure with an average interatomic distance less than the diameter of an oxygen ($O_2$) molecule. With such a configuration, the kinetic diameter of the oxygen molecule is more relevant to diffusion. The kinetic diameter of an oxygen molecule is about 3 angstrom. Therefore, the average interatomic distance of the capping layer 130a is less than 3 angstrom, thus effectively preventing oxygen molecules from diffusing through the capping layer 130a. The capping layer 130a is formed to be amorphous. This is because the polycrystalline structure in a capping layer includes grain morphology with many large boundary interfaces between polycrystalline grains, and the boundary interfaces provide paths for the diffusion of oxygen and eventually degrading the reflective ML 120 and the performance of the reflective mask 200a during a lithography process using the reflective mask 200a.

In some embodiments, the low-oxygen reactive material includes a ruthenium-containing material. In some embodiments, the capping layer 130a includes an alloy of ruthenium and a suitable metal "M" (RuM alloy), in which the metal "M" is highly oxygen unreactive. As noted above, the RuM alloy is formed with a composition, structure and thickness to effectively prevent oxygen from diffusing through the capping layer 130a. Particularly, the RuM alloy of the capping layer 130a is in an amorphous structure. In some examples, the capping layer 130a includes an alloy of Ru and platinum (Pt), or an RuPt alloy. In some embodiments, the metal "M" of RuM alloy is one of Po, Hg, Os, Rh, Pd, Ir, and Pt or a combination thereof. The RuM alloy is further discussed taking RuPt alloy as an example.

In some embodiments, the capping layer 130a includes an RuPt alloy. Platinum is chosen since it reacts only barely with oxygen. The RuPt alloy has a Ru and Pt ratio properly tuned to achieve the effectiveness of anti-oxidation. In the present example, the mass ratio of RuPt alloy ranges between 1:1 and 3.5:1. In some examples, the RuPt alloy is formed as the capping layer 130a on the reflective ML 120 by physical vapor deposition (PVD) using a RuPt target with a proper RuPt mass ratio. For example, the capping layer 130a of the RuPt alloy has a mass ratio ranging between 1:1 and 3.5:1. The RuPt alloy in the PVD target has a similar RuPt mass ratio ranging between 1:1 and 3.5:1. The RuPt alloy may be alternatively or additionally deposited by other suitable techniques.

According to the above descriptions, the capping layer 130a may be formed by various methods, including a physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD), and/or other suitable methods.

Reference is made to FIG. 14A, which shows an example of a mask 200b including a capping layer 130b formed on the reflective ML 120. The capping layer 130b provides protection to the reflective ML 120, similar to the way in which an etch stop layer provides protection in a subsequent patterning or a repairing process of an absorber layer. Furthermore, the capping layer 130b is also designed to function as an anti-carbon barrier layer to protect the reflective ML 120 from carbon buildup formed thereon, in which such carbon buildup may absorb the light (radiation) projected onto the mask 200b. Therefore, the capping layer 130b will not degrade the EUV reflectivity of the reflective ML 120.

In some embodiments, the capping layer 130b includes an oxide layer 134b and a metal layer 132b between the oxide layer 134b and the reflective ML 120. In some embodiments, a plasma process is performed on the capping layer 130a using oxygen, thereby oxidizing the capping layer 130a as illustrated in FIG. 3 to form the oxide layer 134b above the metal layer 132b as illustrated in FIG. 14A.

In some embodiments, the oxide layer 134b includes oxide of a low-oxygen reactive material and a low-carbon solubility material, of which the oxide of the low-carbon solubility material has a carbon solubility lower than a carbon solubility of the oxide of the low-oxygen reactive material. The capping layer 130b serves as a diffusion barrier which reduces the carbon poisoning of the capping layer 130b. Therefore, the oxide layer 134b containing low-carbon solubility material may lower the dissociation/diffusion of the carbon therein and reduce the carbon buildup on the surface of the capping layer 130b, such that the reflective properties of the mask 200b may be improved.

In some embodiments, the oxide layer 134b includes ruthenium in which the carbon solubility thereof is about 0.3 atomic percentage, and the carbon solubility of the oxide of the low-carbon solubility material is less than about 0.3 atomic percentage. In some embodiments, the oxide layer 134b includes oxide of a niobium-containing material, such as $NbO_x$. For example, the oxide layer 134b may include $Nb_2O_5$. In some embodiments, the oxide layer 134b may include RuNb, RuTi, RuZr, RuY, RuB, or combinations thereof. In some embodiments, an atomic percentage content of the oxide of the low-carbon solubility material in the oxide layer 134b is in a range from about 5% to about 80%.

In some embodiments, an atomic percentage of the oxide of the low-carbon solubility material in an upper portion of the oxide layer 134b is greater than that in a lower portion of the oxide layer 134b. In some embodiments, an atomic percentage of the oxide of the low-carbon solubility material in the oxide layer 134b is greater than that in the metal layer 132b.

In some embodiments, the oxide material of the capping layer 130b is spaced apart from the reflective ML 120 and in contact with the absorption layer 150 which will be formed thereon. In some embodiments, the metal layer 132b includes material that is substantially the same as that of the capping layer 130a shown in FIG. 3.

As shown in FIG. 14A, the plasma process is designed to introduce oxygen to the capping layer 130b such that it is densified to lower dissociation/diffusion of the carbon into metal, and such that the reflective properties of the mask 200b may be improved. Particularly, the plasma treated capping layer 130b is oxidized to have a tightly-packed structure. In some embodiments, the plasma treated capping layer 130b is an amorphous structure for anti-carbon dissociation/diffusion. In other aspects, the plasma process is controlled and tuned such that the oxygen is not introduced to the reflective ML 120, in order to maintain the reflectivity of the reflective ML 120.

After the capping layer 130b is plasma treated by oxygen, the grains of material shrink and the capping layer 130b is converted to an amorphous structure. This is used to provide an anti-carbon dissociation/diffusion barrier, where the amorphous phase means fewer diffusion paths than with a polycrystalline structure.

In some embodiments, the capping layer 130b is plasma treated by nitrogen, and thus the grains of material shrink and the capping layer 130b is converted to an amorphous structure. In some instances, nitrogenizing of the capping layer may increase its hardness and etching resistance, as well as lower a carbon solubility of the capping layer 130b.

Reference is made to FIG. 15A, which shows an example of a mask 200c including a capping layer 130c formed on the reflective ML 120. The capping layer 130c provides protection to the reflective ML 120, similar to the way in which an etch stop layer provides protection in a subsequent patterning or a repairing process of an absorber layer. Furthermore, the capping layer 130e is also designed to function as an anti-carbon barrier layer to protect the reflective ML 120 from carbon buildup formed thereon, in which such carbon buildup may absorb the light (radiation) projected onto the mask 200c. Therefore, the capping layer 130c will not degrade the EUV reflectivity of the reflective ML 120.

In some embodiments, the capping layer 130c may be an oxide layer. In some embodiments, a plasma process is performed on the capping layer 130a as shown in FIG. 3 using oxygen, thereby oxidizing the capping layer 130a as illustrated in FIG. 3 throughout the thickness thereof to form the capping layer 130c. In other aspects, the plasma process is controlled and tuned such that the oxygen is not introduced to the reflective ML 120, in order to maintain the reflectivity of the reflective ML 120.

In some embodiments, the capping layer 130c includes oxide of a low-oxygen reactive material and a low-carbon solubility material, of which the oxide of the low-carbon solubility material has a carbon solubility lower than a carbon solubility of the oxide of the low-oxygen reactive material. The capping layer 130c serves as a diffusion barrier which reduces the carbon poisoning of the capping layer 130b. Therefore, the capping layer 130c containing the low-carbon solubility material may lower the dissociation/diffusion of the carbon therein and reduce the carbon buildup on the surface of the capping layer 130c, such that the reflective properties of the mask 200c may be improved.

In some embodiments, the capping layer 130c includes ruthenium in which the carbon solubility thereof is about 0.3 atomic percentage, and the carbon solubility of the oxide of the low-carbon solubility material is less than about 0.3 atomic percentage. In some embodiments, the capping layer 130c includes oxide of a niobium-containing material, such as $NbO_x$. For example, the oxide layer 130c may include $Nb_2O_5$. In some embodiments, the capping layer 130c may include RuNb, RuTi, RuZr, RuY, RuB, or combinations thereof. In some embodiments, an atomic percentage content of the oxide of the low-carbon solubility material in the capping layer 130c is in a range from about 5% to about 80%.

In some embodiments, an atomic percentage of the oxide of the low-carbon solubility material in an upper portion the capping layer 130c is greater than that in a lower portion the capping layer 130c.

As shown in FIG. 15A, the plasma process is designed to introduce oxygen to the capping layer such that it is densified to lower dissociation/diffusion of the carbon into metal, and such that the reflective properties of the mask 2000 may be improved. Particularly, the plasma treated capping layer 130a is oxidized to have a tightly-packed structure. In some embodiments, the plasma treated capping layer 130b is an amorphous structure for anti-carbon dissociation/diffusion.

In other aspects, the plasma process is controlled and tuned such that the oxygen is not introduced to the reflective ML 120, in order to maintain the reflectivity of the reflective ML 120.

Figure 16A:
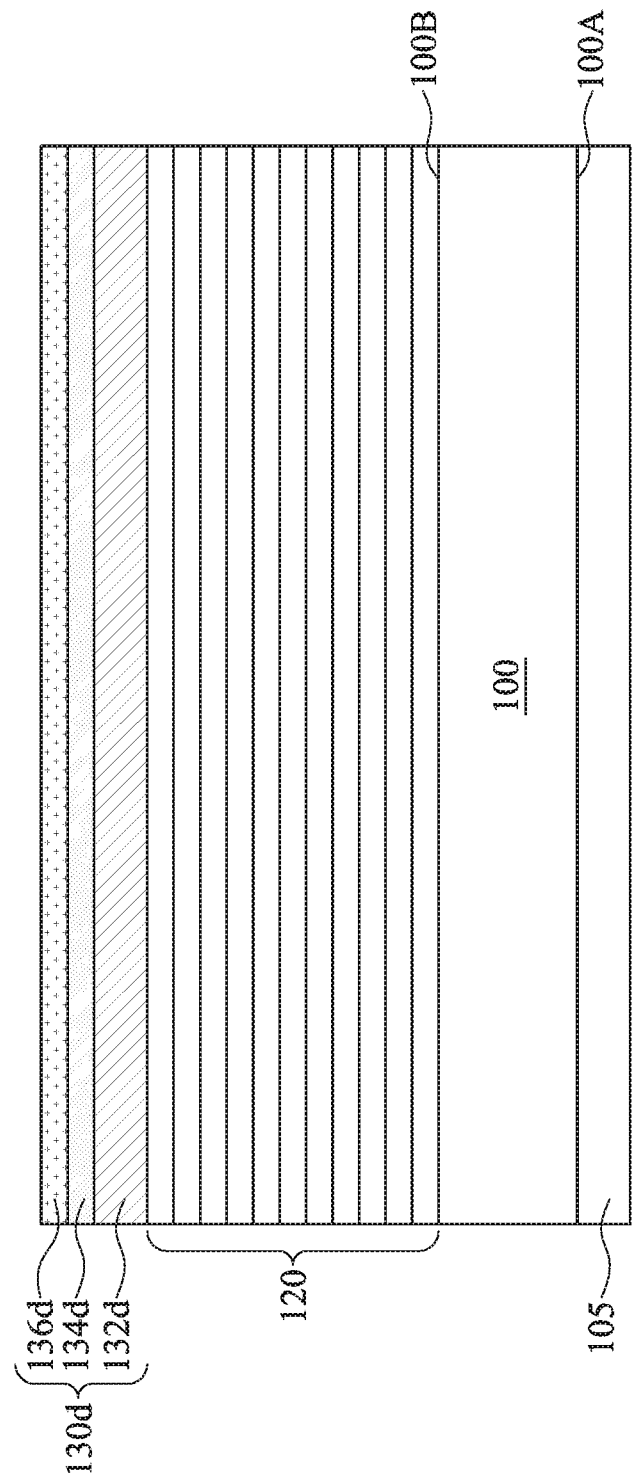
FIGS. 16A and 16B are cross-sectional views of a method for manufacturing a mask at various stages in accordance with some embodiments of the present disclosure.

Reference is made to FIG. 16A, which shows an example of a mask 200d including a capping layer 130d formed on the reflective ML 120. The capping layer 130d provides protection to the reflective ML 120, similar to the way in which an etch stop layer provides protection in a subsequent patterning or a repairing process of an absorber layer. Furthermore, the capping layer 130d is also designed to function as an anti-carbon barrier layer to protect the reflective ML 120 from carbon buildup formed thereon, in which such carbon buildup may absorb the light (radiation) projected onto the mask 200d. Therefore, the capping layer 130d will not degrade the EUV reflectivity of the reflective ML 120.

In some embodiments, the capping layer 130d includes a metal layer 132d over the reflective ML 120, a first oxide layer 134d over the metal layer 132d, and a second oxide layer 136d over the first oxide layer 134d. In some embodiments, a plasma process is performed on the capping layer 130b as shown in FIG. 14A using oxygen, thereby further oxidizing the capping layer 130b as illustrated in FIG. 14A to form the second oxide layer 136d above the metal layer 134d as illustrated in FIG. 16A.

In some embodiments, the second oxide layer 136d includes oxide of a low-carbon solubility material. In some embodiments, the second oxide layer 136d is ruthenium-free. For example, if the oxide layer 134b in the capping layer 130b shown in FIG. 14A includes an oxide material of a low-oxygen reactive material, such as $RuO_2$, then oxidizing of the capping layer 130b may convert $RuO_2$ to $RuO_4$ which will be vaporized and leave the oxide of the low-carbon solubility material in the capping layer 130b to form the second oxide layer 136d as shown in FIG. 16A. In addition, $RuO_2$ in the oxide layer 134b shown in FIG. 14A which does not convert to $RuO_4$ due to the oxidizing will form the first oxide layer 134d with the low-carbon solubility material as shown in FIG. 16A.

The second oxide layer 136d serves as a diffusion barrier which reduces the carbon poisoning of the capping layer 130d. Therefore, the second oxide layer 136d containing the low-carbon solubility material may lower the dissociation/diffusion of the carbon therein and reduce the carbon buildup on the surface of the capping layer 130d, such that the reflective properties of the mask 200d may be improved.

In some embodiments, the first oxide layer 134d includes ruthenium in which the carbon solubility thereof is about 0.3 atomic percentage, and the carbon solubility of the oxide of the low-carbon solubility material in the second oxide layer 136d is less than about 0.3 atomic percentage. In some embodiments, the second oxide layer 136d includes oxide of a niobium-containing material, such as $NbO_x$. For example, the second oxide layer 136d may include $Nb_2O_5$. In some embodiments, the second oxide layer 136d may include oxide of RuNb, RuTi, RuZr, RuY, RuB, or combinations thereof. In some embodiments, an atomic percentage of the oxide of the low-carbon solubility material in the second oxide layer 136d is greater than that in the first oxide layer 134d.

In some embodiments, the first oxide layer 134d includes material that is substantially the same as that of the oxide layer 134a in the capping layer 130a shown in FIG. 14A. In some embodiments, the metal layer 136d includes material that is substantially the same as that of the metal layer 130a in the capping layer 130a shown in FIG. 14A.

As shown in FIG. 16A, the plasma process is designed to introduce oxygen to the capping layer 130d such that it is densified to lower dissociation/diffusion of the carbon into metal, and such that the reflective properties of the mask 200d may be improved. Particularly, the plasma treated capping layer 130d is oxidized to have a tightly-packed structure. In some embodiments, the plasma treated capping layer 130d is an amorphous structure for anti-carbon dissociation/diffusion. In other aspects, the plasma process is controlled and tuned such that the oxygen is not introduced to the reflective ML 120, in order to maintain the reflectivity of the reflective ML 120.

Figure 17A:
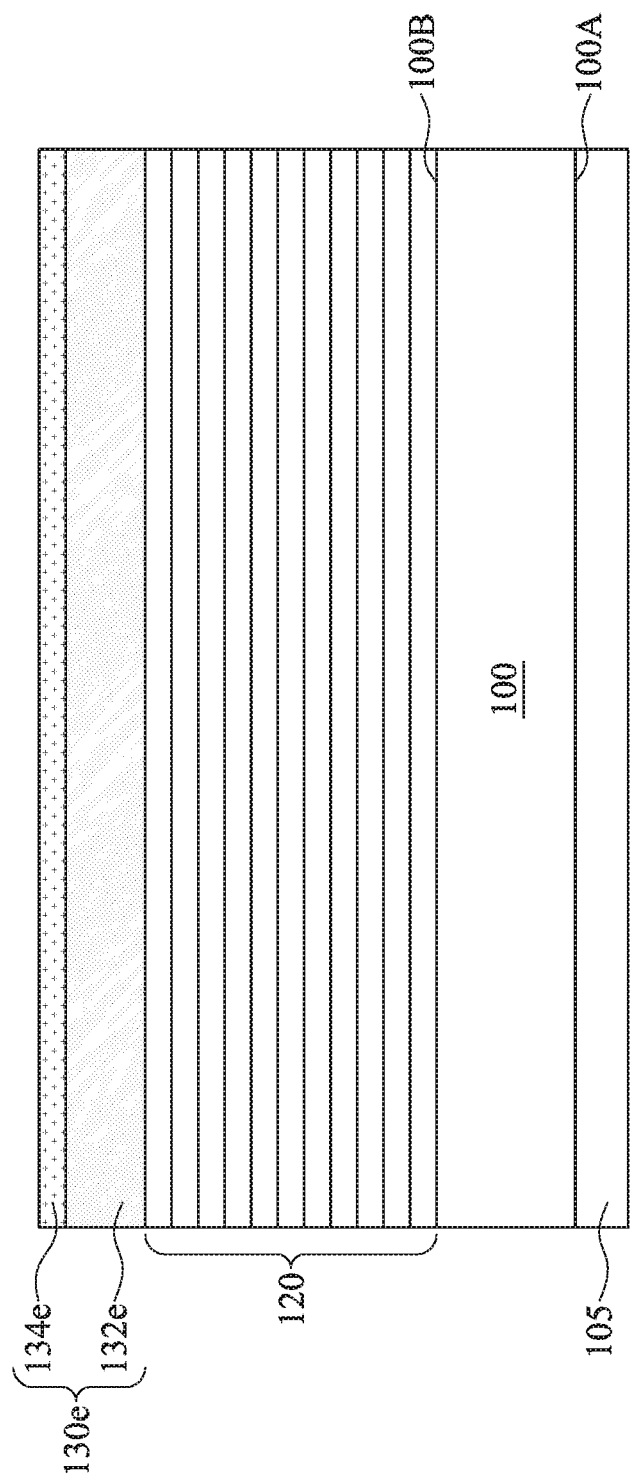
FIGS. 17A and 17B are cross-sectional views of a method for manufacturing a mask at various stages in accordance with some embodiments of the present disclosure.

Reference is made to FIG. 17A, which shows an example of a mask 200e including a capping layer 130e formed on the reflective ML 120. The capping layer 130e provides protection to the reflective ML 120, similar to the way in which an etch stop layer provides protection in a subsequent patterning or a repairing process of an absorber layer. Furthermore, the capping layer 130e is also designed to function as an anti-carbon barrier layer to protect the reflective ML 120 from carbon buildup formed thereon, in which such carbon buildup may absorb the light (radiation) projected onto the mask 200e. Therefore, the capping layer 130e will not degrade the EUV reflectivity of the reflective ML 120.

In some embodiments, the capping layer 130e includes a first oxide layer 132e over the reflective ML 120 and a second oxide layer 134e over the first oxide layer 132. In some embodiments, a plasma process is performed on the capping layer 130c as shown in FIG. 15A using oxygen, thereby further oxidizing the capping layer 130c as illustrated in FIG. 15A to form the second oxide layer 134e above the first oxide layer 132e as illustrated in FIG. 15A.

In some embodiments, the second oxide layer 134e includes oxide of a low-carbon solubility material. In some embodiments, the second oxide layer 134e is ruthenium-free. For example, if the oxide layer 134c in the capping layer 130c shown in FIG. 15A includes an oxide material of a low-oxygen reactive material, such as $RuO_2$, then oxidizing of the capping layer 130c may convert $RuO_2$ to $RuO_4$ which will be vaporized and leave the oxide of the low-carbon solubility material in the capping layer 130c to form the second oxide layer 134e as shown in FIG. 17A. In addition, $RuO_2$ in the capping layer 130c shown in FIG. 15A which does not convert to $RuO_4$ due to the oxidizing will form the first oxide layer 132e with the low-carbon solubility material as shown in FIG. 17A.

The second oxide layer 134e serves as a diffusion barrier which reduces the carbon poisoning of the capping layer 130e. Therefore, the second oxide layer 134e containing the low-carbon solubility material may lower the dissociation/diffusion of the carbon therein and reduce the carbon buildup on the surface of the capping layer 130e, such that the reflective properties of the mask 200e may be improved.

In some embodiments, the first oxide layer 132e includes ruthenium in which the carbon solubility thereof is about 0.3 atomic percentage, and the carbon solubility of the oxide of the low-carbon solubility material in the second oxide layer 134e is less than about 0.3 atomic percentage. In some embodiments, the second oxide layer 134e includes oxide of a niobium-containing material, such as $NbO_x$. For example, the second oxide layer 134e may include $Nb_2O_5$. In some embodiments, the second oxide layer 134e may include RuNb, RuTi, RuZr, RuY, RuB, or combinations thereof. In some embodiments, an atomic percentage of the oxide of the low-carbon solubility material in the second oxide layer 134e is greater than that in the first oxide layer 132e.

In some embodiments, the first oxide layer 132e includes material that is substantially the same as that of the oxide layer 134a in the capping layer 130a shown in FIG. 14A.

As shown in FIG. 17A, the plasma process is designed to introduce oxygen to the capping layer such that it is densified to lower dissociation/diffusion of the carbon into metal, and such that the reflective properties of the mask 200e may be improved. Particularly, the plasma treated capping layer 130e is oxidized to have a tightly-packed structure. In some embodiments, the plasma treated capping layer 130e is an amorphous structure for anti-carbon dissociation/diffusion. In other aspects, the plasma process is controlled and tuned such that the oxygen is not introduced to the reflective ML 120, in order to maintain the reflectivity of the reflective ML 120.

Figure 18A:
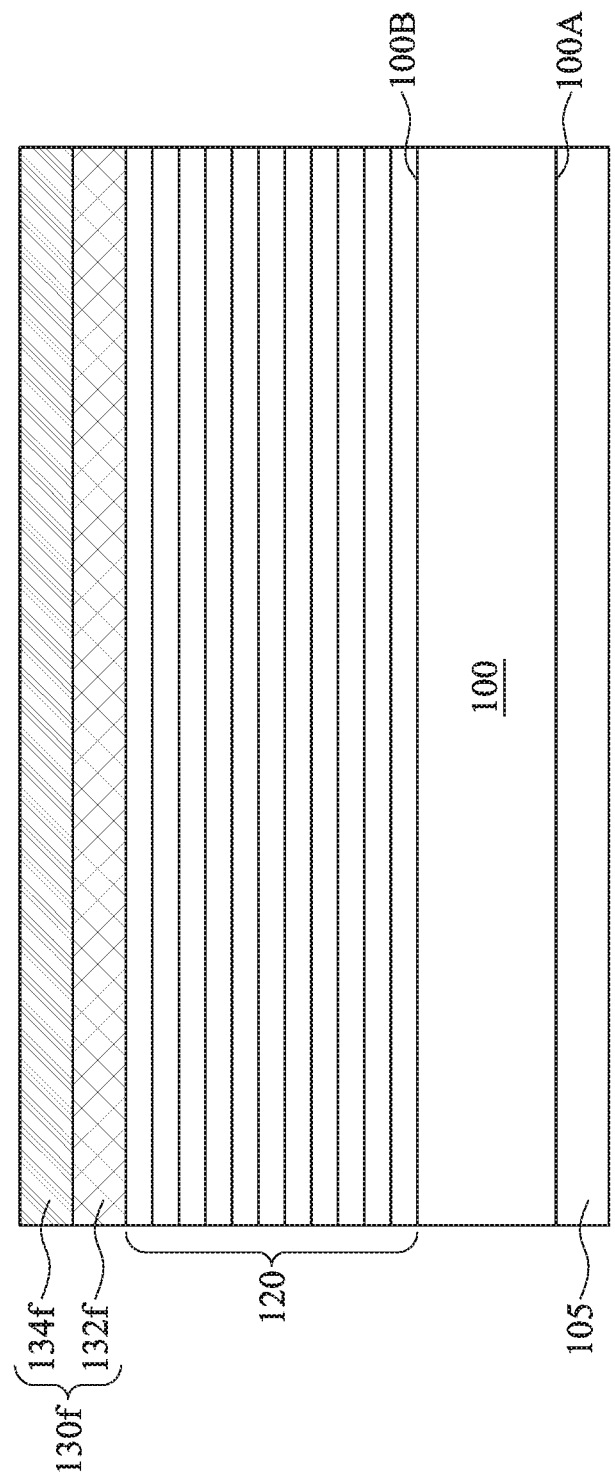
FIGS. 18A and 18B are cross-sectional views of a method for manufacturing a mask at various stages in accordance with some embodiments of the present disclosure.

Reference is made to FIG. 18A, which shows an example of a mask 200f including a capping layer 130f formed on the reflective ML 120. The capping layer 130f provides protection to the reflective ML 120, similar to the way in which an etch stop layer provides protection in a subsequent patterning or a repairing process of an absorber layer. Furthermore, the capping layer 130f is also designed to function as an anti-carbon barrier layer to protect the reflective ML 120 from carbon buildup formed thereon, in which such carbon buildup may absorb the light (radiation) projected onto the mask 200f. Therefore, the capping layer 130f will not degrade the EUV reflectivity of the reflective ML 120.

In some embodiments, the capping layer 130f includes a first metal layer 132f over the reflective ML 120 and a second metal layer 134f over the first metal layer 132f. In some embodiments, the first metal layer 132f includes a low-oxygen reactive material and is low-carbon solubility material-free. In some embodiments, the first metal layer 134f includes a low-carbon solubility material and is low-oxygen reactive material-free. In some embodiments, the low-oxygen reactive material is less reactive with oxygen than the low-carbon solubility material, and the low-carbon solubility material has a carbon solubility lower than a carbon solubility of the low-oxygen reactive material. The capping layer 134f serves as a diffusion barrier which reduces the carbon poisoning of the capping layer 130f. Therefore, the capping layer 134f containing the low-carbon solubility material may lower the dissociation/diffusion of the carbon into metal and reduce the carbon buildup on the surface of the capping layer 130f, such that the reflective properties of the mask 200f may be improved.

In some embodiments, the first metal layer 132f of the capping layer 130f includes ruthenium in which the carbon solubility thereof is about 0.3 atomic percentage, and the carbon solubility of the second metal layer 134f is less than about 0.3 atomic percentage. In some embodiments, the second metal layer 134f includes a niobium-containing material. In some embodiments, the second metal layer 134f includes is ruthenium-free. In some embodiments, the second metal layer 134f includes RuNb, RuTi, RuZr, RuY, RuB, or combinations thereof. In some embodiments, an atomic percentage content of the low-carbon solubility material in the capping layer 130f is in a range from about 5% to about 80%.

In some embodiments, the first metal layer 132f of the capping layer 130f is designed with composition and morphology to effectively prevent the diffusion of oxygen to the reflective ML 120 through the capping layer 130f. In some embodiments, the first metal layer 132f includes a ruthenium-containing material. In some embodiments, the first metal layer 132f is niobium-free. In some embodiments, the capping layer 130a includes an alloy of ruthenium and a suitable metal "M" (RuM alloy), in which the metal "M" is highly oxygen unreactive. As noted above, RuM alloy is formed with a composition, structure and thickness to effectively prevent oxygen from diffusing through the capping layer 130f. In some examples, the capping layer 130f includes an alloy of Ru and platinum (Pt), or an RuPt alloy. In some embodiments, the metal "M" of the RuM alloy is one of Po, Hg, Os, Rh, Pd, Ir, and Pt or a combination thereof. The RuM alloy is further discussed taking the RuPt alloy as an example.

According to the above descriptions, the first metal layer 132f and/or the second metal layer 134f may be formed by various methods, including a physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD), and/or other suitable methods.

Figure 19A:
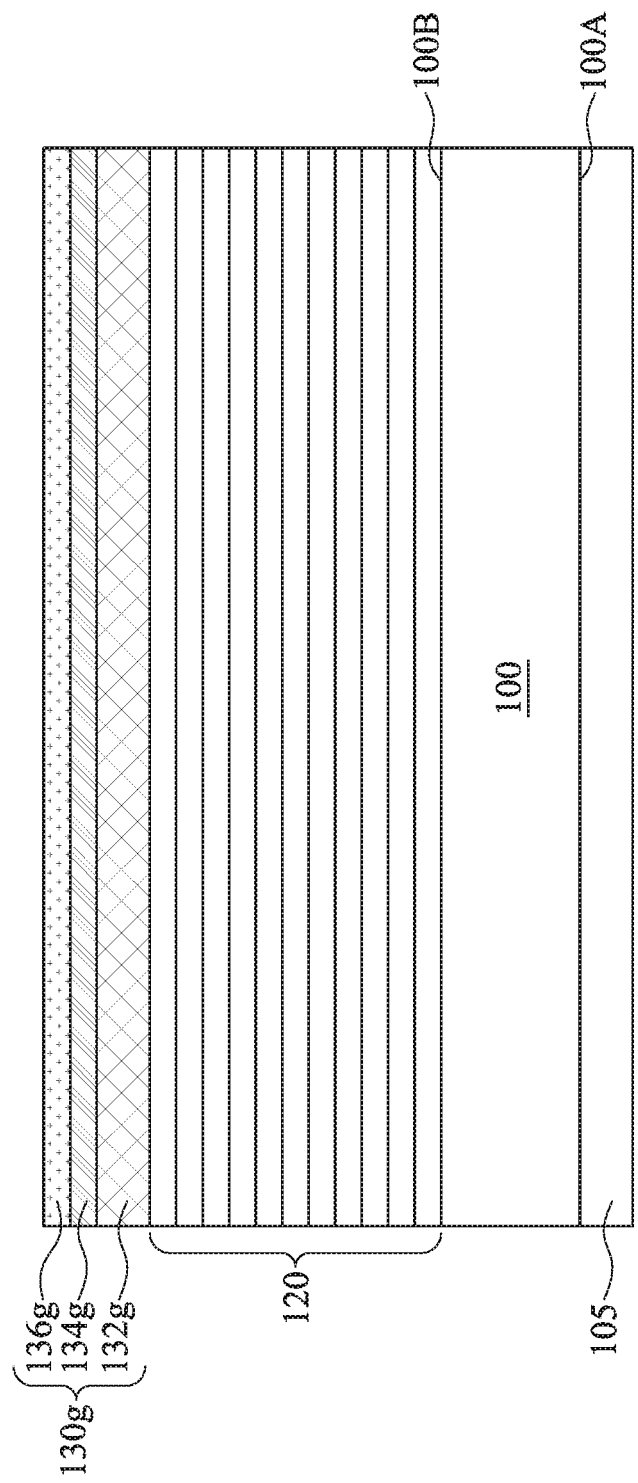
FIGS. 19A and 19B are cross-sectional views of a method for manufacturing a mask at various stages in accordance with some embodiments of the present disclosure.

Reference is made to FIG. 19A, which shows an example of a mask 200g including a capping layer 130g formed on the reflective ML 120. The capping layer 130f provides protection to the reflective ML 120, similar to the way in which an etch stop layer provides protection in a subsequent patterning or a repairing process of an absorber layer. Furthermore, the capping layer 130g is also designed to function as an anti-carbon barrier layer to protect the reflective ML 120 from carbon buildup formed thereon, in which such carbon buildup may absorb the light (radiation) projected onto the mask 200g. Therefore, the capping layer 130g will not degrade the EUV reflectivity of the reflective ML 120.

In some embodiments, the capping layer 130g includes a first metal layer 132g over the reflective ML 120, a second metal layer 134g over the first metal layer 132g, and an oxide layer 136g over the second metal layer 134g. In some embodiments, a plasma process is performed on the capping layer 130g as shown in FIG. 18A using oxygen, thereby oxidizing the capping layer 130g as illustrated in FIG. 18A to form the oxide layer 136g above the second metal layer 134g as illustrated in FIG. 19A.

In some embodiments, the oxide layer 136g includes oxide of a low-carbon solubility material and is low-oxygen reactive material-free. In some embodiments, the oxide of the low-carbon solubility material has a carbon solubility lower than a carbon solubility of the low-carbon solubility material without oxidizing. The oxide layer 136g serves as a diffusion barrier which reduces the carbon poisoning of the capping layer 130g. Therefore, the oxide layer 130g containing the low-carbon solubility material may lower the dissociation/diffusion of the carbon therein and reduce the carbon buildup on the surface of the capping layer 130g, such that the reflective properties of the mask 200g may be improved.

In some embodiments, the first metal layer 132g includes ruthenium in which the carbon solubility thereof is about 0.3 atomic percentage, and the carbon solubility of the second metal layer 134g and the oxide layer 136g are both less than about 0.3 atomic percentage. In some embodiments, the oxide layer 136g includes oxide of a niobium-containing material, such as $NbO_x$. For example, the oxide layer 136g may include $Nb_2O_5$. In some embodiments, the oxide layer 136g may include RuNb, RuTi, RuZr, RuY, RuB, or combinations thereof. In some embodiments, an atomic percentage content of the oxide of the low-carbon solubility material in the oxide layer 130g is in a range tom about 5% to about 80%.

In some embodiments, an atomic percentage of the oxide of the low-carbon solubility material in an upper portion the oxide layer 136g is greater than that in a lower portion of the oxide layer 136g. In some embodiments, an atomic percentage of the oxide material in the oxide layer 136g is greater than that in the second metal layer 134g.

In some embodiments, the oxide of the low-carbon solubility material is spaced apart from the reflective ML 120 and in contact with the absorption layer 150 which will be formed thereon. In some embodiments, the first metal layer 132g includes material that is substantially the same as that of the first metal layer 132f shown in FIG. 18A. In some embodiments, the second metal layer 134g includes material that is substantially the same as that of the second metal layer 134f shown in FIG. 18A.

As shown in FIG. 19A, the plasma process is designed to introduce oxygen to the capping layer such that it is densified to lower dissociation/diffusion of the carbon into metal, and such that the reflective properties of the mask 200g may be improved. Particularly, the plasma treated capping layer 130g is oxidized to have a tightly-packed structure. In some embodiments, the plasma treated capping layer 130g is an amorphous structure for anti-carbon dissociation/diffusion. In other aspects, the plasma process is controlled and tuned such that the oxygen is not introduced to the reflective ML 120, in order to maintain the reflectivity of the reflective ML 120.

In some embodiments, the capping layer 130g is plasma treated by nitrogen, and thus the grains of material shrink and at least a portion of the capping layer 130g is converted to an amorphous structure. In some instances, nitrogenizing of the capping layer may increase its hardness and etching resistance, as well as lower a carbon solubility of the capping layer 130g.

Figure 20A:
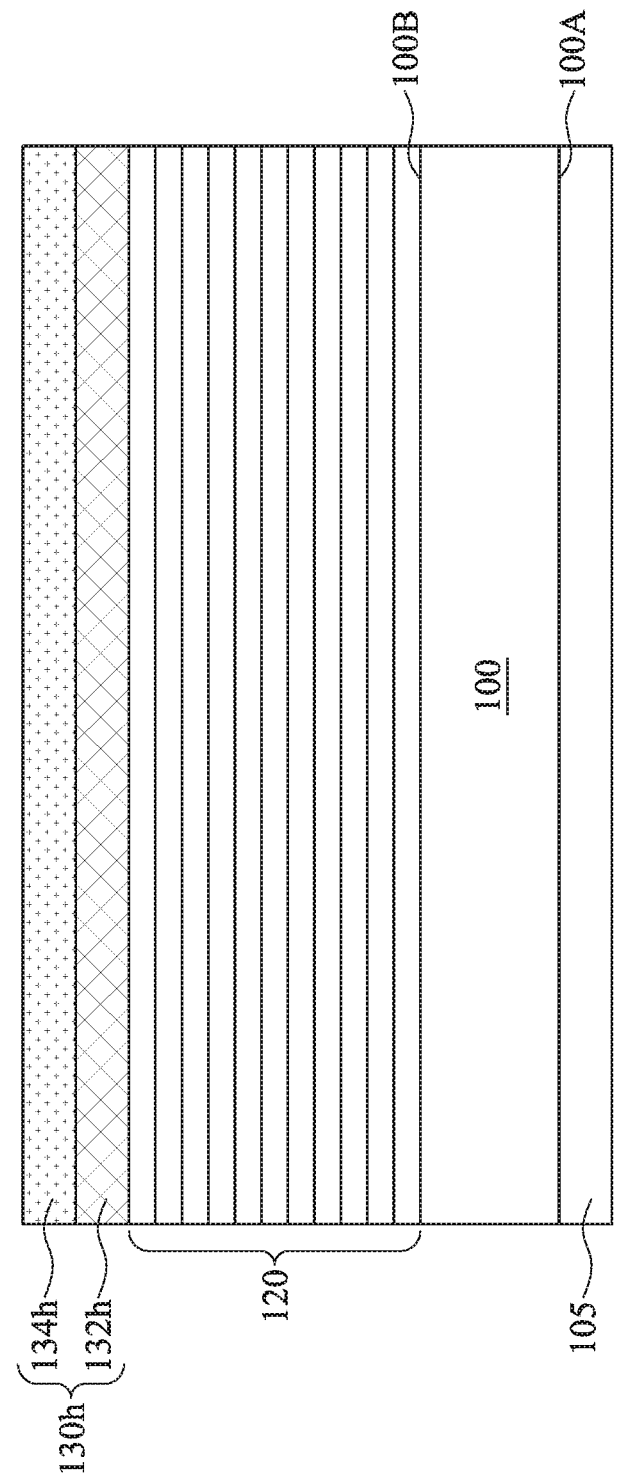
FIGS. 20A and 20B are cross-sectional views of a method for manufacturing a mask at various stages in accordance with some embodiments of the present disclosure.

Reference is made to FIG. 20A, which shows an example of a mask 200h including a capping layer 130h formed on the reflective ML 120. The capping layer 130h provides protection to the reflective ML 120, similar to the way in which an etch stop layer provides protection in a subsequent patterning or a repairing process of an absorber layer. Furthermore, the capping layer 130h is also designed to function as an anti-carbon barrier layer to protect the reflective ML 120 from carbon buildup formed thereon, in which such carbon buildup may absorb the light (radiation) projected onto the mask 200h. Therefore, the capping layer 130h will not degrade the EUV reflectivity of the reflective ML 120.

In some embodiments, the capping layer 130h includes an oxide layer 134h and a metal layer 132h between the reflective ML 120 and the oxide layer 134h. In some embodiments, a plasma process is performed on the capping layer 130g as shown in FIG. 19A using oxygen, thereby oxidizing the second metal layer 134g of the capping layer 130g as illustrated in FIG. 19A throughout the thickness thereof to form the oxide layer 134g as illustrated in FIG. 20A.

In some embodiments, the oxide of the low-carbon solubility material is spaced apart from the reflective ML 120 and in contact with the first metal layer 132h and the absorption layer 150 which will be formed thereon. In some embodiments, the first metal layer 132g includes material that is substantially the same as that of the first metal layer 132g shown in FIG. 19A. In some embodiments, the oxide layer 134g includes material that is substantially the same as that of the oxide layer 136g shown in FIG. 19A.

As shown in FIG. 20A, the plasma process is designed to introduce oxygen to the capping layer 130h such that it is densified to lower dissociation/diffusion of the carbon into metal, such that the reflective properties of the mask 200h may be improved. Particularly, the plasma treated capping layer 130h is oxidized to have a tightly-packed structure. In some embodiments, the plasma treated capping layer 130h is an amorphous structure for anti-carbon dissociation/diffusion. In other aspects, the plasma process is controlled and tuned such that the oxygen is not introduced to the reflective ML 120, in order to maintain the reflectivity of the reflective ML 120.

Figure 21A:
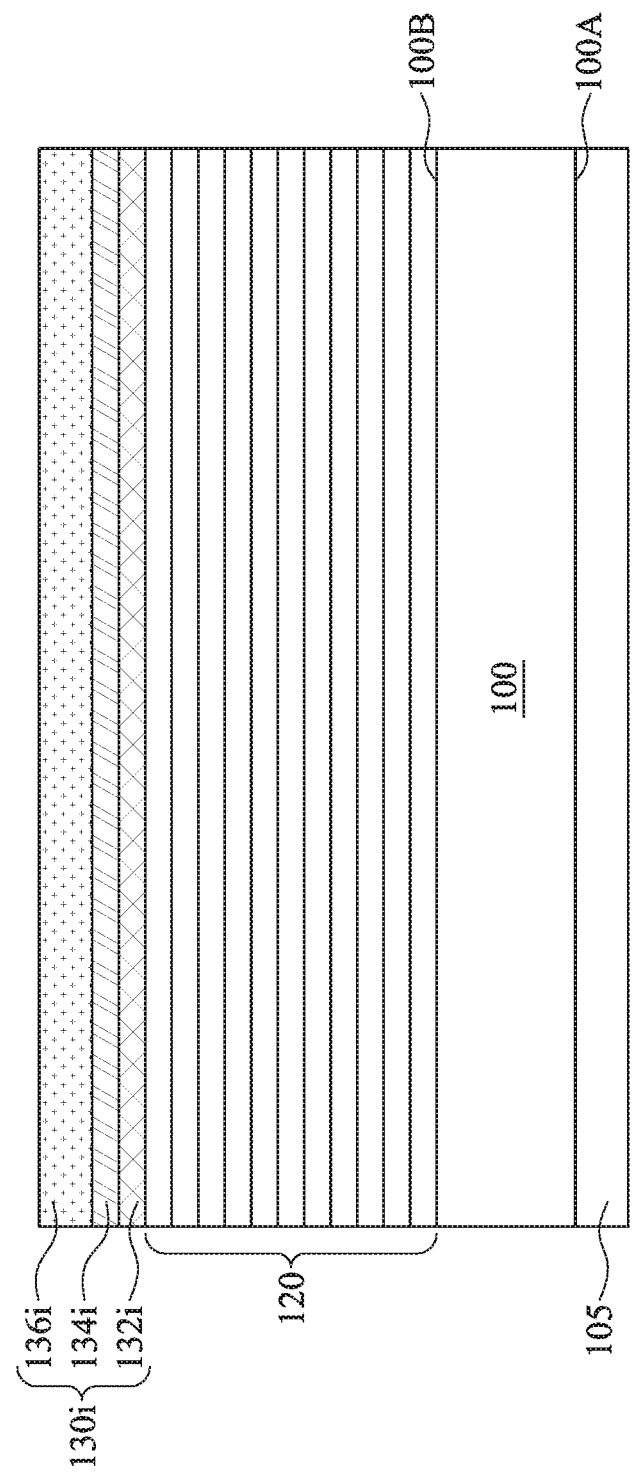
FIGS. 21A and 21B are cross-sectional views of a method for manufacturing a mask at various stages in accordance with some embodiments of the present disclosure.

Reference is made to FIG. 21A, which shows an example of a mask 200i including a capping layer 130i formed on the reflective ML 120. The capping layer 130i provides protection to the reflective ML 120, similar to the way in which an etch stop layer provides protection in a subsequent patterning or a repairing process of the absorber layer. Furthermore, the capping layer 130i is also designed to function as an anti-carbon barrier layer to protect the reflective ML 120 from carbon buildup formed thereon, in which such carbon buildup may absorb the light (radiation) projected onto the mask 200i. Therefore, the capping layer 130i will not degrade the EUV reflectivity of the reflective ML 120.

In some embodiments, the capping layer 130i includes a metal layer 132i, a first oxide layer 134i over the metal layer 132i, and a second oxide layer 136i over the first oxide layer 134i. In some embodiments, a plasma process is performed on the capping layer 130h as shown in FIG. 20A using oxygen, thereby oxidizing the first metal layer 132h of the capping layer 130h as illustrated in FIG. 20A to form the first oxide layer 134i above the metal layer 132i as illustrated in FIG. 21A.

In some embodiments, the first oxide layer 134i includes oxide of a low-oxygen reactive material and is low-carbon solubility material-free. In some embodiments, the oxide of the low-carbon solubility material has a carbon solubility lower than a carbon solubility of the low-carbon solubility material without oxidizing. In some embodiments, the metal layer 134i includes a ruthenium-containing material, such as $RuO_2$.

In some embodiments, an atomic percentage of the oxide of the low-oxygen reactive material in an upper portion the first oxide layer 134i is greater than that in a lower portion of the first oxide layer 134i. In some embodiments, an atomic percentage of the oxide of the low-oxygen reactive material in the first oxide layer 134i is greater than that in the metal layer 132i.

In some embodiments, the oxide of the low-carbon solubility material and the low-oxygen reactive material are spaced apart from the reflective ML 120. The oxide of the low-carbon solubility material is in contact with the absorption layer 150 which will be formed thereon. In some embodiments, the metal layer 132i includes material that is substantially the same as that of the first metal layer 132h shown in FIG. 20A. In some embodiments, the second oxide layer 134i includes material that is substantially the same as that of the oxide layer 134h shown in FIG. 20A.

As shown in FIG. 21A, the plasma process is designed to introduce oxygen to the capping layer such that it is densified to lower dissociation/diffusion of the carbon into metal, and such that the reflective properties of the mask 200i may be improved. Particularly, the plasma treated capping layer 130i is oxidized to have a tightly-packed structure. In some embodiments, the plasma treated capping layer 130i is an amorphous structure for anti-carbon dissociation/diffusion. In other aspects, the plasma process is controlled and tuned such that the oxygen is not introduced to the reflective ML 120, in order to maintain the reflectivity of the reflective ML 120.

Figure 22A:
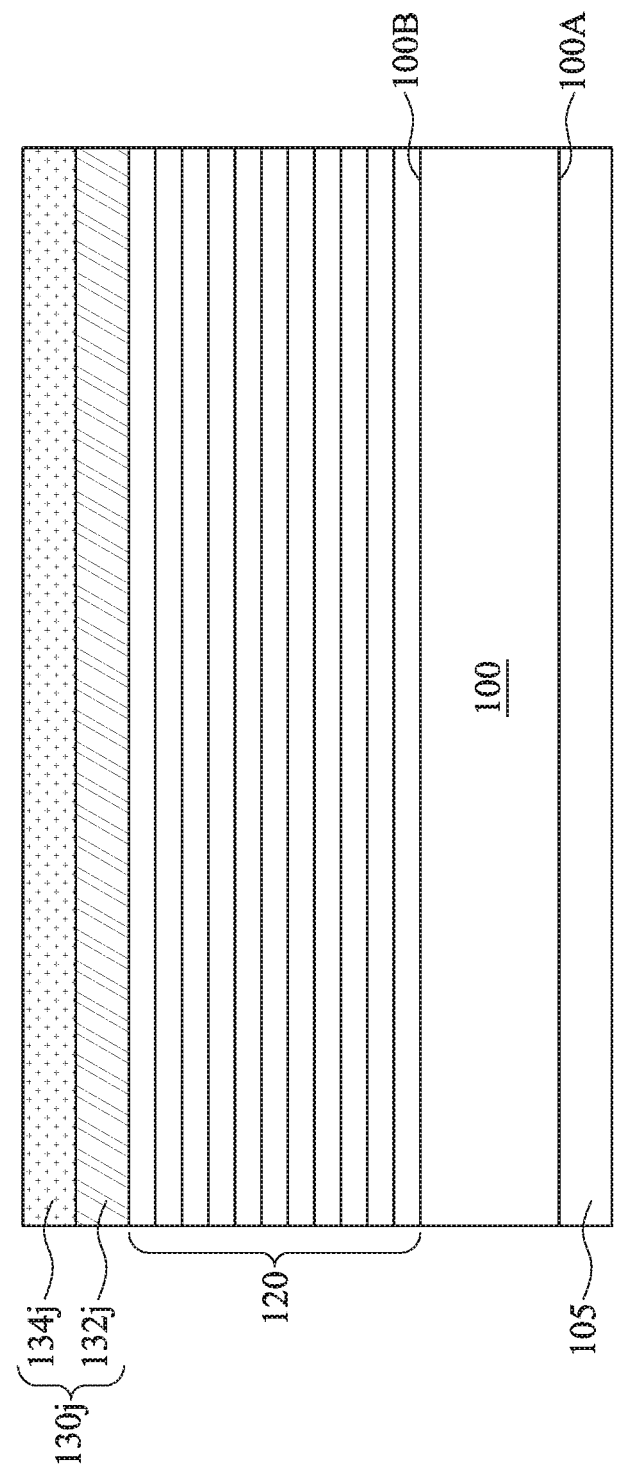
FIGS. 22A and 22B are cross-sectional views of a method for manufacturing a mask at various stages in accordance with some embodiments of the present disclosure.

Reference is made to FIG. 22A, which shows an example of a mask 200j including a capping layer 130j formed on the reflective ML 120. The capping layer 130j provides protection to the reflective ML 120, similar to the way in which an etch stop layer provides protection in a subsequent patterning or a repairing process of an absorber layer. Furthermore, the capping layer 130j is also designed to function as an anti-carbon barrier layer to protect the reflective ML 120 from carbon buildup formed thereon, in which such carbon buildup may absorb the light (radiation) projected onto the mask 200h. Therefore, the capping layer 130j will not degrade the EUV reflectivity of the reflective ML 120.

In some embodiments, the capping layer 130j includes a second oxide layer 134j and a first oxide layer 132j between the reflective ML 120 and the second oxide layer 134j. In some embodiments, a plasma process is performed on the capping layer 130i as shown in FIG. 21A using oxygen, thereby oxidizing the metal layer 132i of the capping layer 130i as illustrated in FIG. 21A throughout the thickness thereof to form the first oxide layer 132i as illustrated in FIG. 22A. In other aspects, the plasma process is controlled and tuned such that the oxygen is not introduced to the reflective ML 120, in order to maintain the reflectivity of the reflective ML 120.

In some embodiments, the oxide of the low-carbon solubility material is spaced apart from the reflective ML 120 and in contact with the first oxide layer 132j and the absorption layer 150 which will be formed thereon. In some embodiments, the oxide of the low-oxygen reactive material is spaced apart from the absorption layer 150 and in contact with the reflective ML 120 and the second oxide layer 134j which will be formed thereon. In some embodiments, the first oxide layer 132j includes material that is substantially the same as that of the first oxide layer 134i shown in FIG. 21A. In some embodiments, the second oxide layer 134j includes material that is substantially the same as that of the oxide layer 134i shown in FIG. 21A.

As shown in FIG. 22A, the plasma process is designed to introduce oxygen to the capping layer such that it is densified to lower dissociation/diffusion of the carbon Into metal, and such that the reflective properties of the mask 200j may be improved. Particularly, the plasma treated capping layer 130j is oxidized to have a tightly-packed structure. In some embodiments, the plasma treated capping layer 130j is an amorphous structure for anti-carbon dissociation/diffusion. In other aspects, the plasma process is controlled and tuned such that the oxygen is not introduced to the reflective ML 120, in order to maintain the reflectivity of the reflective ML 120.

Figure 4:
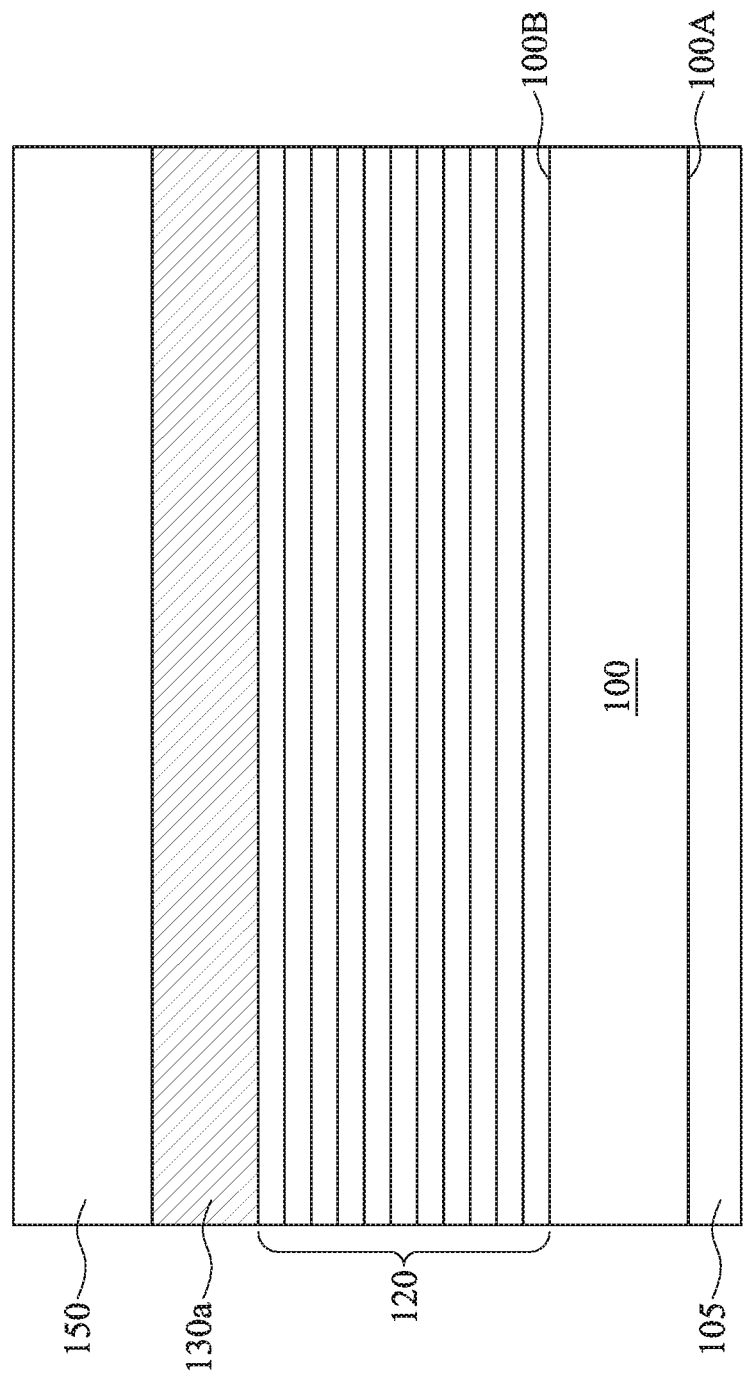

Reference is made to FIG. 4. An absorption layer 150 is disposed over the capping layer 130a. The absorption layer 150 includes one or more layers designed to absorb radiation in the radiation type/wavelength range projected onto the mask. In the depicted embodiments, the one or more layers of the absorption layer 150 are designed to absorb EUV radiation. The one or more layers include various materials, such as tantalum-containing materials (for example, Ta, TaN, TaNH, TaHF, TaHfN, TaBSi, TaB—SiN, TaB, TaBN, TaSi, TaSiN, TaGe, TaGeN, TaZr, TaZrN, other tantalum-containing materials, or combinations thereof), chromium-containing materials (for example, Cr, CrN, CrO, CrC, CrON, CrCN, CrOC, CrOCN, other chromium-containing materials, or combinations thereof), titanium-containing materials (for example, Ti, TiN, other titanium-containing materials, or combinations thereof), other suitable materials, or combinations thereof. A configuration of the one or more layers (such as a material composition of the one or more layers) is selected to provide process flexibility during fabrication of the mask 200a. For example, etching characteristics of the one or more layers of the absorption layer 150 provide process flexibility, which can reduce manufacturing time and costs.

According to the above descriptions, the absorption layer 150 may be formed by various methods, including a physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD), and/or other suitable methods.

Figure 5:
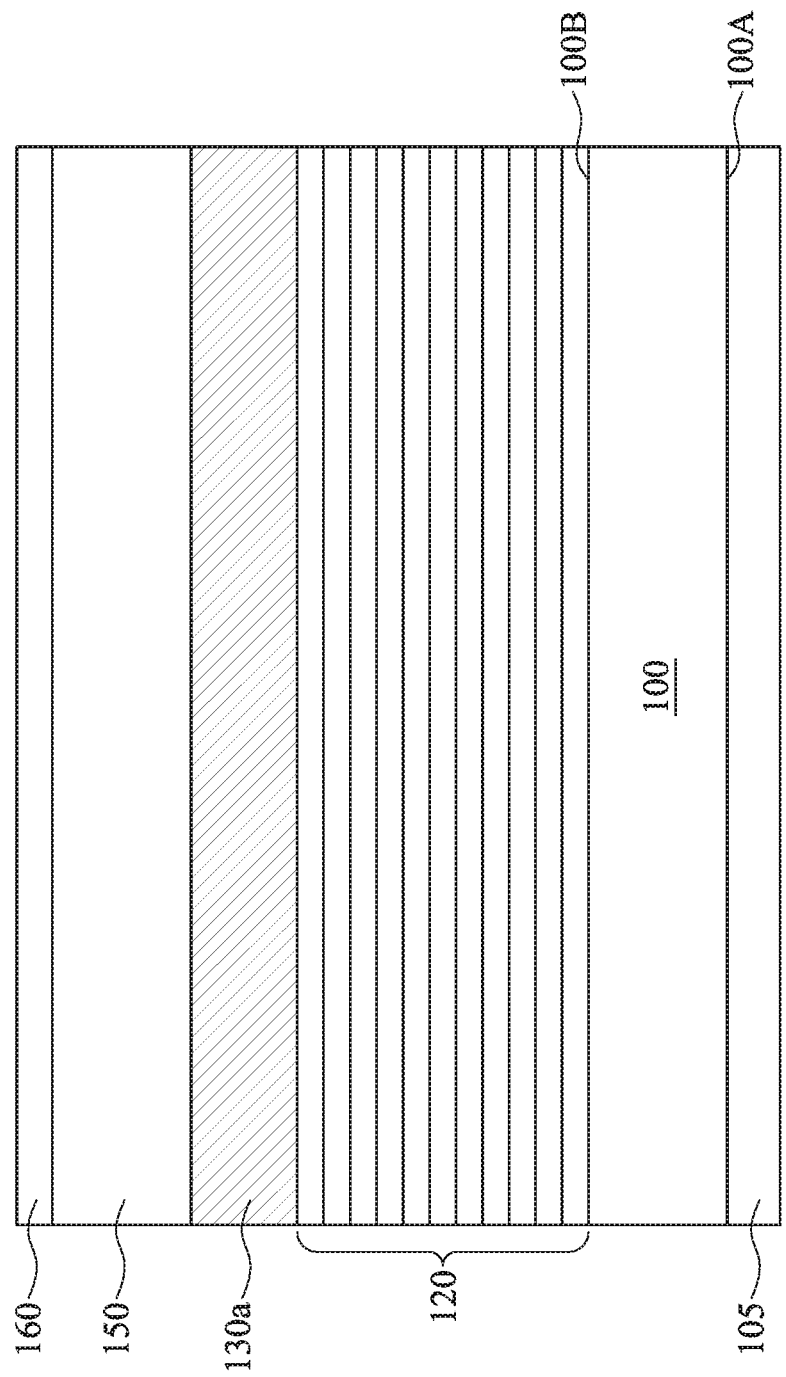

Reference is made to FIG. 5. An anti-reflective layer 160 is disposed over the absorption layer 150. The anti-reflective layer 160 is chosen to provide effective protection to the absorption layer 150, such as protection from oxidation, etching or damage during subsequent processes that include etching and cleaning. In some embodiments, the anti-reflective layer 160 is similar to the capping layer 130a in terms of composition. In various embodiments, the anti-reflective layer 160 includes Ru, an Ru alloy, oxidized or nitrogenized Ti, Zr or Si, or another suitable material. In other embodiments, some other material may be used to form the anti-reflective layer 160. In one embodiment, a SiC film is formed as the anti-reflective layer 160.

According to the above descriptions, the anti-reflective layer 160 may be formed by various methods, including a physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), atomic layer deposition (ALD), and/or other suitable methods. In some embodiments, the anti-reflective layer 160 includes an oxide material by oxidizing a surface layer of the absorption layer 150.

Figure 6:
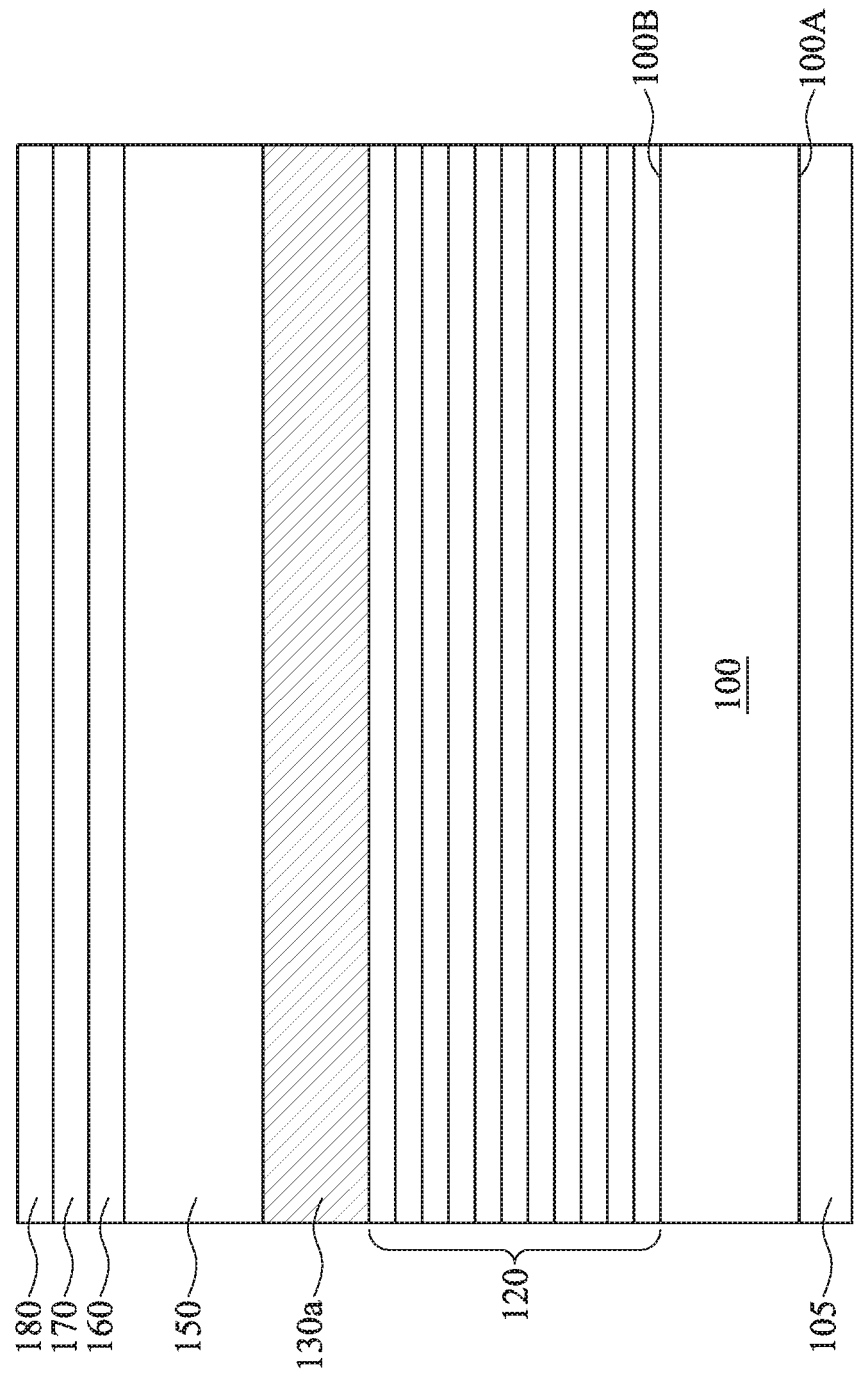

Reference is made to FIG. 6. A hard mask layer 170 and a photoresist layer 180 are sequentially formed on the anti-reflective layer 160. In some embodiments, the hard mask layer 170 includes a material(s) such as amorphous silicon (a-Si), silicon oxide, silicon nitride (SiN), titanium nitride, or another suitable material or composition. In some embodiments, the hard mask layer 170 includes an anti-reflection coating (ARC) layer such as a nitrogen-free anti-reflection coating (NFARC) layer including a material(s) such as silicon oxide, silicon oxygen carbide, or plasma enhanced chemical vapor deposited silicon oxide.

In some embodiments, the photoresist layer 180 is a multi-layer resist formed over the hard mask layer 170. In some embodiments, the photoresist layer 180 is coated on the hard mask layer 170 using a spin-on coating method or any other suitable methods. In some embodiments, the photoresist layer 180 may be a deep UV photoresist that typically includes polymers having hydroxystyrene groups. In some embodiments, the photoresist layer 180 may be formed from a positive tone photoresist. In some embodiments, the photoresist layer. 180 may be formed from a negative tone photoresist. In some embodiments, the photoresist layer 180 includes an i-line photoresist that normally includes a Novolac resin that is prepared by reacting a cresol, xylenol, or other substituted phenols with formaldehyde. In some embodiments, the photoresist layer 180 is a polar component such as a polymer with hydroxyl or phenol groups that can attract or bond with amines or nitrogen containing compounds that might diffuse out of the underlying dielectric materials.

Figure 7:
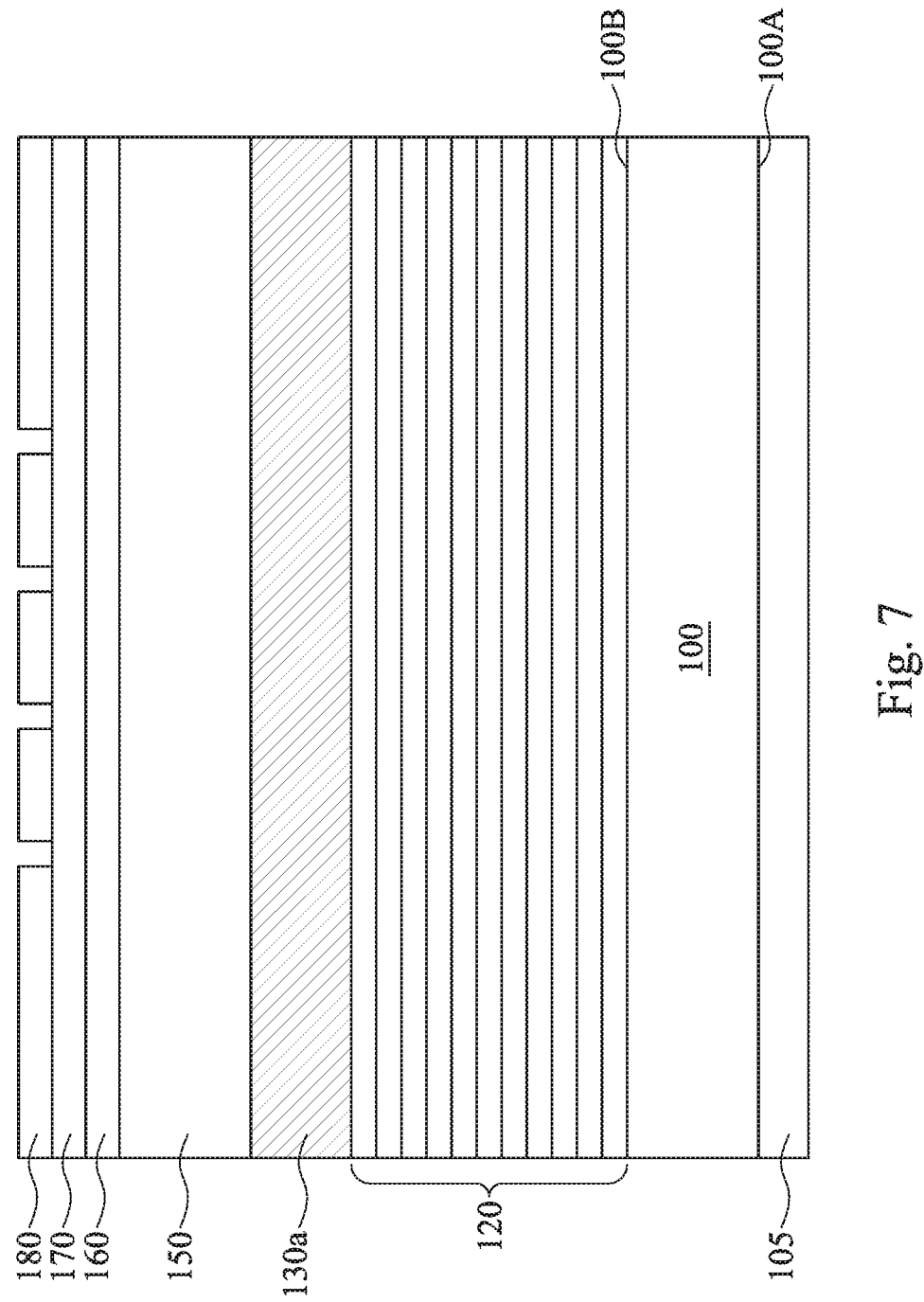

Reference is made to FIG. 7. The photoresist layer 180 is exposed by applying a radiation beam (such as an electron-beam). Next, the photoresist layer 180 is developed to form a patterned photoresist layer 180. Specifically, the photoresist layer 180 is patterned based on a received design layout. In some embodiments, the first photoresist layer 180 is patterned using an electron beam (e-beam) writer. Other patterning techniques that may be used in conjunction with or as a replacement for e-beam writing include ion-beam writing and masked and maskless photolithography. Additionally, any other suitable patterning technique may be used. Patterning the photoresist layer may include soft baking, mask aligning, exposure, post-exposure baking, developing the photoresist, rinsing, drying (e.g., hard baking), other suitable processes, and/or combinations thereof.

Figure 8:
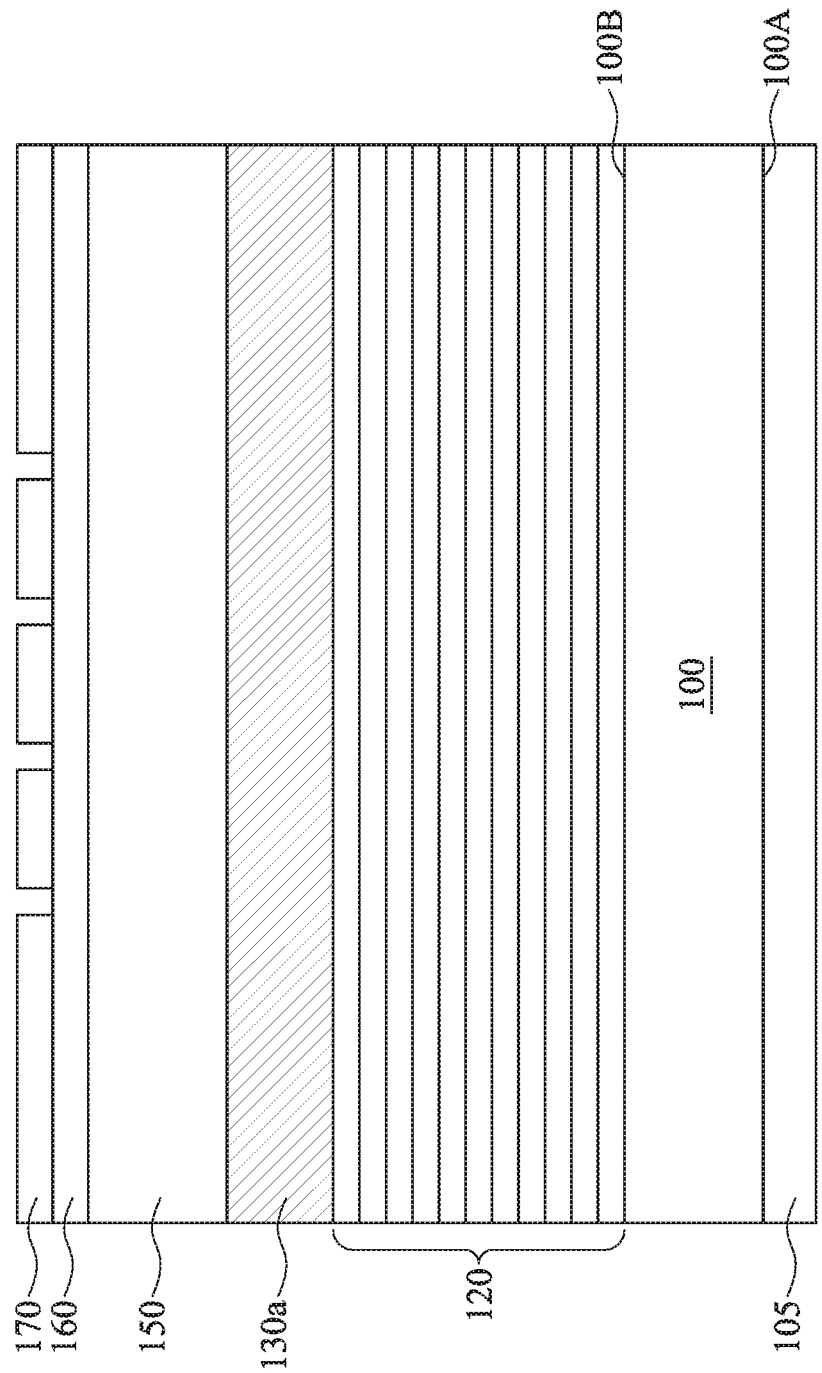

Reference is made to FIG. 8. The hard mask layer 170 is patterned using the patterned photoresist layer 180 (see FIG. 7) as an etch mask, thereby transferring the pattern of the photoresist layer 180 to the hard mask layer 170. For example, the hard mask layer 170 may be etched using a dry (plasma) etching process, a wet etching process, and/or other etching methods. In some embodiments, the photoresist layer 180 may be partially or completely consumed during the etching of the hard mask layer 170. In some embodiments, any remaining portion of the patterned photoresist layer 180 may be stripped off, leaving the hard mask layer 170 over the anti-reflective layer 160.

Figure 9:
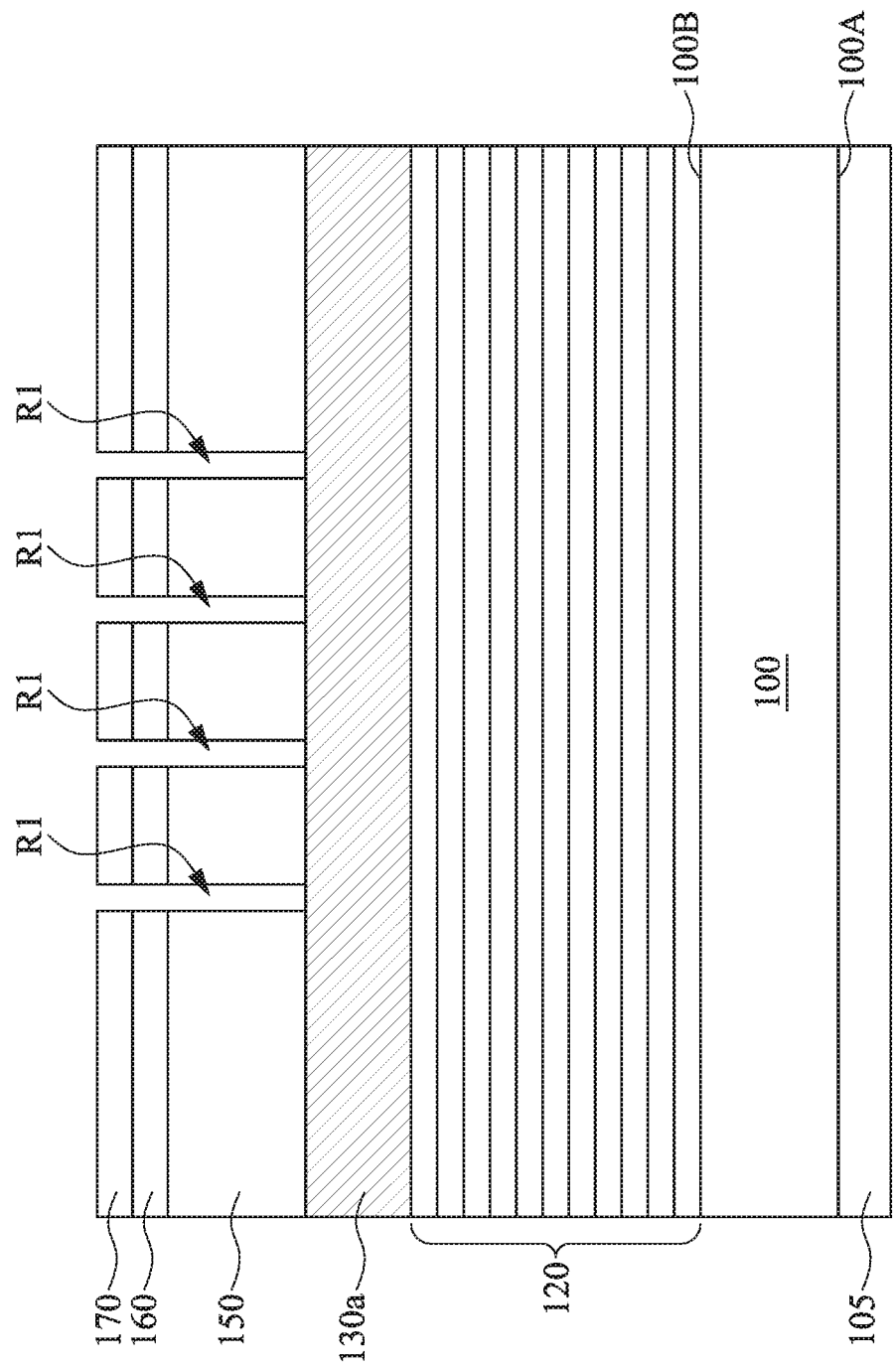

Reference is made to FIG. 9. The absorption layer 150 and the anti-reflective layer 160 are patterned. Specifically, the absorption layer 150 and the anti-reflective layer 160 are patterned using the patterned hard mask layer 170 as a mask to form a plurality of recesses R1 therein. This process may be referred to as a pattern transfer, in that the pattern of the hard mask layer 170 is transferred to the absorption layer 150 and the anti-reflective layer 160. In some embodiments, patterning the absorption layer 150 and the anti-reflective layer 160 includes one or more etching processes to selectively remove portions of the absorption layer 150 until the capping layer 130*a* is exposed. The etching processes may include dry etching, wet etching, and/or other etching methods.

Figure 10A:
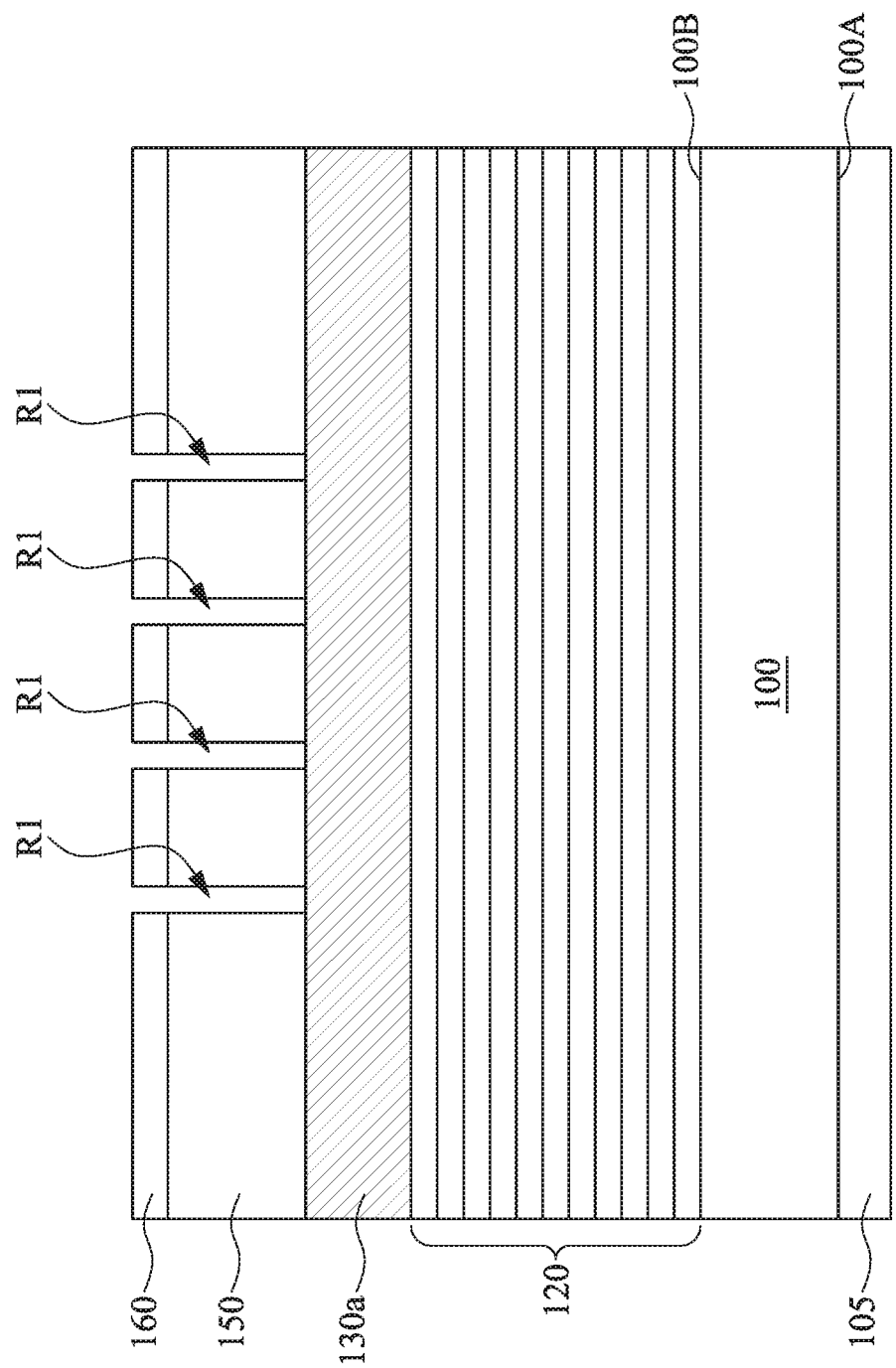
Figure 10B:
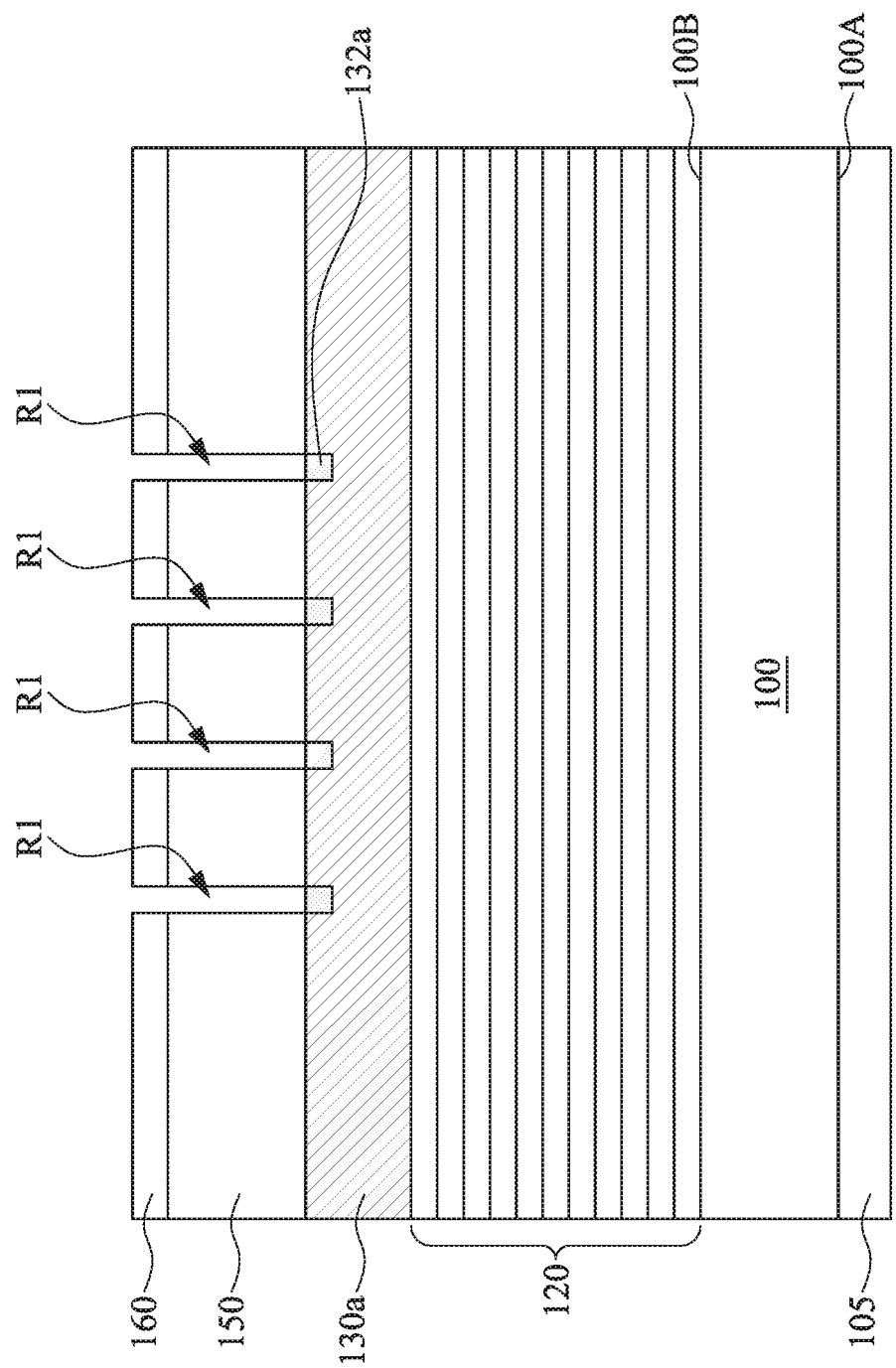

Reference is made to FIGS. 10A and 10B. As shown in FIG. 10A, the hard mask layer 170 (see FIG. 9) is stripped from the absorption layer 150. In some embodiments, a plasma process (or plasma treatment) is performed on the capping layer 130*a* using at least one of oxygen and nitrogen, thereby oxidizing or nitrogenizing the capping layer 130*a* as illustrated in FIG. 10B. Various relevant factors are identified and studied regarding the capping layer 130*a*, especially for its various functions in the mask. The plasma process is designed by taking various considerations related to those factors, which have been described previously and are further described below.

As shown in FIG. 10B, the plasma process is designed to introduce at least one of oxygen and nitrogen to the capping layer 130*a* such that it is densified to enhance an anti-carbon effect of the capping layer 130*a*. Particularly, the plasma treated capping layer 130*a* is oxidized or nitrogenized to have a tightly-packed structure so that the average inter-atomic distance is less than the kinetic diameter of oxygen ($O_2$), which is 3 angstrom. In some embodiments, the plasma treated capping layer 130*a* is an amorphous structure for anti-carbon dissociation/diffusion. To avoid a polycrystalline structure from being formed in the capping layer 130*a*, the plasma process is properly designed for that consideration. In other aspects, the plasma process is controlled and tuned such that the oxygen (and/or nitrogen) is not introduced to the reflective ML 120, in order to maintain the reflectivity of the reflective ML 120. In some embodiments, the plasma process is applied to the capping layer 130*a* with a plasma source power ranging between 300 w and 1000 w; plasma bias power ranging between 0 and 50 w; gas flow of the gas ranging between 100 sccm and 500 sccm; chamber pressure ranging between 1 mTorr and 10 mTorr; and plasma treatment duration ranging between 30 sec and 300 sec.

After the capping layer 130*a* is plasma treated by oxygen and nitrogen, the grains of material shrink and the capping layer 130*a* is converted to an amorphous structure. This is used to provide an anti-carbon barrier, where the amorphous phase means fewer diffusion paths than with a polycrystalline structure. Oxidizing and/or nitrogenizing of the capping layer 130*a* increases its hardness and etching resistance as well, as well as lower a carbon solubility of the capping layer 130*a*. The plasma treated capping layer 130*a* also gains a self-cleaning function. For example, the plasma treated capping layer 130*a* includes hydroxyl radical (.OH), and/or superoxide anion ($.O_2$) that can be reacted with contaminants (such as carbon) to form a chemical (such $CO_2$) to be volatilized from the contaminated surface.

Referring back to FIG. 10B, the plasma treatment is performed on the capping layer 130*a* through the openings of the absorption layer 150 using the absorption layer 150 as a plasma-treating mask that effectively blocks the covered portions of the capping layer 130*a* from plasma treatment. The capping layer 130*a* includes a first portion uncovered by the absorption layer 150 and a second portion covered by the absorption layer 150. The first portion is within the opening(s) of the absorber layer. After the plasma treatment, the first portion is changed (oxidized or nitrogenized), while the second portion remains free of plasma doping and therefore is different from the first portion in composition.

Figure 11:
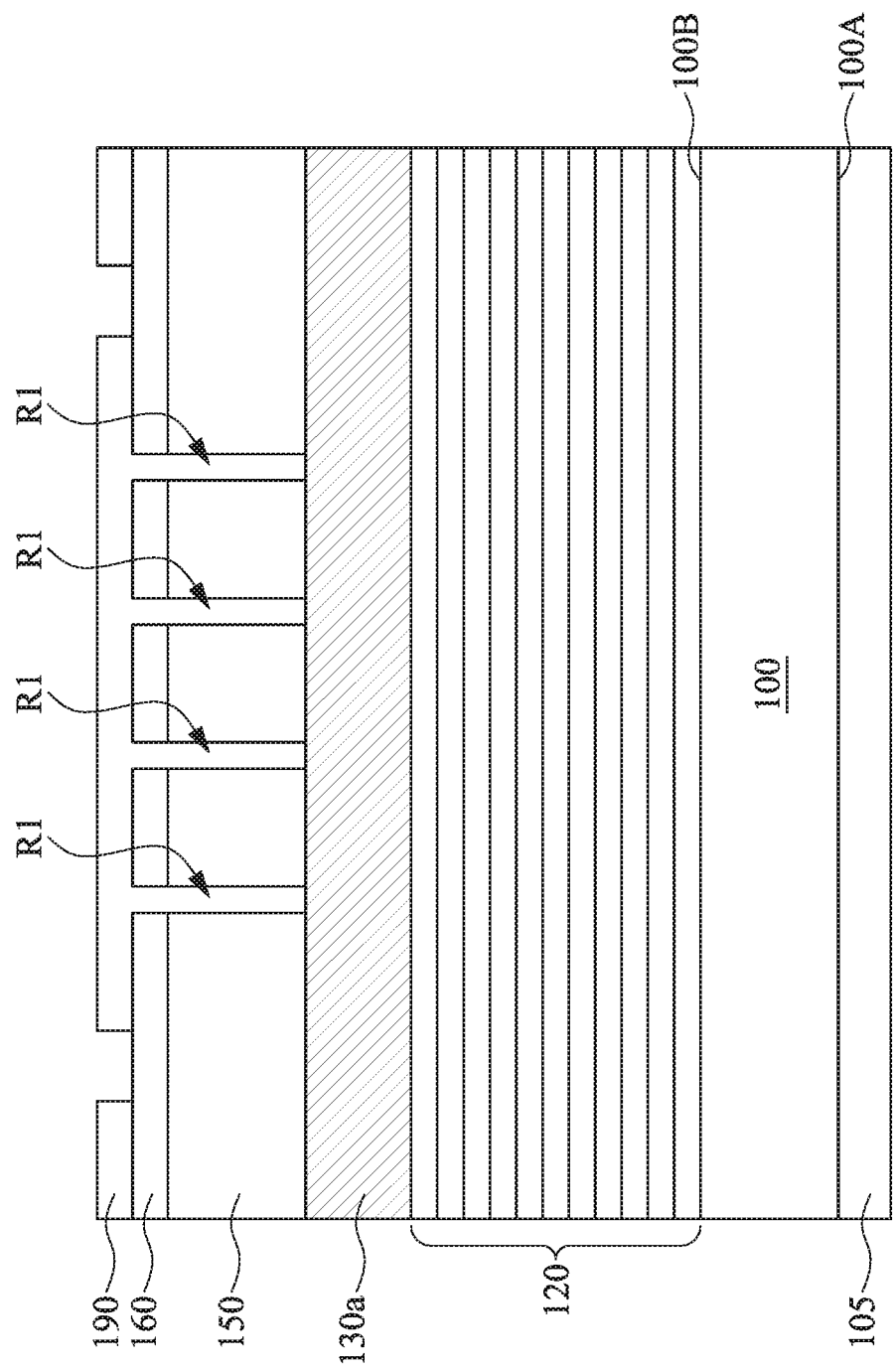

Reference is made to FIG. 11. A photoresist layer 190 is formed on the anti-reflective layer 160. The photoresist layer 190 may be a positive-type resist or a negative-type resist. The photoresist layer 190 may be an e-beam resist. Next, the photoresist layer 190 is patterned using a suitable method including electron beam (e-beam) writing, ion-beam writing, photolithography, and/or maskless photolithography. Patterning the photoresist layer 190 may further include soft baking, mask aligning, exposure, post-exposure baking, developing the photoresist, rinsing, drying (e.g., hard baking), other suitable processes, and/or combinations thereof.

Figure 12:
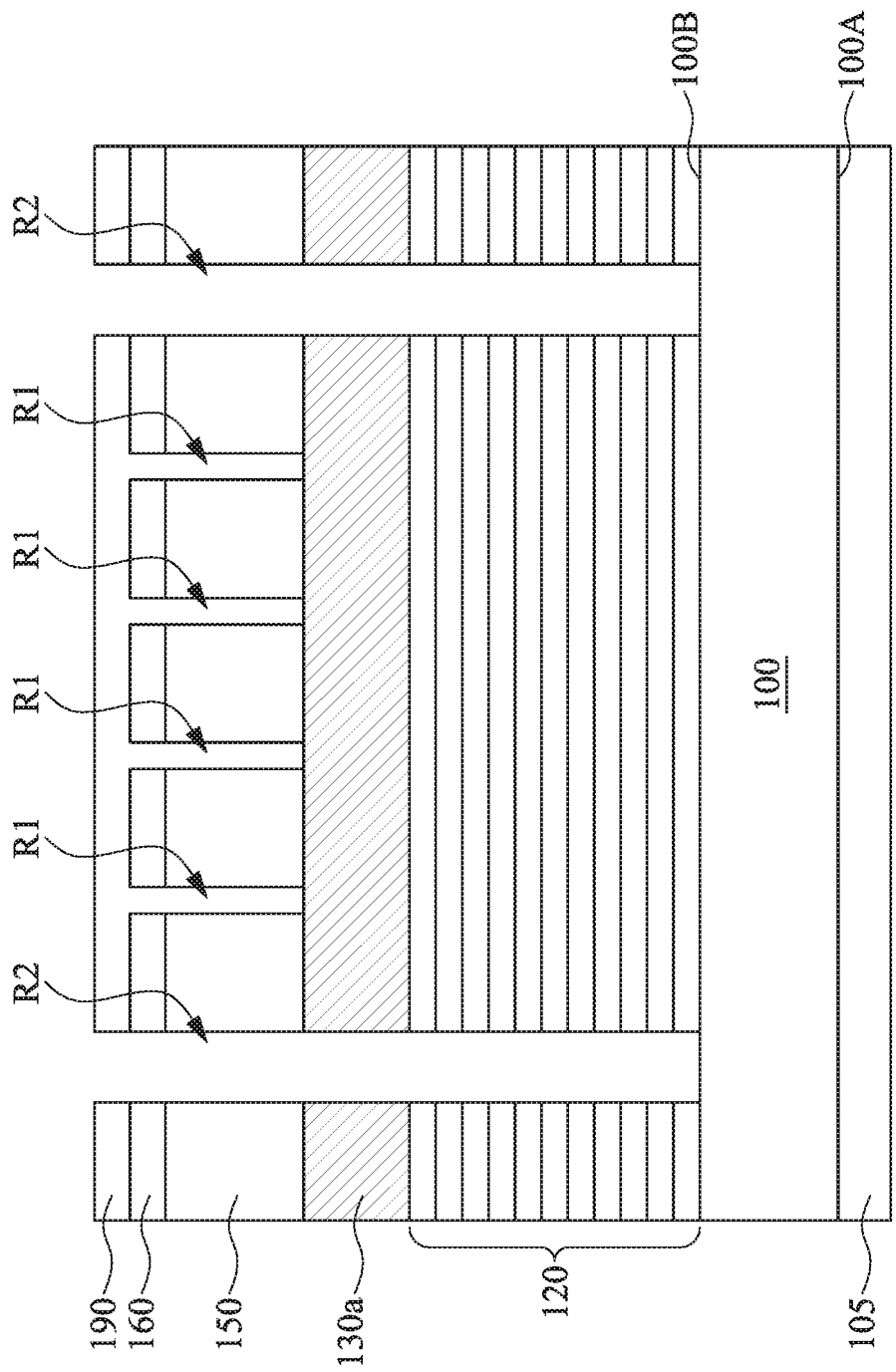

Reference is made to FIG. 12. The anti-reflective layer 160, the absorption layer 150, the capping layer 130*a*, and the reflective ML 120 are patterned to form a plurality of recesses R2 therein. In some embodiments, the anti-reflective layer 160, the absorption layer 150, the capping layer 130*a*, and the reflective ML 120 are patterned using the photoresist layer 190 until the substrate 100 is exposed. This process may be referred to as a pattern transfer. The anti-reflective layer 160, the absorption layer 150, the capping layer 130*a*, and the reflective ML 120 may be patterned via a multistep etching process or a single step etching process.

In an exemplary single step etching process, a dry etching process is performed using fluorine-containing gas chemistry such as $CF_4$, $SF_6$, $NF_3$, and/or any other suitable gas. In some other embodiments, the patterning process may be controlled such that the recesses R2 may extend into the reflective ML 120 but not expose the substrate 100.

Figure 13:
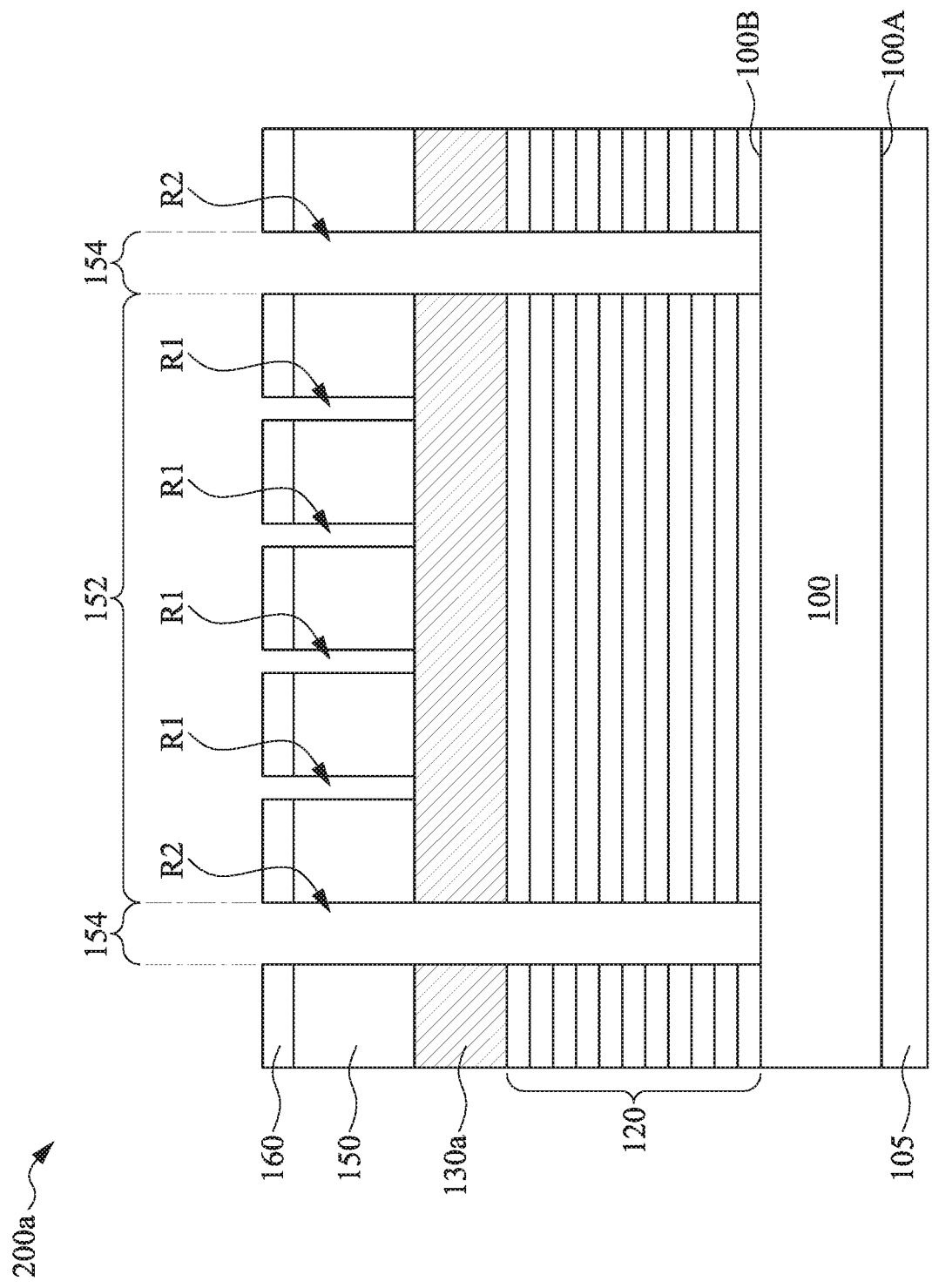

Reference is made to FIG. 13. The photoresist layer 190 (see FIG. 12) is stripped from the anti-reflective layer 160. Accordingly, a mask 200a is formed. In some embodiments, the mask 200a includes a mask image region 152 and a black border region 154 surrounding the mask image region 152. During operation, the mask 200a is used to transfer the pattern of the mask image region 152 to a wafer. For example, during an exposure process, light (radiation) is projected onto the mask 200a, and a portion of the light is transmitted to the wafer, thereby transferring the pattern of the mask image region 152 to the wafer.

In some embodiments, the mask image region 152 of the mask 200a is defined by the recesses R1 formed in the absorption layer 150, in which the recesses R1 expose the top surface of the capping layer 130a. On the other hand, the black border region 154 of the mask 200a is defined by the recesses R2 formed in the anti-reflective layer 160, the absorption layer 150, the capping layer 130a, and the reflective ML 120. In some embodiments, as shown in FIG. 13, the recesses R2 extend into the reflective ML 120 and expose the top surface of the substrate 100. That is, the recesses R2 are deeper than the recesses R1.

During the exposure process of the mask, exposure light may leak to adjacent regions. Such light leakage can be attributed to a light diffraction phenomenon, positional accuracy of the mask with respect to the wafer, positional accuracy of the mask with respect to the exposure tool, other phenomena, or combinations thereof. For example, light leakage may result from positional accuracy of the mask with respect to the exposure tool, such as the stepper or the scanner. For example, for each exposure process, the exposure tool defines a portion of the mask 200a for exposing light thereon. An exposure slit of the exposure tool (defined by blades of the exposure tool, in an example) may define the portion of the mask 200a that will be exposed to the light. Ideally, the light exposes the mask image region 152 of the mask 200a. Typically, however, the exposure slit will expose an area of the mask 200a outside the mask image region 152. In some embodiments of the present disclosure, the mask black border region 154 of the mask 200a represents an area of the mask 200a that is outside the mask image region 152 that will be exposed to the light (in other words, an area of the mask 200a outside the mask image region that is not covered by the exposure tool). Here, the mask black border region 154 of the mask 200a is adjacent to the mask image region 152. Because the mask black border region 154 of the mask 200a is exposed to light during the exposure process, the mask black border region 154 undesirably transmits a portion of light to the wafer, resulting in some regions receiving double exposure and corners of the fields receiving quadruple exposure. To remedy such light leakage, reflectivity of the mask black border region 154 of the mask 200a is minimized to reduce such unwanted exposure. In an example, a reflectivity at the mask black border region 154 of the mask 200a is less than or equal to about 0.3%. For example, the profile of the mask black border region 154 is configured to allow radiation to be transmitted through the recesses R2 to a deeper structure of the mask 200a such as the substrate 100. In some embodiments, the recesses R2 expose the substrate 100 that is made of LTEM material. Because a property of LTEM material is such that the LTEM material is able to absorb incident radiation, the reflectivity of the black border region 154 may be reduced accordingly.

Figure 14B:
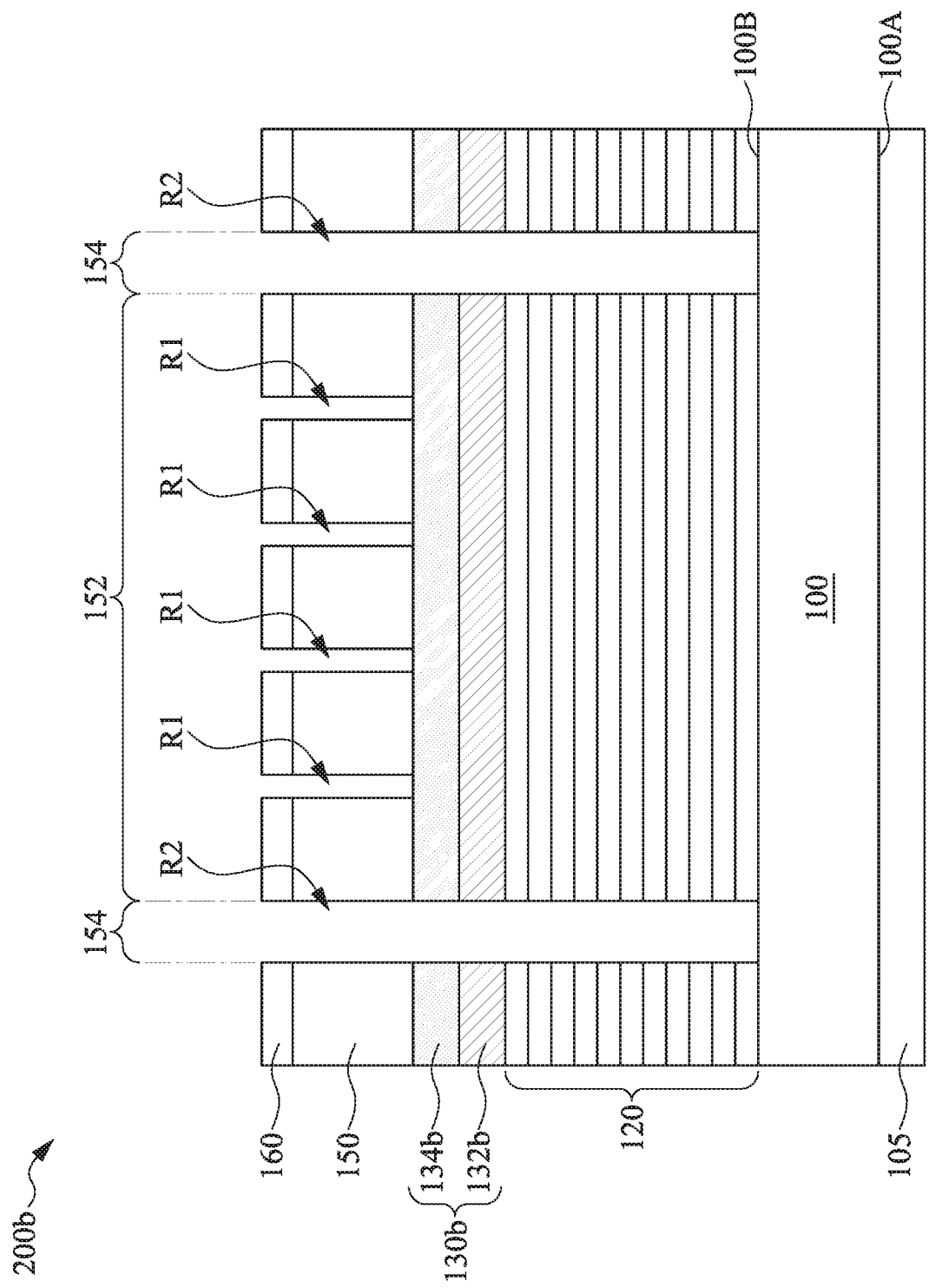

FIG. 14B is a cross-sectional view of a method for manufacturing a mask 200b at a stage in accordance with some embodiments of the present disclosure. It should be pointed out that operations for forming a mask 200b before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130b of the present embodiment replaces the capping layer 130a shown in FIGS. 1-13.

As shown in FIG. 14B, the oxide of the low-oxygen reactive material and the low-carbon solubility material is spaced apart from the reflective ML 120 and in contact with the absorption layer 150. The low-oxygen reactive material and the low-carbon solubility material without oxidizing in the metal layer 132b are spaced apart from the absorption layer 150 and in contact with the reflective ML 120. In FIG. 14B, the oxide layer 134b of the capping layer 130b includes a first portion uncovered by the absorption layer 150 and a second portion covered by the absorption layer 150. In some embodiments, an atomic percentage of the oxide of the low-carbon solubility material in the first portion of the oxide layer 134b is substantially the same as that in the second portion of the oxide layer 134b. In some embodiments, an atomic percentage of the oxide of the low-carbon solubility material in the first portion of the oxide layer 134b is greater than that in the second portion of the oxide layer 134b.

Figure 15B:
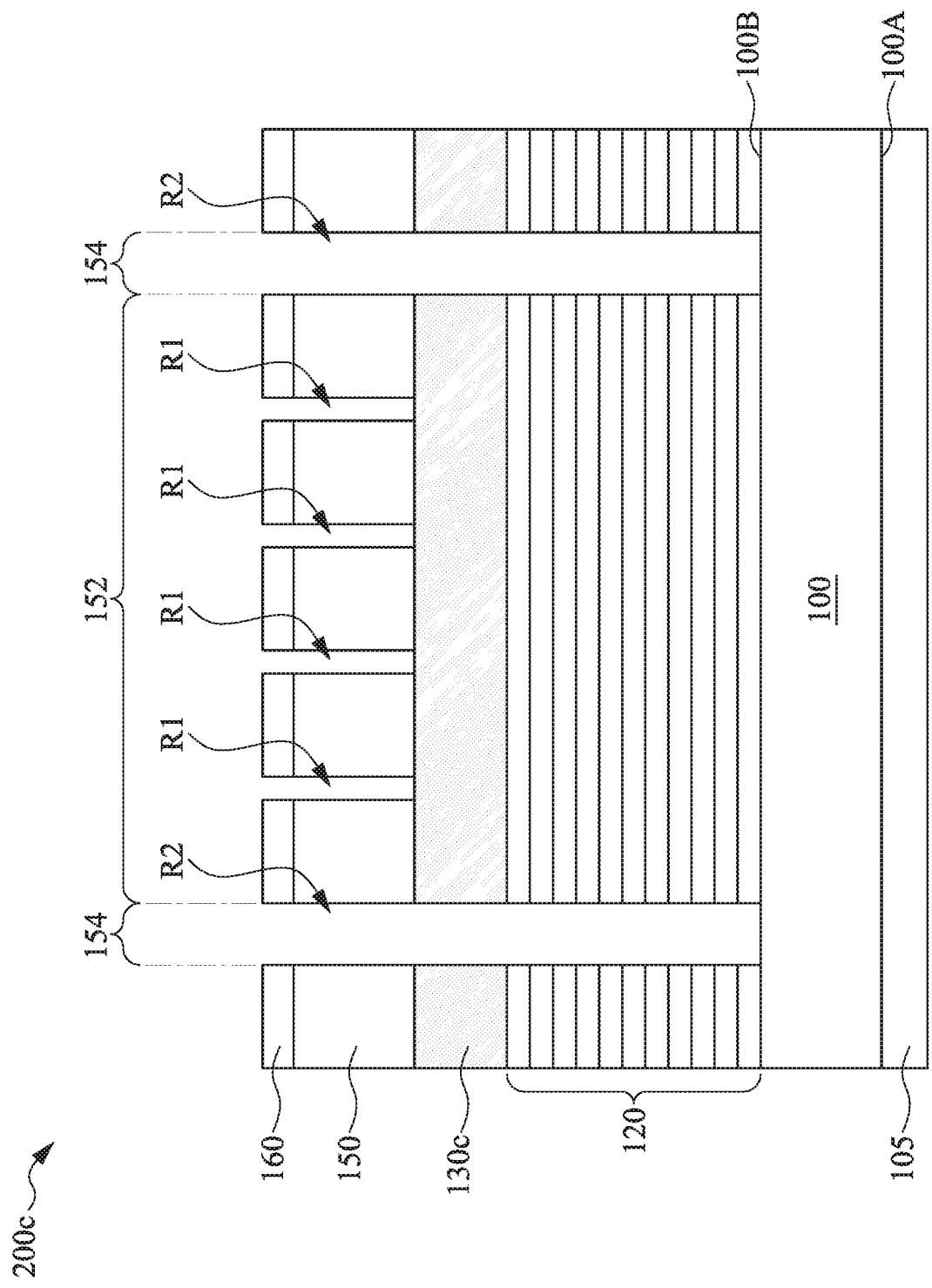

FIG. 15B is a cross-sectional view of a method for manufacturing a mask 200c at a stage in accordance with some embodiments of the present disclosure. It should be pointed out that operations for forming a mask 200c before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130c of the embodiment replaces the capping layer 130a shown in FIGS. 1-13.

As shown in FIG. 15B, the oxide of the low-oxygen reactive material is in contact with the absorption layer 150 and the reflective ML 120, and the oxide of the low-carbon solubility material is in contact with the absorption layer 150 and the reflective ML 120. In FIG. 15B, the capping layer 130c includes a first portion uncovered by the absorption layer 150 and a second portion covered by the absorption layer 150. In some embodiments, an atomic percentage of the oxide of the low-carbon solubility material in the first portion of the capping layer 130c is substantially the same as that in the second portion of the capping layer 130c. In some embodiments, an atomic percentage of the oxide of the low-carbon solubility material in the first portion of the oxide layer 134b is greater than that in the second portion of the capping layer 130c.

Figure 16B:
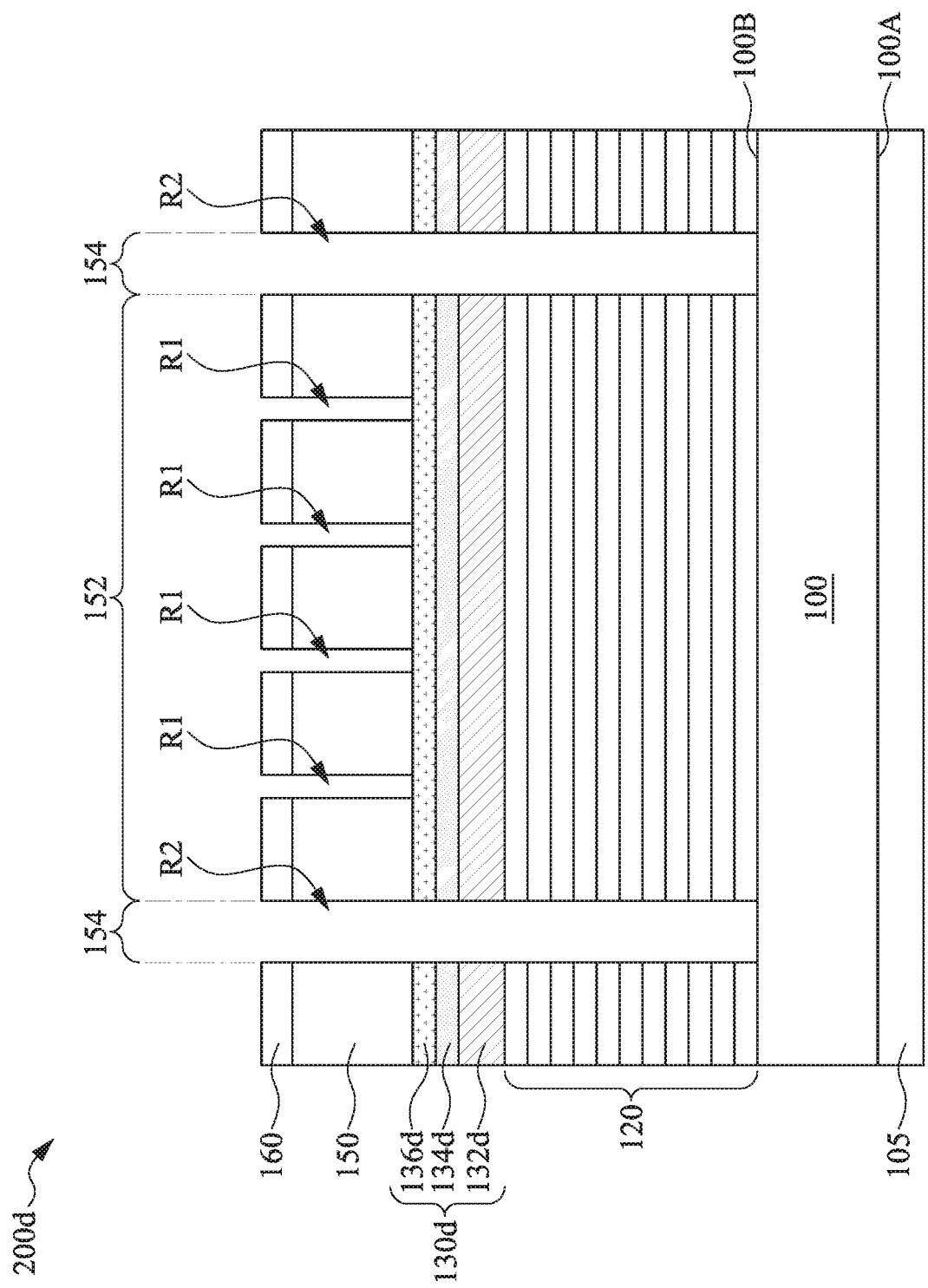

FIG. 16B is a cross-sectional view of a method for manufacturing a mask 200d at a stage in accordance with some embodiments of the present disclosure. It should be pointed out that operations for forming a mask 200d before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130d of the embodiment replaces the capping layer 130a shown in FIGS. 1-13.

As shown in FIG. 16B, the oxide of the low-carbon solubility material is in the first oxide layer 134d and the second oxide layer 136d, spaced apart from the reflective ML 120, and in contact with the absorption layer 150. The oxide of the low-oxygen reactive material is in the first oxide layer 134d, spaced apart from the reflective ML 120 and the absorption layer 150, and in contact with the metal layer 132d and the second oxide layer 136d.

Figure 17B:
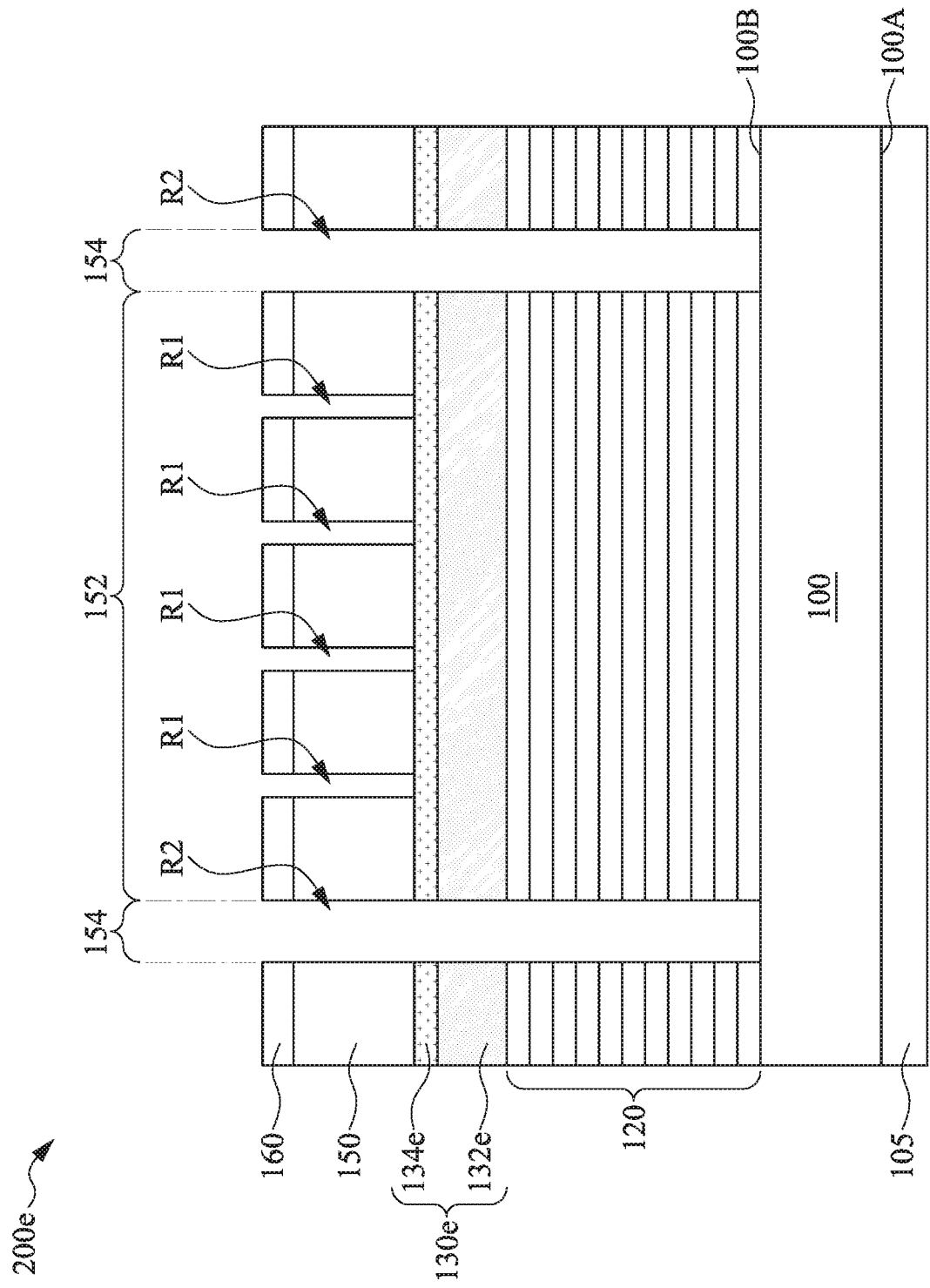

FIG. 17B is a cross-sectional view of a method for manufacturing a mask 200e at a stage in accordance with some embodiments of the present disclosure. It should be pointed out that operations for forming a mask 200e before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130e of the embodiment replaces the capping layer 130a shown in FIGS. 1-13.

As shown in FIG. 17B, the oxide of the low-carbon solubility material is in the first oxide layer 132e and the second oxide layer 134e and in contact with the absorption layer 150 and the reflective ML 120. The oxide of the low-oxygen reactive material is in the first oxide layer 132e, spaced apart from the absorption layer 150, and in contact with the reflective ML 120 and the second oxide layer 134e.

Figure 18B:
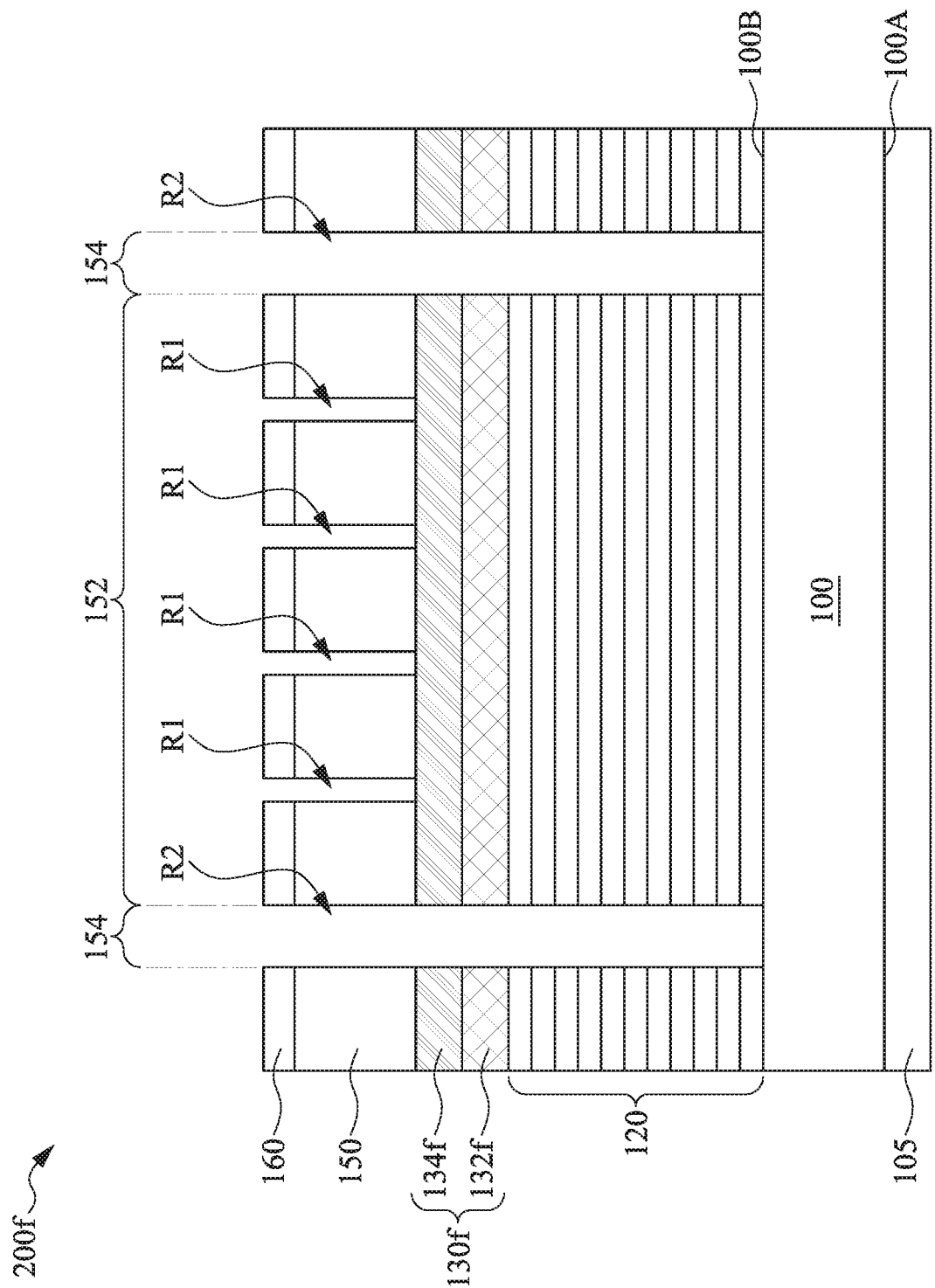

FIG. 18B is a cross-sectional view of a method for manufacturing a mask 200f at a stage in accordance with some embodiments of the present disclosure. It should be pointed out that operations for forming a mask 200f before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130f of the embodiment replaces the capping layer 130a shown in FIGS. 1-13.

As shown in FIG. 18B, the low-carbon solubility material is in the second metal layer 134f, in contact with the absorption layer 150, and spaced apart from the reflective ML 120 by the first metal layer 132f. The low-oxygen reactive material is in the first metal layer 132f, in contact with the reflective ML 120, and spaced apart from the absorption layer 150 by the second metal layer 134f.

Figure 19B:
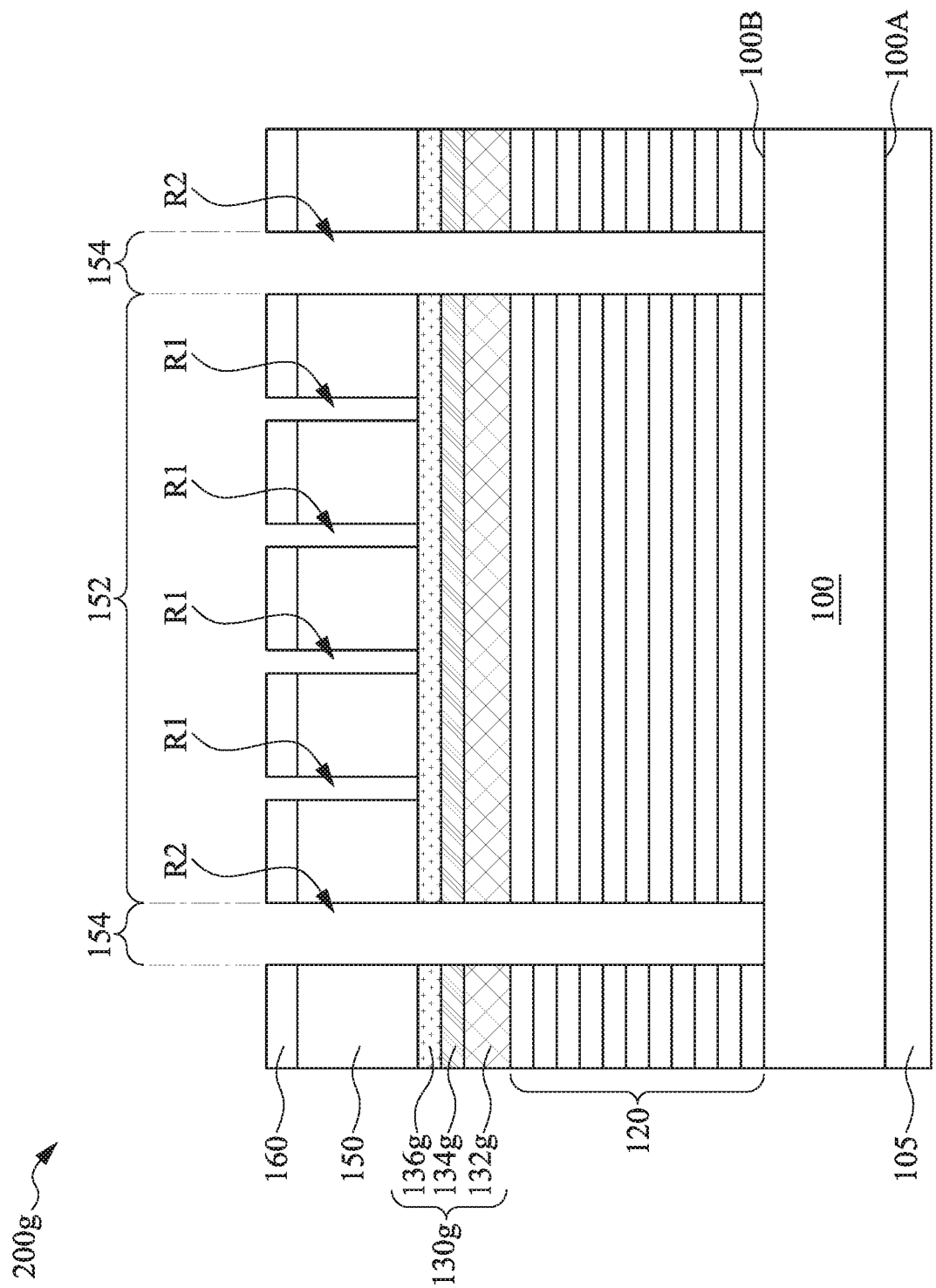

FIG. 19B is a cross-sectional view of a method for manufacturing a mask 200g at a stage in accordance with some embodiments of the present disclosure. It should be pointed out that operations for forming a mask 200g before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130g of the embodiment replaces the capping layer 130a shown in FIGS. 1-13.

As shown in FIG. 19B, the oxide of the low-carbon solubility material is in the oxide layer 136g, in contact with the absorption layer 150 and the second metal layer 134g, and spaced apart from the reflective ML 120 by the first and second metal layers 132g and 134g. The low-carbon solubility material is in the first metal layer 132e and spaced apart from the reflective ML 120 by the first metal layer 132g. In FIG. 19B, the oxide layer 136g of the capping layer 130g includes a first portion uncovered by the absorption layer 150 and a second portion covered by the absorption layer 150. In some embodiments, an atomic percentage of the oxide of the low-carbon solubility material in the first portion of the oxide layer 136g is substantially the same as that in the second portion of the oxide layer 136g. In some embodiments, an atomic percentage of the oxide of the low-carbon solubility material in the first portion of the oxide layer 136g is greater than that in the second portion of the oxide layer 136g.

Figure 20B:
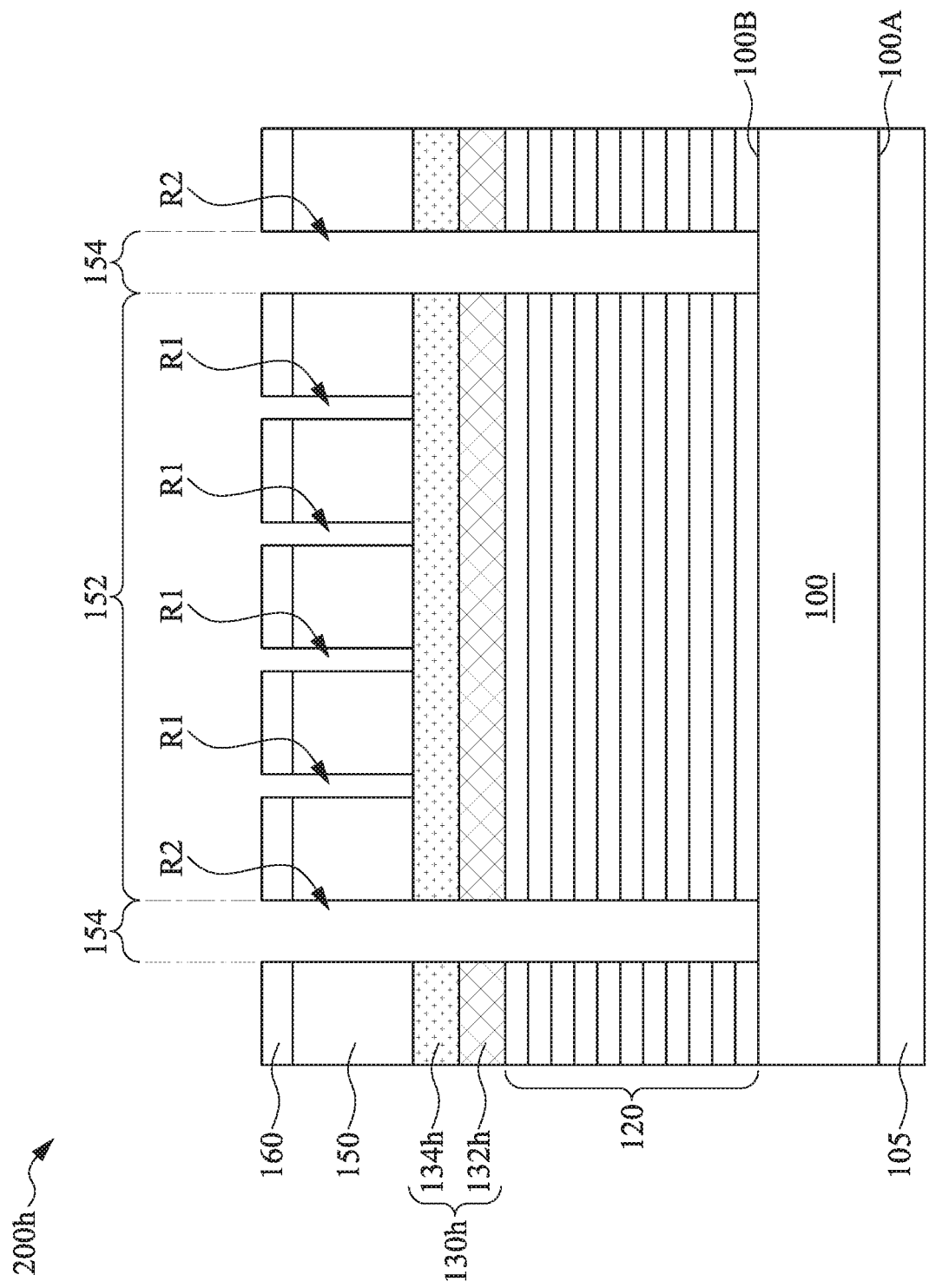

FIG. 20B is a cross-sectional view of a method for manufacturing a mask 200h at a stage in accordance with some embodiments of the present disclosure. It should be pointed out that operations for forming a mask 200h before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130h of the embodiment replaces the capping layer 130a shown in FIGS. 1-13.

As shown in FIG. 20B, the oxide of the low-carbon solubility material is in the oxide layer 134h, in contact with the absorption layer 150 and the metal layer 132h, and spaced apart from the reflective ML 120 by the metal layer 132h. In FIG. 20B, the oxide layer 136g of the capping layer 130h includes a first portion uncovered by the absorption layer 150 and a second portion covered by the absorption layer 150. In some embodiments, an atomic percentage of the oxide of the low-carbon solubility material in the first portion of the oxide layer 134h is substantially the same as that in the second portion of the oxide layer 134h. In some embodiments, an atomic percentage of the oxide of the low-carbon solubility material in the first portion of the oxide layer 134h is greater than that in the second portion of the oxide layer 134h.

Figure 21B:
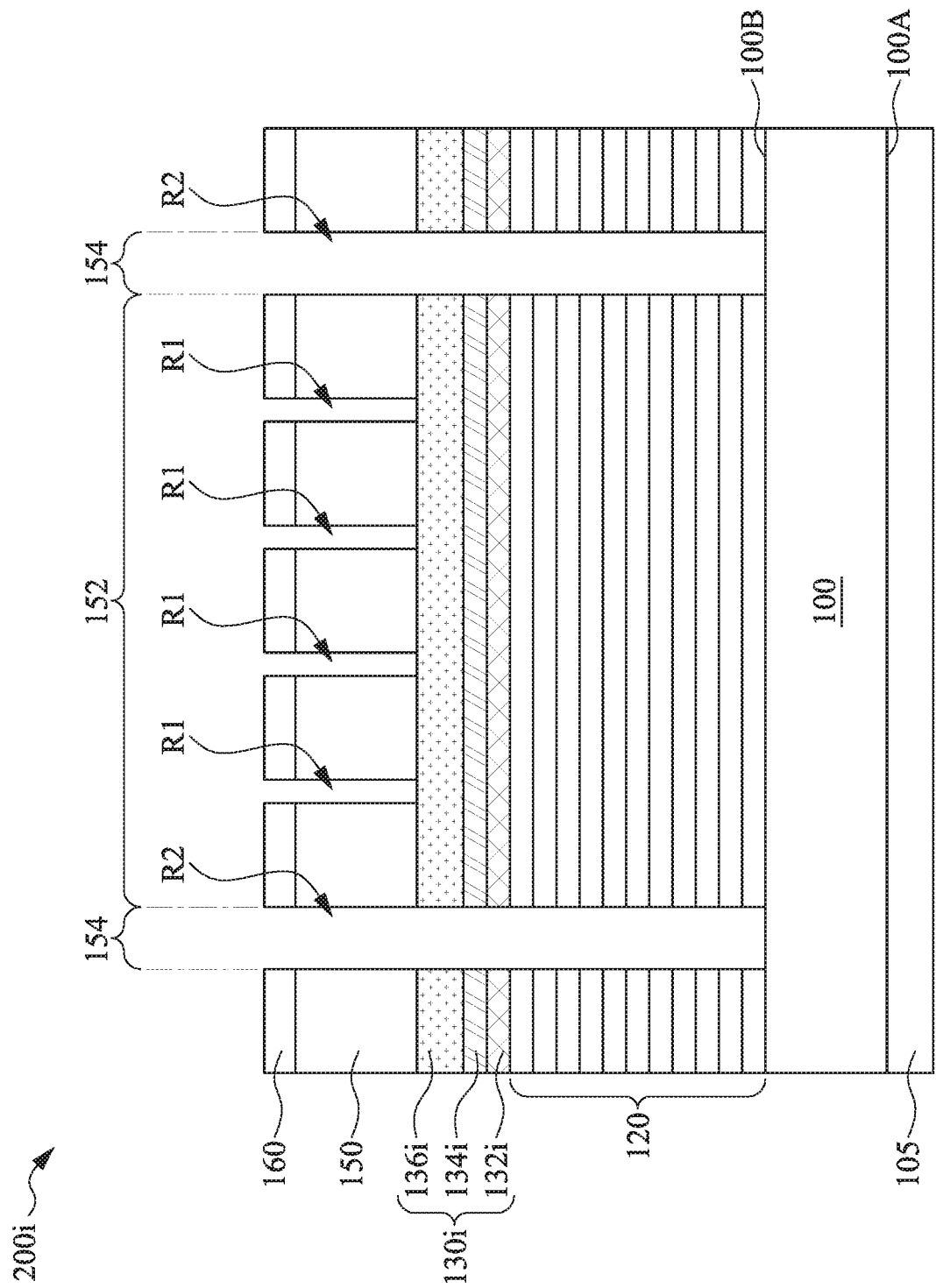

FIG. 21B is a cross-sectional view of a method for manufacturing a mask 200i at a stage in accordance with some embodiments of the present disclosure. It should be pointed out that operations for forming a mask 200i before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130i of the embodiment replaces the capping layer 130a shown in FIGS. 1-13.

As shown in FIG. 21B, the oxide of the low-carbon solubility material is in the second oxide layer 136i and spaced apart from the reflective ML 120 by the first oxide layer 134i and the metal layers 132i. In FIG. 21B, the second oxide layer 136i of the capping layer 130i includes a first portion uncovered by the absorption layer 150 and a second portion covered by the absorption layer 150. In some embodiments, an atomic percentage of the oxide of the low-carbon solubility material in the first portion of the oxide layer 136i is substantially the same as that in the second portion of the oxide layer 136i. In some embodiments, an atomic percentage of the oxide of the low-carbon solubility material in the first portion of the oxide layer 136i is greater than that in the second portion of the oxide layer 136i.

Figure 22B:
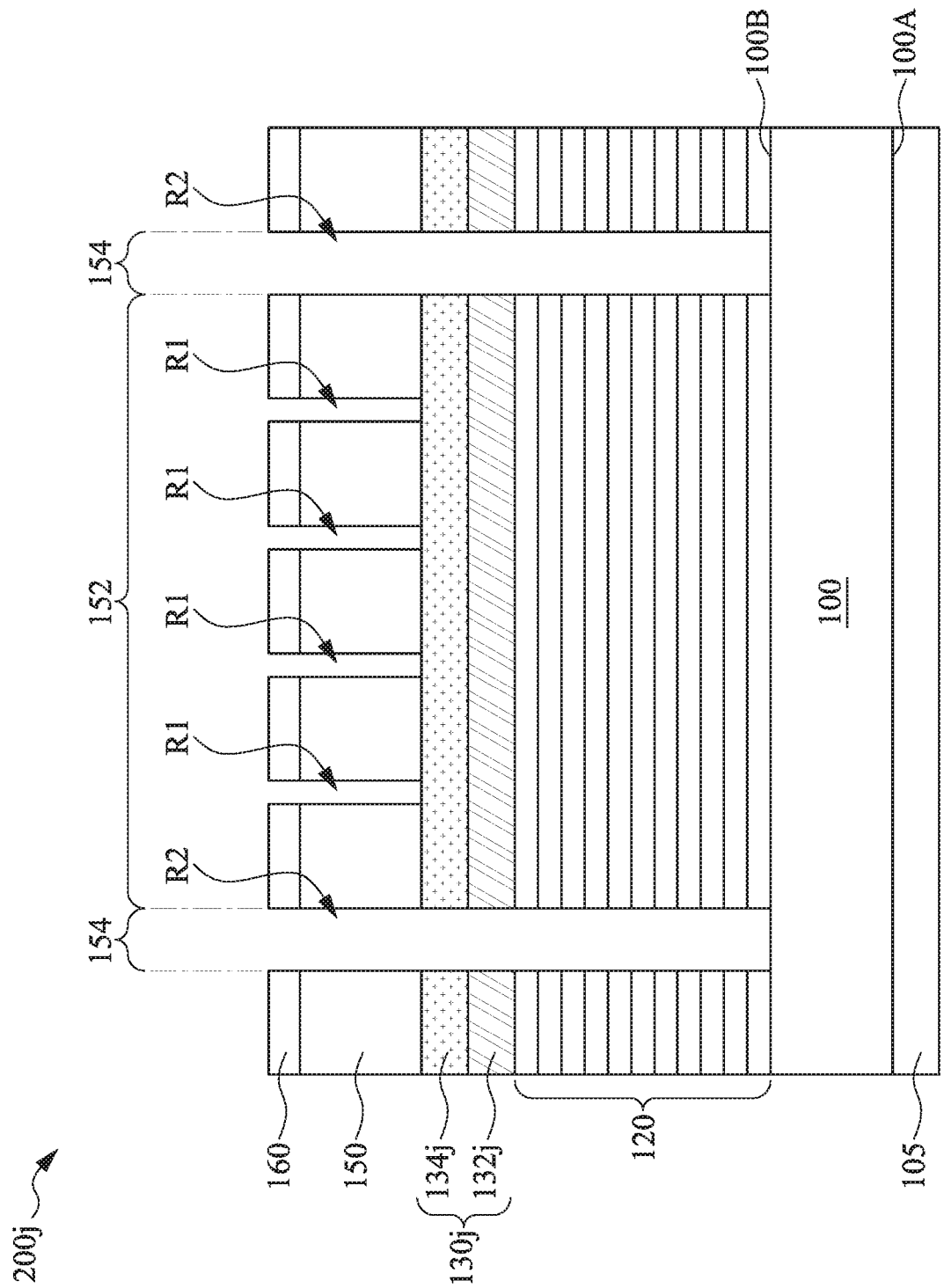

FIG. 22B is a cross-sectional view of a method for manufacturing a mask 200j at a stage in accordance with some embodiments of the present disclosure. It should be pointed out that operations for forming a mask 200j before the structure shown in FIG. 14B are substantially the same as the operations for forming the mask 200a shown in FIGS. 1-13, and reference may be made to the foregoing paragraphs for the related detailed descriptions and such descriptions are not provided again herein. The difference between the present embodiment and the embodiment in FIGS. 1-13 is that the capping layer 130j of the embodiment replaces the capping layer 130a shown in FIGS. 1-13.

As shown in FIG. 22B, the oxide of the low-carbon solubility material is in the second oxide layer 134j and spaced apart from the reflective ML 120 by the first oxide layer 132j. In FIG. 22B, the second oxide layer 134j of the capping layer 130j includes a first portion uncovered by the absorption layer 150 and a second portion covered by the absorption layer 150. In some embodiments, an atomic percentage of the oxide of the low-carbon solubility material in the first portion of the second oxide layer 134j is substantially the same as that in the second portion of the second oxide layer 134j. In some embodiments, an atomic percentage of the oxide of the low-carbon solubility material in the first portion of the second oxide layer 134j is greater than that in the second portion of the second oxide layer 134j.

FIGS. 23 to 27 are cross-sectional views of a method for manufacturing a mask at various stages in accordance with some embodiments of the present disclosure. It should be pointed out that operations for forming a mask 200k before and during the structure shown in FIG. 23 are substantially the same as the operations for forming the mask 200a shown in FIGS. 1-13, and reference may be made to the foregoing paragraphs for the related detailed descriptions and such descriptions are not provided again herein. The differences between the present embodiment and the embodiment in FIGS. 1-13 are related to operations for forming an anti-reflective layer.

Figure 24:
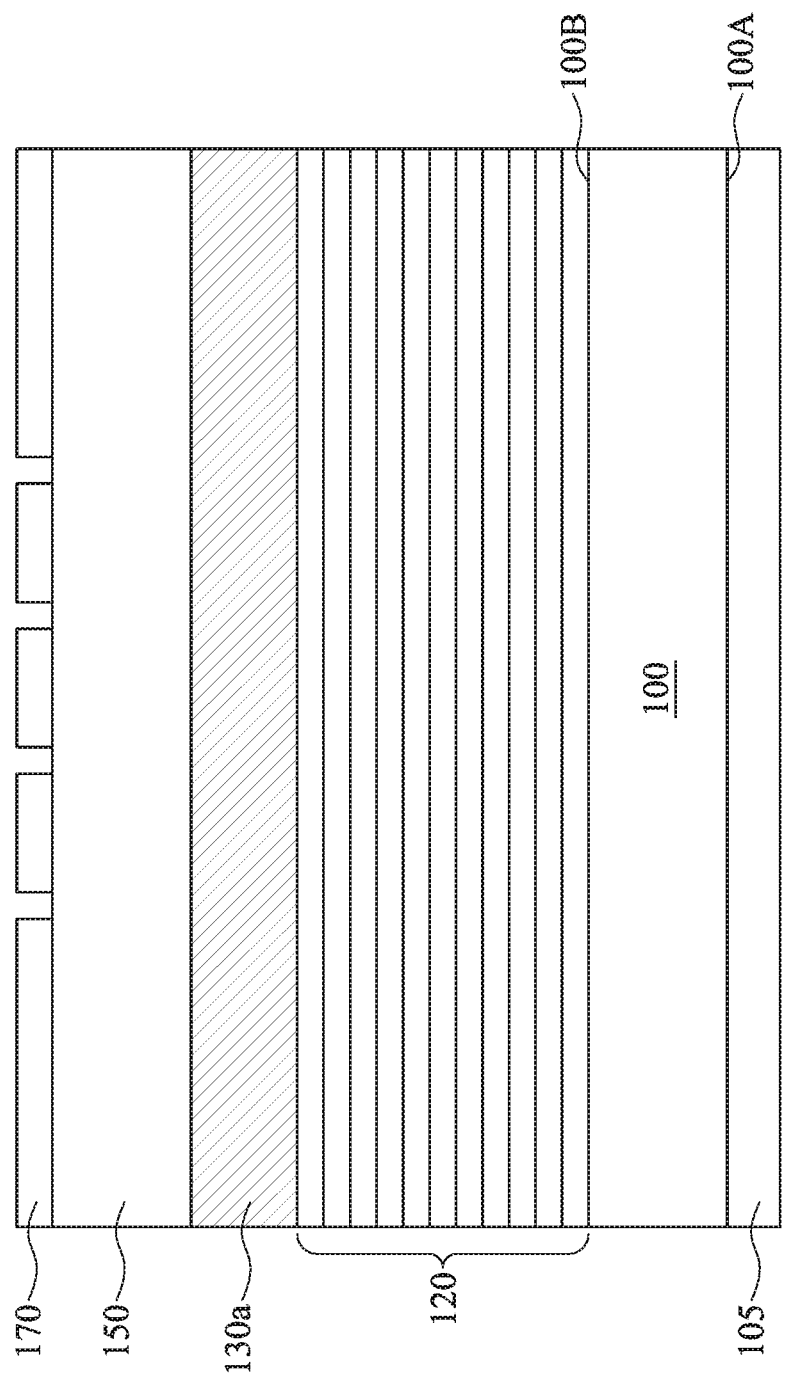

Reference is made to FIG. 24. The hard mask layer 170 is formed on the absorption layer 150 prior to forming an anti-reflective layer as shown in FIG. 5. In some embodiments, the hard mask layer 170 is patterned using the patterned photoresist layer 180 as an etch mask which is shown in FIG. 7, thereby transferring the pattern of the photoresist layer 180 to the hard mask layer 170. For example, the hard mask layer 170 may be etched using a dry (plasma) etching process, a wet etching process, and/or other etching methods.

Figure 25:
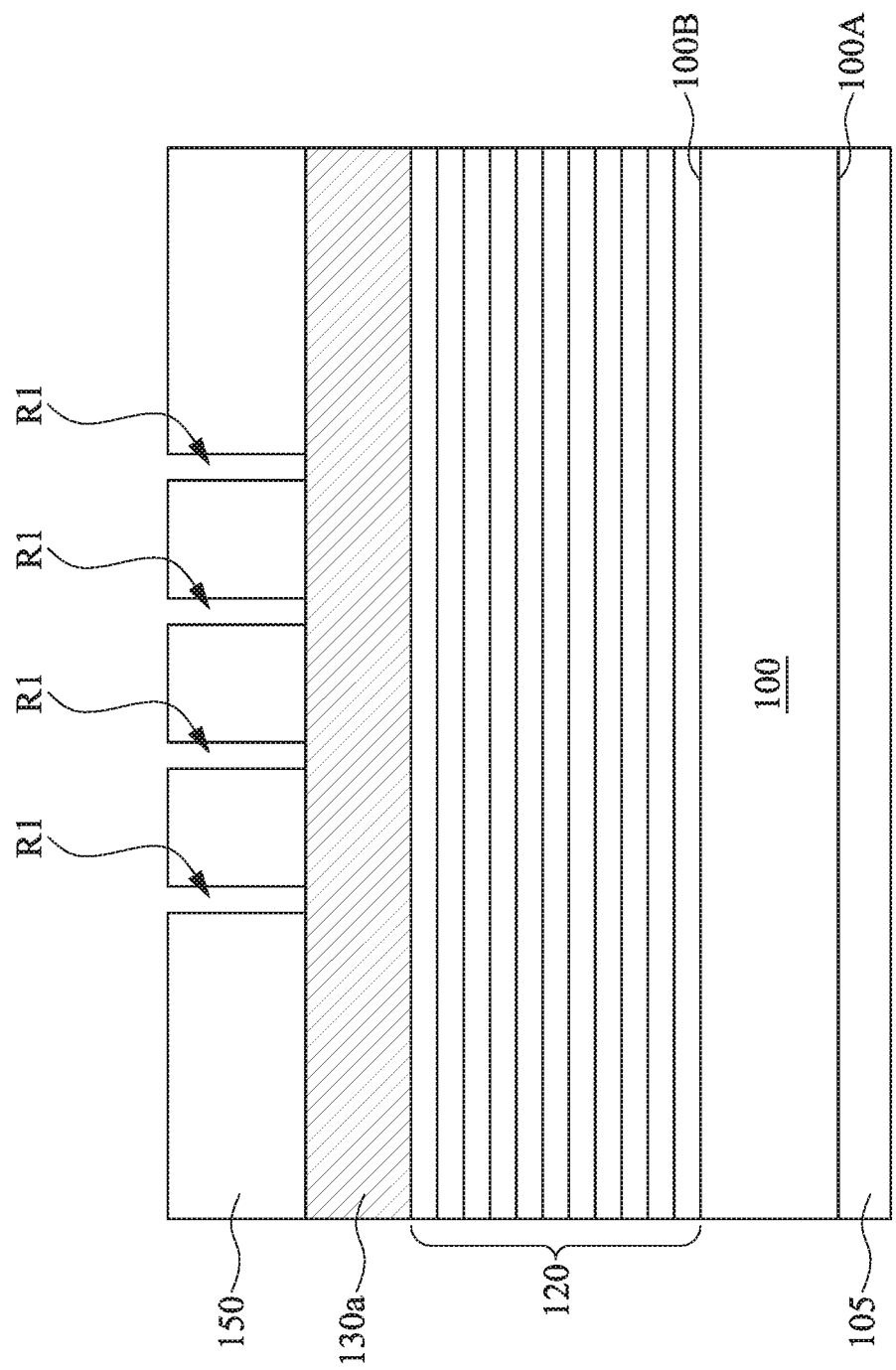

Reference is made to FIG. 25. The absorption layer 150 is patterned. Specifically, the absorption layer 150 is patterned using the patterned hard mask layer 170 as a mask to form a plurality of recesses R1 therein. This process may be referred to as a pattern transfer, in that the pattern of the hard mask layer 170 is transferred to the absorption layer 150. In some embodiments, patterning the absorption layer 150 includes one or more etching processes to selectively remove portions of the absorption layer 150 until the capping layer 130a is exposed. The etching processes may include dry etching, wet etching, and/or other etching methods.

Figure 26:
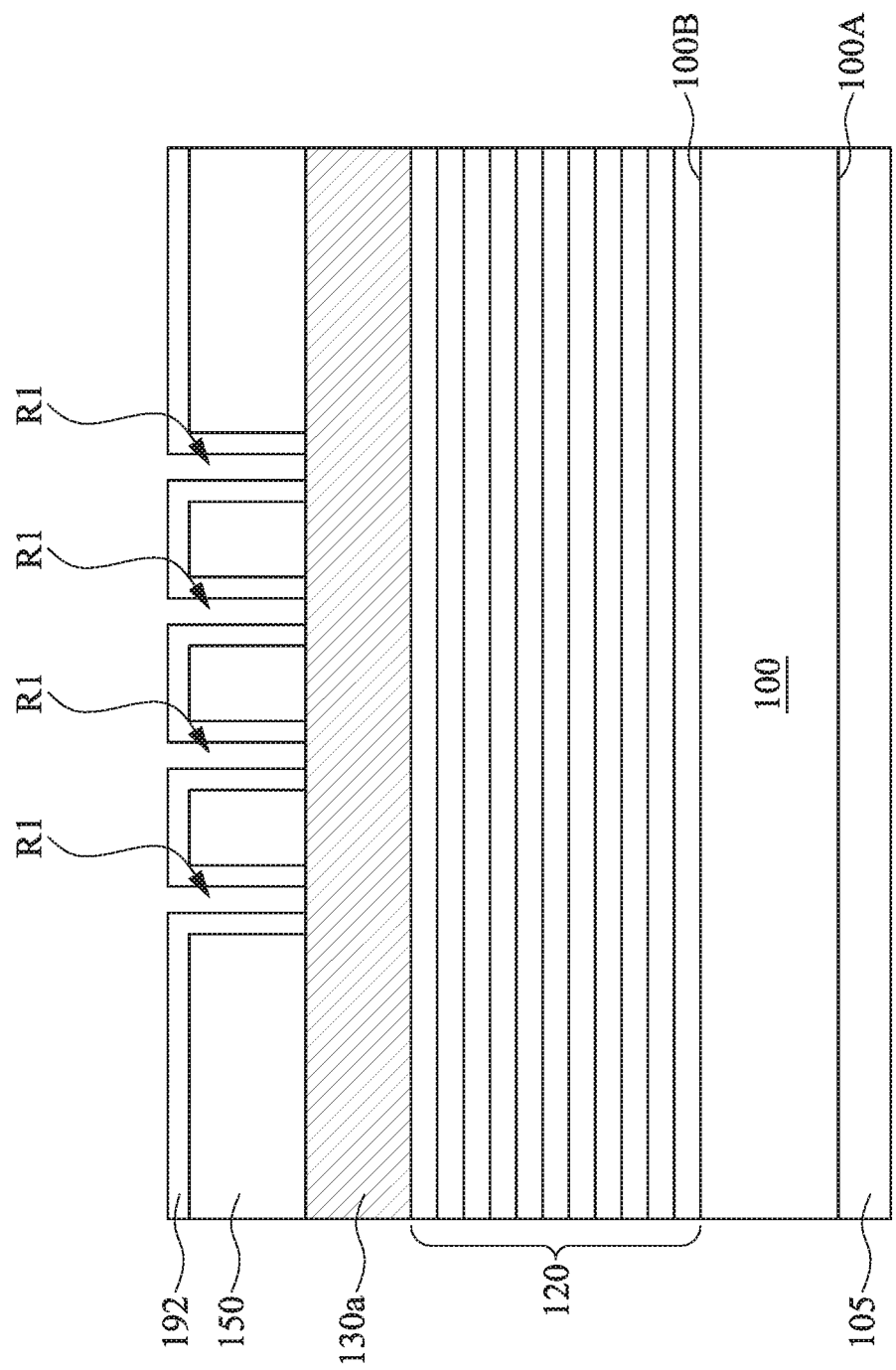

Reference is made to FIG. 26. An anti-reflective layer 192 is conformally formed on the patterned absorption layer 150 and exposes the capping layer 130a. In some embodiments, the anti-reflective layer 192 is in contact with a top surface and a sidewall of the patterned absorption layer 150 and is in contact with a portion of the capping layer 130a that is exposed by the patterned absorption layer 150. The anti-reflective layer 192 is chosen to provide effective protection to the absorption layer 150, such as protection from oxidation, etching or damage during subsequent processes that include etching and cleaning. In some embodiments, the anti-reflective layer 192 is similar to the capping layer 130a in terms of composition. In various embodiments, the anti-reflective layer 192 includes Ru, an Ru alloy, oxidized or nitrogenized Ti, Zr or Si, or another suitable material. In other embodiments, some other material may be used to form the anti-reflective layer 192. In one embodiment, a SiC film is formed as the anti-reflective layer 192. In one embodiment, the anti-reflective layer 160 includes an oxide formed from a material of the absorption layer 150.

Figure 27:
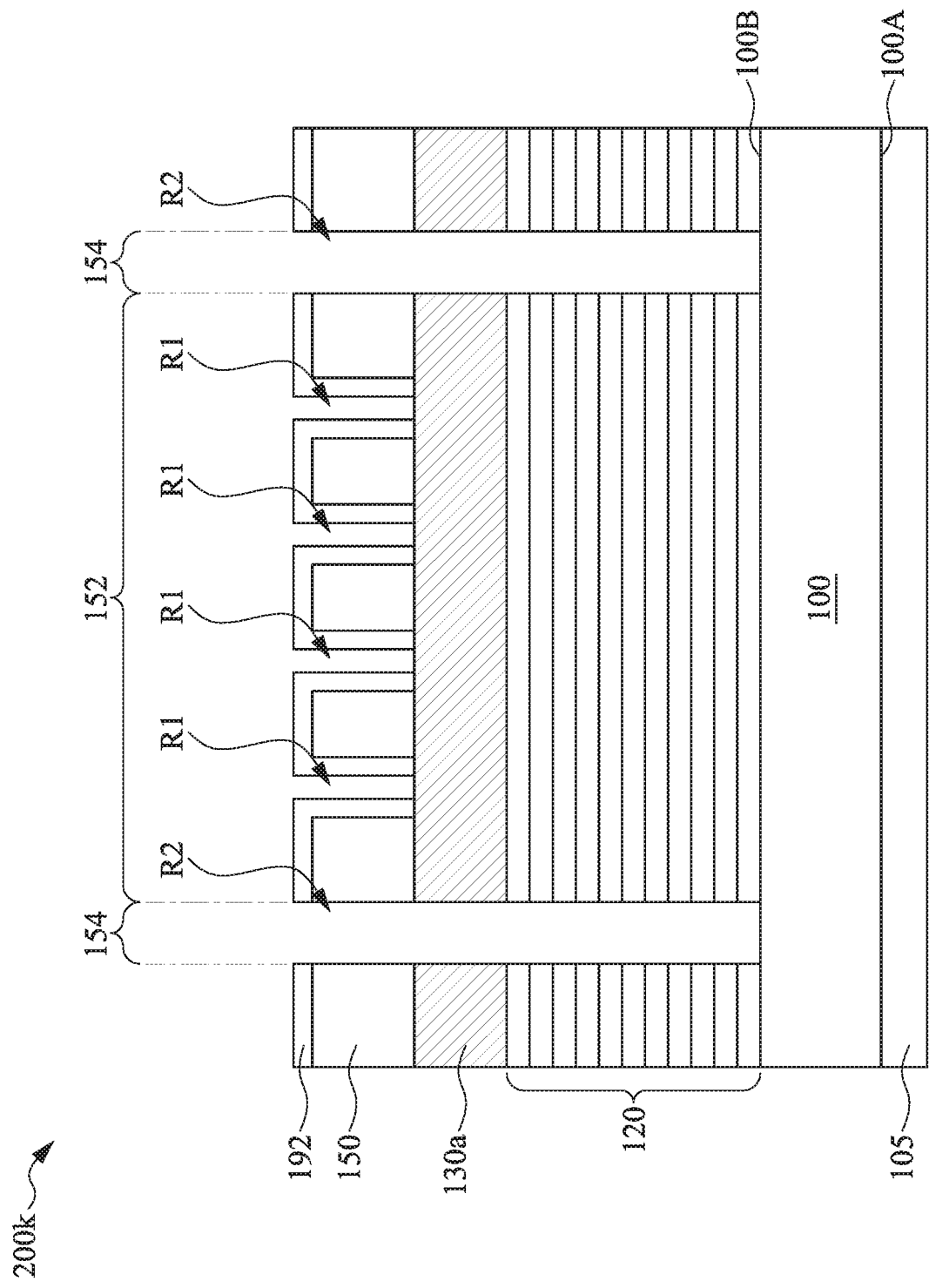

Reference is made to FIG. 27. A photoresist layer (not shown) is formed on the anti-reflective layer 192. The photoresist layer may be a positive-type resist or a negative-type resist. The photoresist layer may be an e-beam resist. Next, the photoresist layer is patterned using a suitable method including electron beam (e-beam) writing, ion-beam writing, photolithography, and/or maskless photolithography. Next, the anti-reflective layer 192, the absorption layer 150, the capping layer 130a, and the reflective ML 120 are patterned to form a plurality of recesses R2 therein by the patterned photoresist layer as shown in FIG. 12. In some embodiments, the anti-reflective layer 160, the absorption layer 150, the capping layer 130a, and the reflective ML 120 are patterned using the photoresist layer until the substrate 100 is exposed.

Accordingly, a mask 200k is formed. In some embodiments, the mask 200k includes a mask image region 152 and a black border region 154 surrounding the mask image region 152 as shown in FIG. 13. During operation, the mask 200k is used to transfer the pattern of the mask image region 152 to a wafer. For example, during an exposure process, light (radiation) is projected onto the mask 200k, and a portion of the light is transmitted to the wafer, thereby transferring the pattern of the mask image region 152 to the wafer.

Figure 28:
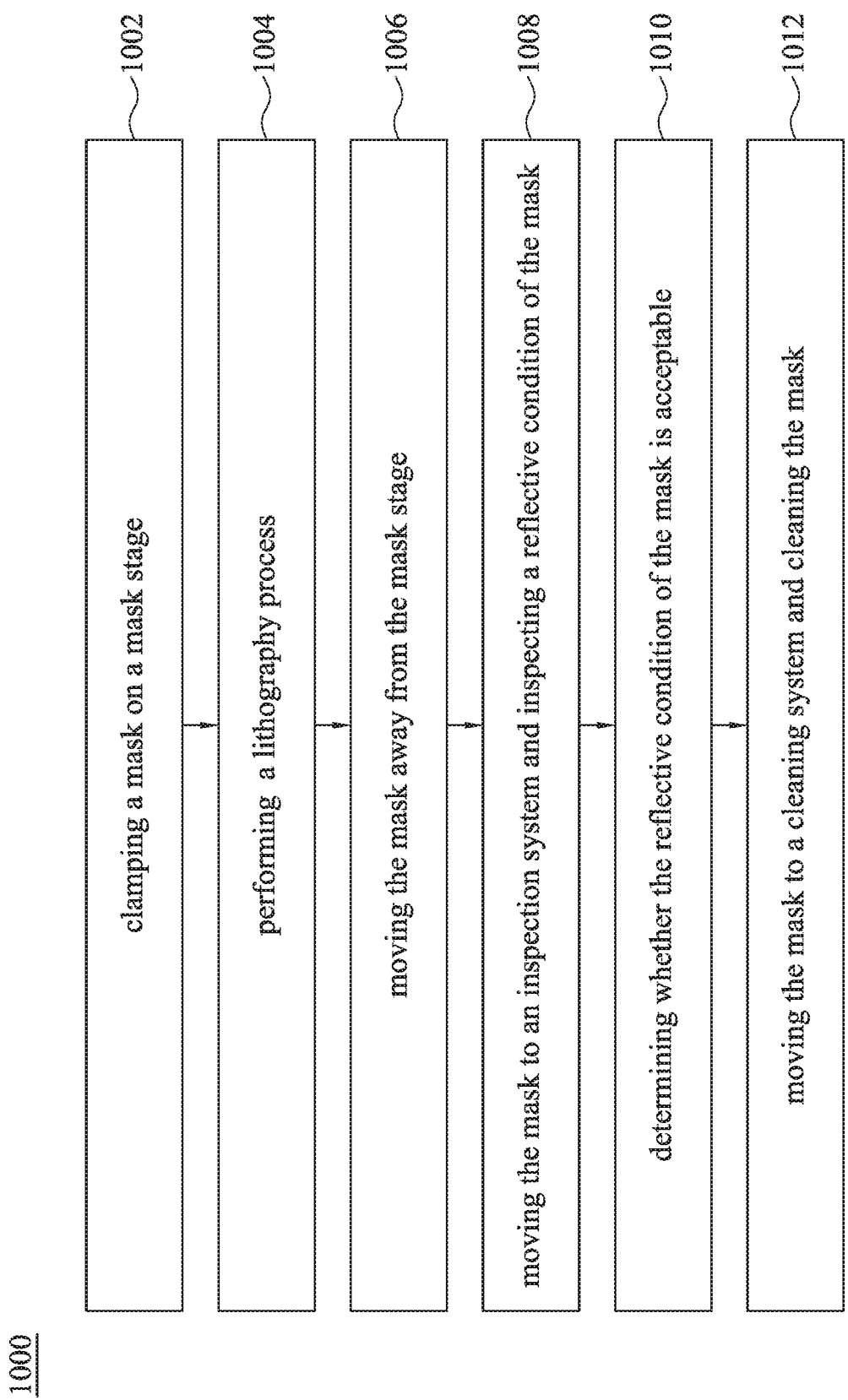
FIG. 28 is a method for operating a mask in accordance with some embodiments of the present disclosure.

FIG. 28 is a flowchart showing an illustrative method for using a lithography tool with an integrated cleaning module in accordance with some embodiments of the present disclosure. FIGS. 29-32 are a mask at various stages of operation in accordance with some embodiments of the present disclosure.

Figure 29:
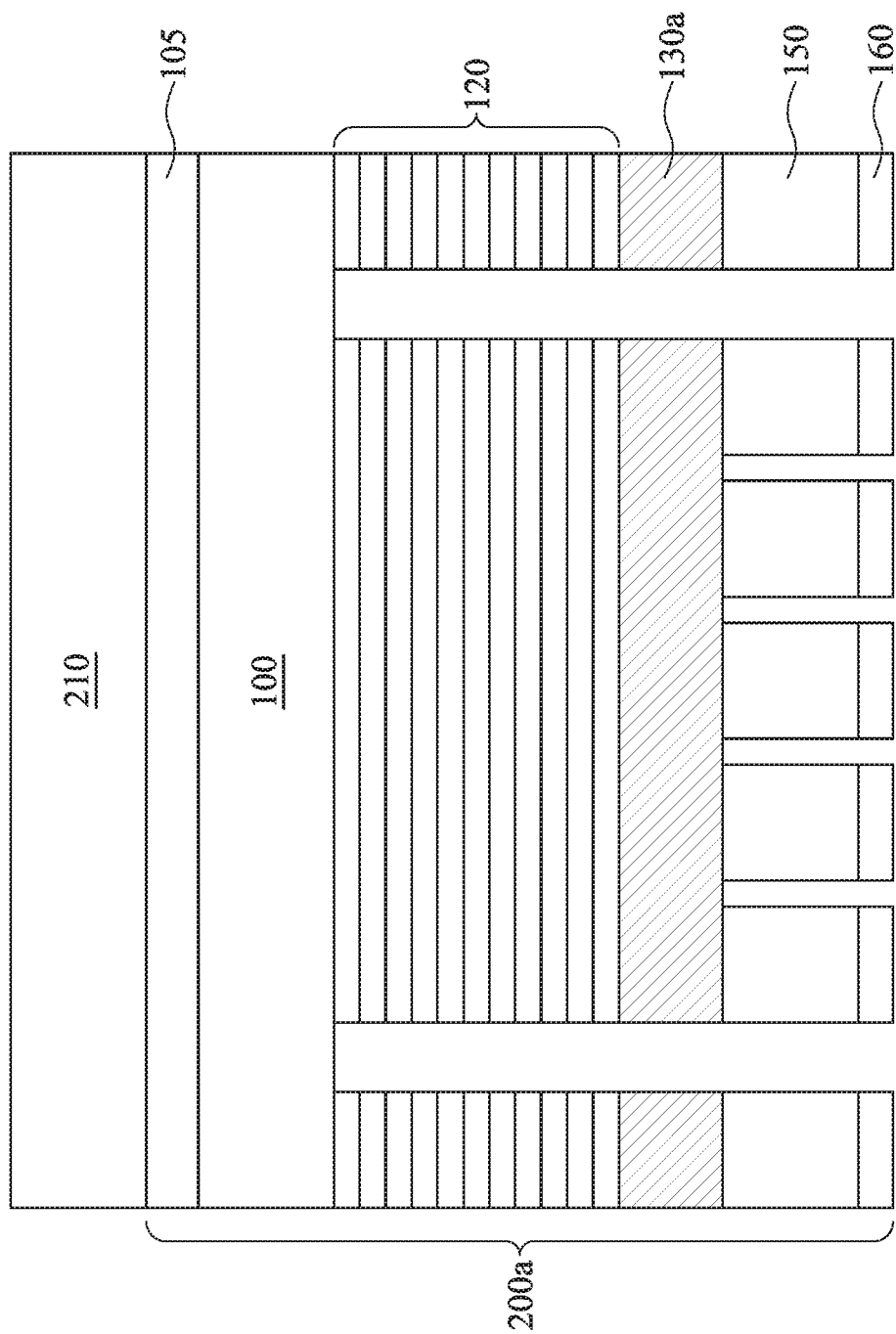
FIGS. 29-33 are schematic views of a mask at various stages of operation (FIG. 31 is a related block diagram) in accordance with some embodiments of the present disclosure.

Reference is made to FIGS. 28 and 29. The method 1000 begins at operation 1002 where a mask is clamped on a mask stage. As shown in FIG. 29, a mask 200a is clamped on a mask stage 210 of a lithography system (e.g., the lithography system 20 in FIG. 30). The mask 200a is the same as those described in FIGS. 1 to 13, and thus relevant structural details are omitted for simplicity. In some embodiments, the mask 200a can be replaced by the mask 200b, 200c, 200d, 200e, 200f, 200g, 200h, 200i, 200j, or 200k, which are described in FIGS. 14 to 27. In FIG. 29, the mask stage 210 is configured to secure the mask 200a, in which the conductive layer 105 of the mask 200a is connected to the surface of the mask stage 210.

In some embodiments, the mask stage 210 includes an electrostatic chuck (e-chuck) to secure the mask 200a. In semiconductor fabrication processes, the electrostatic chuck of the mask stage 210 may be used to hold the mask 200a for processing a lithography process. An electrostatic chuck is useful in vacuum processing environments where there is insufficient differential pressure to hold the substrate using a vacuum chuck. In some embodiments, the electrostatic chuck includes an electrostatic member supported by a support adapted to be secured in a process chamber. The electrostatic member includes an electrically insulated electrode. An electrical connector electrically connects the electrode to a voltage supply source in the process chamber.

Figure 30:
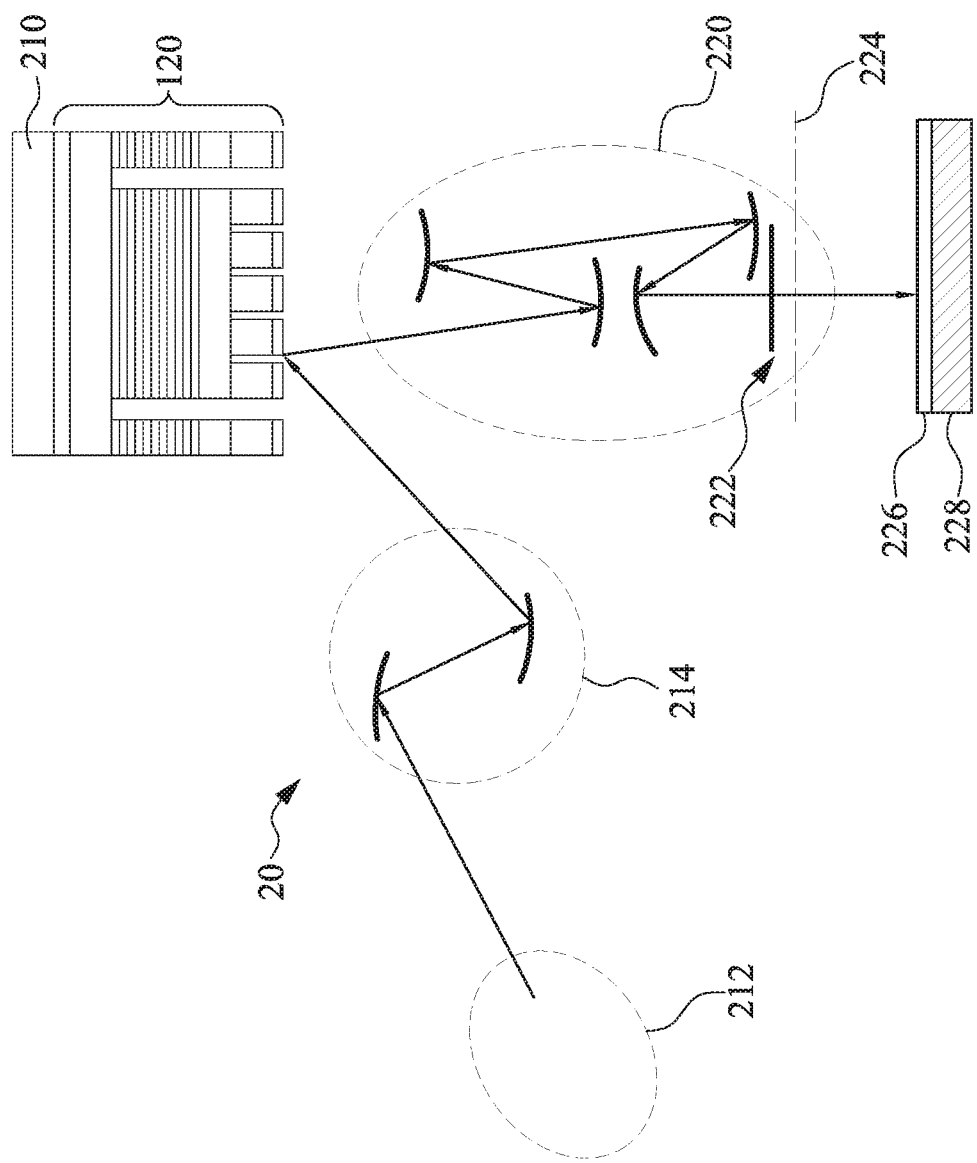

Reference is made to FIGS. 28 and 30. The method 1000 proceeds to operation 1004 where a lithography process is performed. FIG. 30 shows a lithography system 20. The lithography system 20 may also be generically referred to as a scanner that is operable to perform lithography exposing processes with a respective radiation source and an exposure mode. In some embodiments, the lithography system 20 is an extreme ultraviolet (EUV) lithography system designed to expose a resist layer to EUV light. The resist layer is a material sensitive to EUV light. The EUV lithography system 20 employs a radiation source 212 to generate EUV light, such as EUV light having a wavelength ranging between about 1 nm and about 100 nm. For example, the radiation source 212 generates EUV light with a wavelength centered at about 13.5 nm. Accordingly, the radiation source 212 is also referred to as an EUV radiation source 212. The lithography system 20 also includes the mask stage 210 configured to secure the mask 200a, as described in FIG. 29.

The lithography system 20 also employs an illuminator 214. In various embodiments, the illuminator 214 includes various refractive optic components, such as a single lens or a lens system having multiple lenses (zone plates) or alternatively reflective optics (for an EUV lithography system), such as a single mirror or a mirror system having multiple mirrors in order to direct light from the radiation source 212 onto the mask stage 210, particularly to the mask 200a secured on the mask stage 210. In the present embodiment where the radiation source 212 generates light in the EUV wavelength range, the illuminator 214 employs reflective optics. In some embodiments, the illuminator 214 includes a dipole illumination component.

In some embodiments, the illuminator 214 is operable to configure the mirrors to provide a proper illumination to the mask 200a. In one example, the mirrors of the illuminator 214 are switchable to reflect EUV light to different illumination positions. In some embodiments, a stage prior to the illuminator 214 may additionally include other switchable mirrors that are controllable to direct the EUV light to different illumination positions with the mirrors of the illuminator 214. In some embodiments, the illuminator 214 is configured to provide an on-axis illumination (ONI) to the mask 200a. In an example, a disk illuminator 214 with partial coherence c being at most 0.3 is employed. In some other embodiments, the illuminator 214 is configured to provide an off-axis illumination (OAI) to the mask 200a. In an example, the illuminator 214 is a dipole illuminator. The dipole illuminator has a partial coherence σ of at most 0.3 in some embodiments.

The lithography system 20 also includes a projection optics module (or projection optics box (POB)) 220 for imaging the pattern of the mask 200a on to a semiconductor wafer 226 secured on a substrate stage 228 of the lithography system 20. The POB 220 has refractive optics (such as for a UV lithography system) or alternatively reflective optics (such as for an EUV lithography system) in various embodiments. The light directed from the mask 200a, carrying the image of the pattern defined on the mask 200a, is collected by the POB 220. The illuminator 214 and the POB 220 are collectively referred to as an optical module of the lithography system 20.

The lithography system 20 also includes a pupil phase modulator 222 to modulate an optical phase of the light directed from the mask 200a so that the light has a phase distribution on a projection pupil plane 224. In the optical module, there is a plane with field distribution corresponding to a Fourier Transform of the object (the mask 200a in the present case). This plane is referred to as projection pupil plane. The pupil phase modulator 222 provides a mechanism to modulate the optical phase of the light on the projection pupil plane 224. In some embodiments, the pupil phase modulator 222 includes a mechanism to tune the reflective mirrors of the POB 220 for phase modulation. For example, the mirrors of the POB 220 are switchable and are controlled to reflect the EUV light, thereby modulating the phase of the light through the POB 220.

In some embodiments, the pupil phase modulator 222 utilizes a pupil filter placed on the projection pupil plane. A pupil filter filters out specific spatial frequency components of the EUV light from the mask 210. Particularly, the pupil filter is a phase pupil filter that functions to modulate a phase distribution of the light directed through the POB 220. However, utilizing a phase pupil filter is limited in some lithography systems (such as a EUV lithography system) since all materials absorb EUV light.

As discussed above, the lithography system 20 also includes the substrate stage 228 to secure the semiconductor wafer 226 to be patterned, such as a semiconductor substrate. In some embodiments, the semiconductor wafer is a semiconductor substrate, such as a silicon substrate or another type of substrate. The semiconductor wafer 226 is coated with a resist layer sensitive to a radiation beam, such as EUV light in the present embodiment. The lithography process is performed by operating the lithography system 20 for exposing a resist layer coated on the wafer 226. When the exposed resist layer is further developed, various openings are formed in the resist layer, resulting in a patterned resist layer. The patterned resist layer is subsequently used for etching the wafer 226 in order to form a material layer with designed IC patterns on the wafer 226, thereby forming features therein or thereon for an integrated circuit. This process may be repeated, layer by layer, for forming multiple material layers on the wafer 226.

Various components including those described above are integrated together and are operable to perform lithography exposing processes. The lithography system 20 may further include other modules or may be integrated with (or be coupled with) other modules.

Reference is made to FIG. 28. The method 1000 proceeds to operation 1006 where the mask is removed from the mask stage after performing the lithography process. In some embodiments, if the mask 200a is reusable, the mask 200a can be removed from the mask stage 210 and can be stored until another lithography process is intended to be performed.

Figure 31:
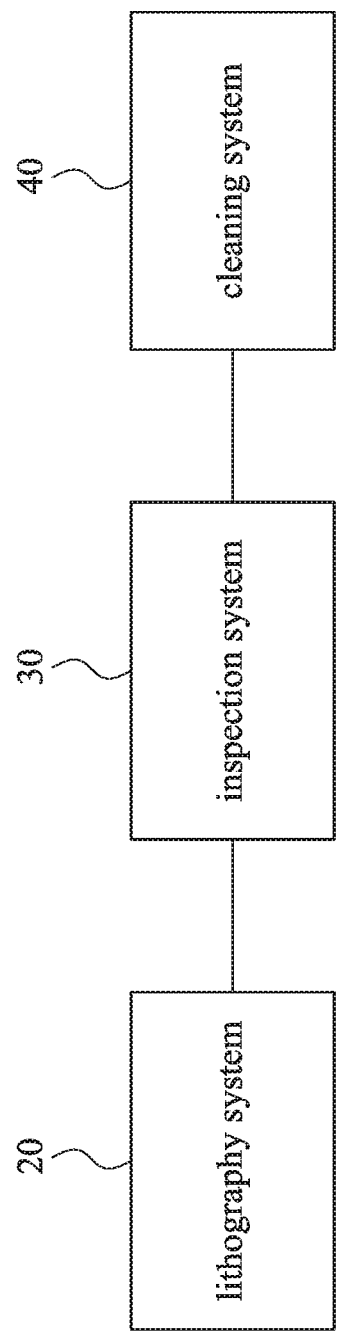

Reference is made to FIGS. 28 and 31. Before another lithography process is to be performed, the method 1000 proceeds to operation 1008 by moving the mask to an inspection system and inspecting a reflective condition of the mask 200a. Referring to FIG. 31, shown there is a lithography system 20, an inspection system 30, and a cleaning system 40, in which the lithography system 20 is similar to or the same as the lithography system 20 described in FIG. 30. After performing the lithography process using the lithography system 20, the mask 200a is moved from the lithography system 20 to the inspection system 30. Thereafter, the reflective condition of the mask 200a is inspected using the inspection system 30. For example, the mask 200a is inspected to determine whether the reflectivity thereof is lower than a predetermined value.

As described above, it is important that an EUV mask be as clean and defect-free as possible for the reflectivity thereof. It has been found that when an EUV mask is exposed to the atmosphere, a thin layer of carbon buildup accumulates on the surface of the mask. This layer of carbon buildup is typically less than 5 nanometers thick. This layer accumulates from the carbon of $CO_2$ gas within the atmosphere. The carbon buildup is a different issue than the particles that can accumulate during use of the mask.

With a typical lithography tool, a mask is inserted into a load lock chamber. The atmosphere is then pumped out of the load lock chamber so that the mask is within a vacuum. The mask can then be moved to the exposure chamber where it is used to form patterns on semiconductor wafers. A series of wafers are then passed through the exposure chamber so that the pattern of the mask is transferred to the wafers. The thin carbon buildup described above is naturally removed during the EUV exposure process. This is due to the hydrogen that is present within the exposure chamber. This hydrogen reacts with the carbon to remove the carbon buildup. However, the first couple of wafers are exposed with the carbon buildup not fully removed and thus the first couple of wafers are adversely affected. Our experiments found that the existing method to clean the mask is not effective. Further experiments identified that the cleaned mask is contaminated again when it is transferred from the cleaning module to the atmospheric environment and then to the lithography tool.

According to principles described herein, a cleaning module is integrated into the lithography tool. The cleaning module, which will be described in further detail below, is integrated within the lithography tool such that at some point after the mask is placed within a vacuum environment, the mask is cleaned to remove the carbon buildup and is transferred to the exposure module for lithography exposure. Particularly, the mask is cleaned, maintained and transferred for lithography exposure within the lithography tool under the vacuum condition. In one example, the cleaning module is integrated into the load lock chamber. In one example, the cleaning module is integrated into a discrete chamber between the load lock chamber and the exposure module. Other placements of the cleaning module within the lithography tool are contemplated as well. Through use of this cleaning module, the thin carbon buildup is removed before the first wafer is exposed. Thus, the first couple of wafers are not adversely affected.

Figure 32:
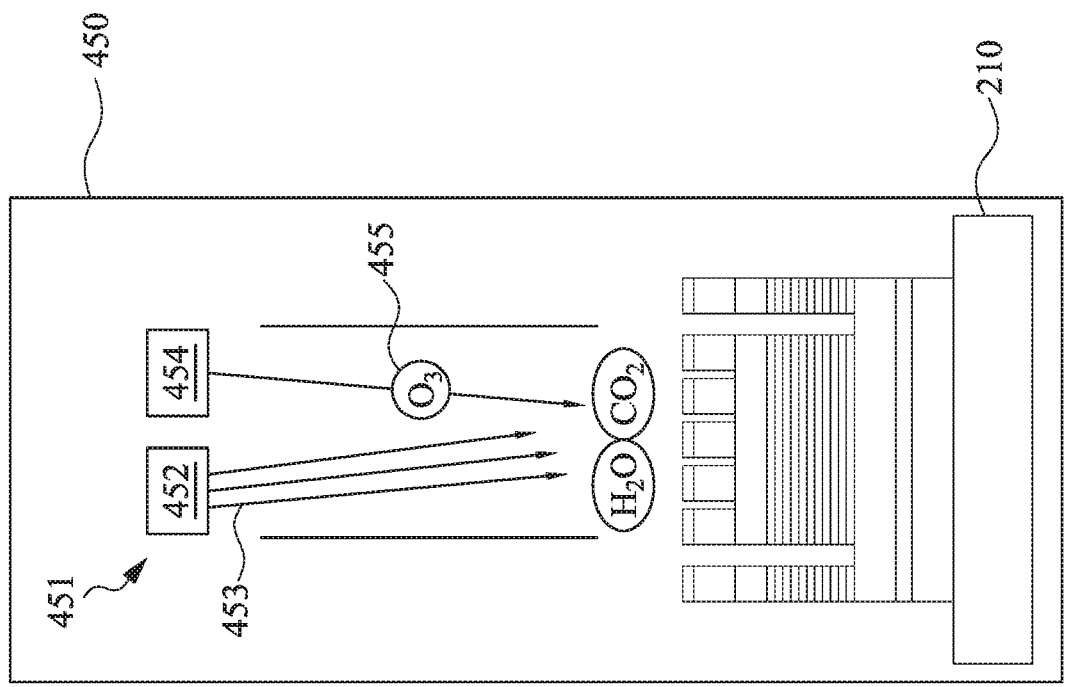
Figure 33:
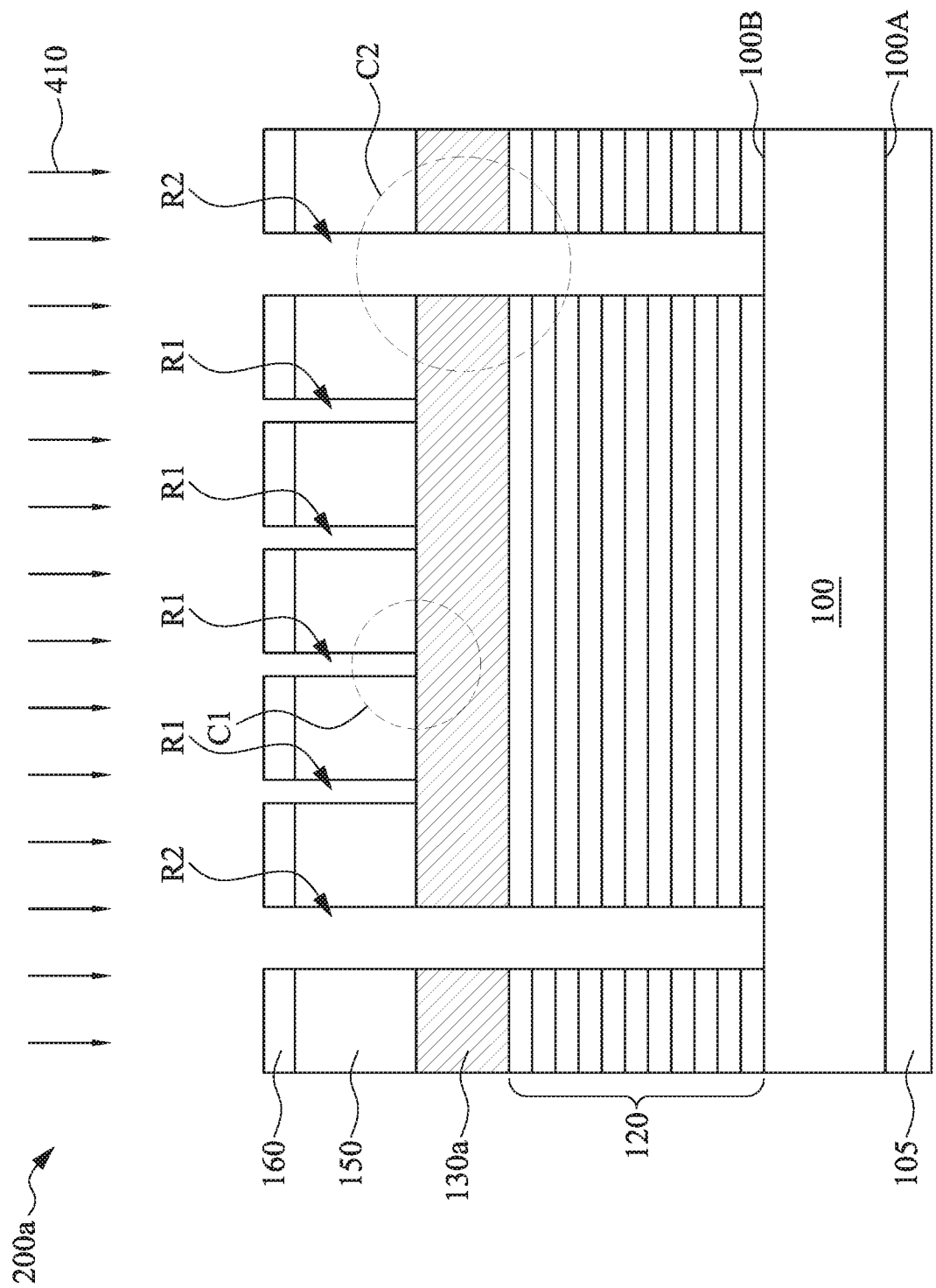

Reference is made to FIGS. 28, 32, and 33. The method 1000 proceeds to operation 1012 wherein the mask is moved to a cleaning system and cleaned. Specifically, the mask 200a is moved from the inspection system 30 to the cleaning system 40, and then the mask 200a is cleaned. For example, FIG. 32 shows an example of the cleaning system 40 including a cleaning module 450, and FIG. 33 shows an example of the mask 200a on which is performed a cleaning process 410 with the cleaning module as shown in FIG. 32.

As described above, when the mask 200a is exposed to the atmosphere, a thin carbon buildup develops on the surface of the mask 200a. For example, the mask 200a may be placed in storage for a few days between the times it is used. While in storage, the exposure to the atmosphere causes the carbon to form on the mask 200a. The thin carbon buildup adversely affects the reflective properties of the mask 200a.

In some embodiments, a cleaning module 450 includes an ultraviolet ozone cleaning system 451. According to the present example, the ultraviolet ozone cleaning system 451 includes an ultraviolet (UV) light source 452 and an ozone ($O_3$) source 454. The UV light source 452 produces UV light 453 at specific wavelengths to break the bonds in the ozone 455. The broken-up oxygen atoms may then bond with the carbon on the surface of the mask 200a to create carbon dioxide ($CO_2$). The carbon dioxide may be removed from the cleaning module 450 with a pumping mechanism. In some cases, if there is hydrogen within the carbon buildup 108 of the mask, then that hydrogen is removed as $H_2O$ after reacting with the oxygen atoms.

The UV light source 452 can produce light 453 at a wavelength that is tuned to break up certain types of chemical bonds. For example, to break the chemical bonds of the ozone 455, the UV light source 452 can produce light having a wavelength of about 253.7 nanometers. In some cases, the ozone source 454 may provide oxygen ($O_2$) as well as the ozone 455. The UV light source 452 may also produce light 453 having a wavelength of about 184.7 nanometers to break up the bonds that hold the atoms from the oxygen ($O_2$) together.

In some embodiments, a cleaning process to remove the carbon from the mask 200a involves exposing the mask 200a to hydrogen, and the carbon buildup is removed by a chemical reaction. Specifically, the hydrogen Interacts with the carbon buildup to form methane gas $CH_4$. As described above, while this removal process occurs naturally during the exposure process, it is desirable that it occur before the exposure process. In some embodiments, the hydrogen includes hydrogen radicals. In some embodiments, the hydrogen includes hydrogen plasma. In some other embodiments, the hydrogen, having hydrogen radicals or hydrogen plasma, is further agitated by an ultrasonic wave to create a wave in the hydrogen for an enhanced cleaning effect.

Figure 34A:
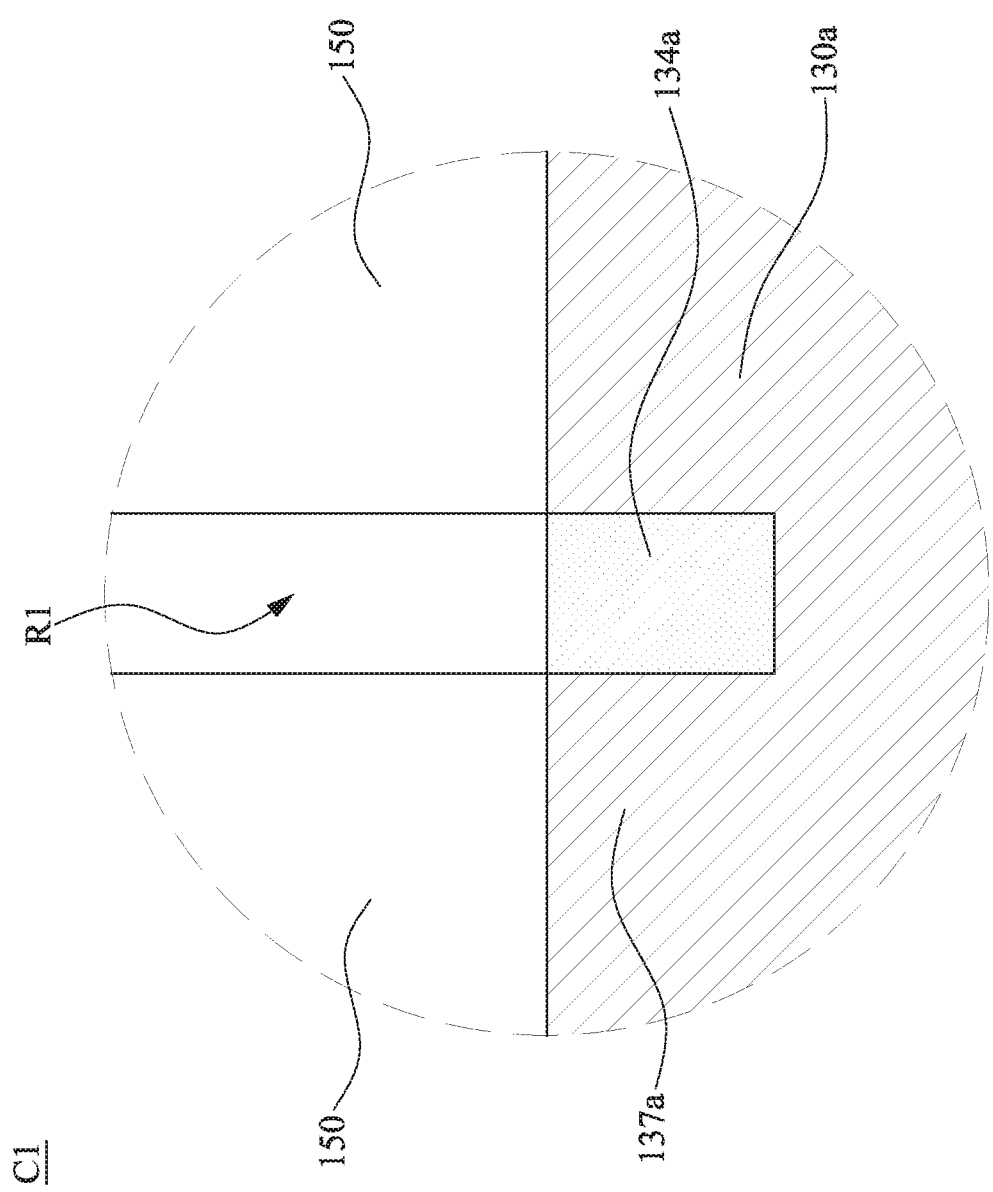
FIGS. 34A-34F are cross-sectional views of masks in accordance with some embodiments of the present disclosure.
Figure 34B:
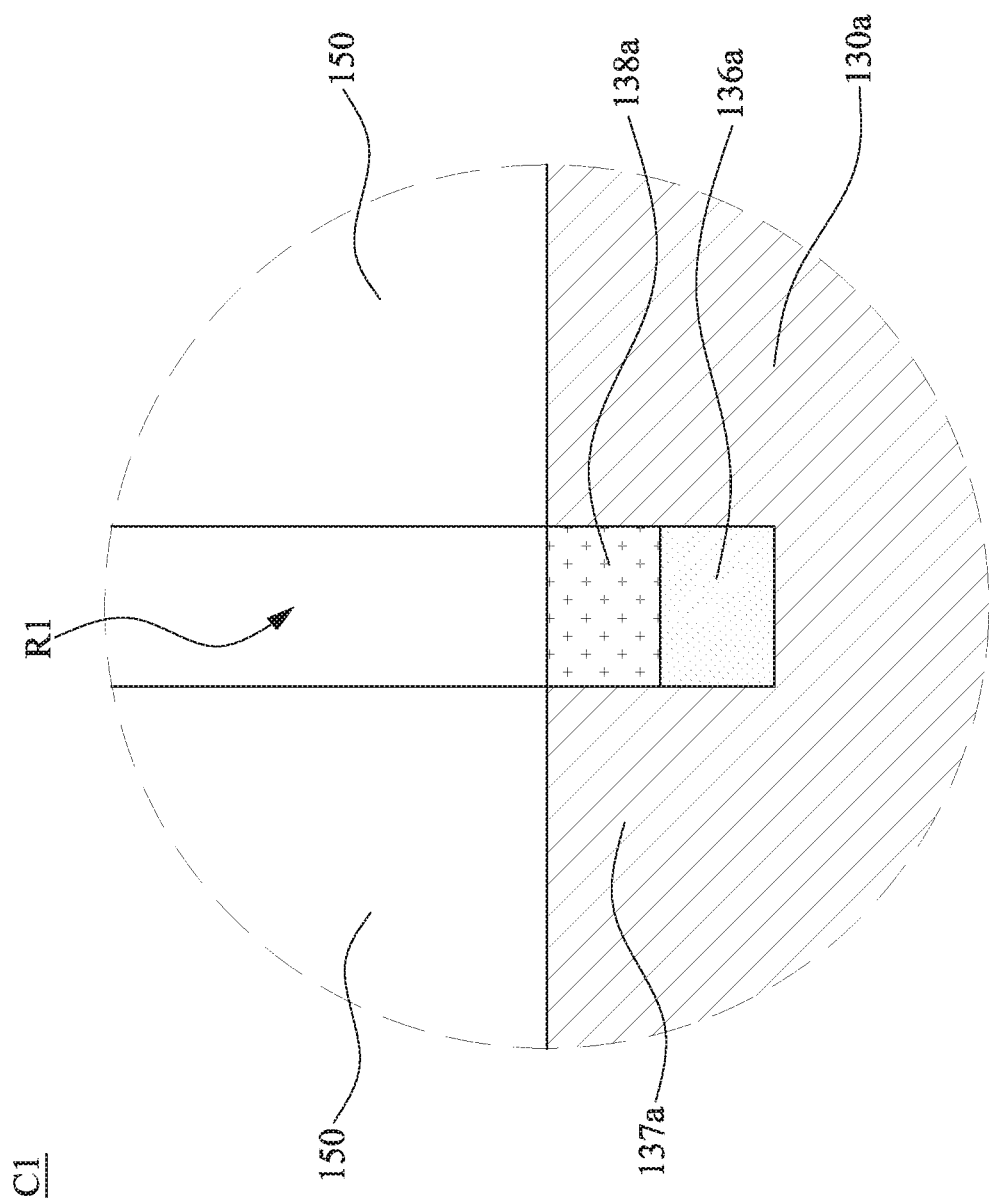
Figure 34C:
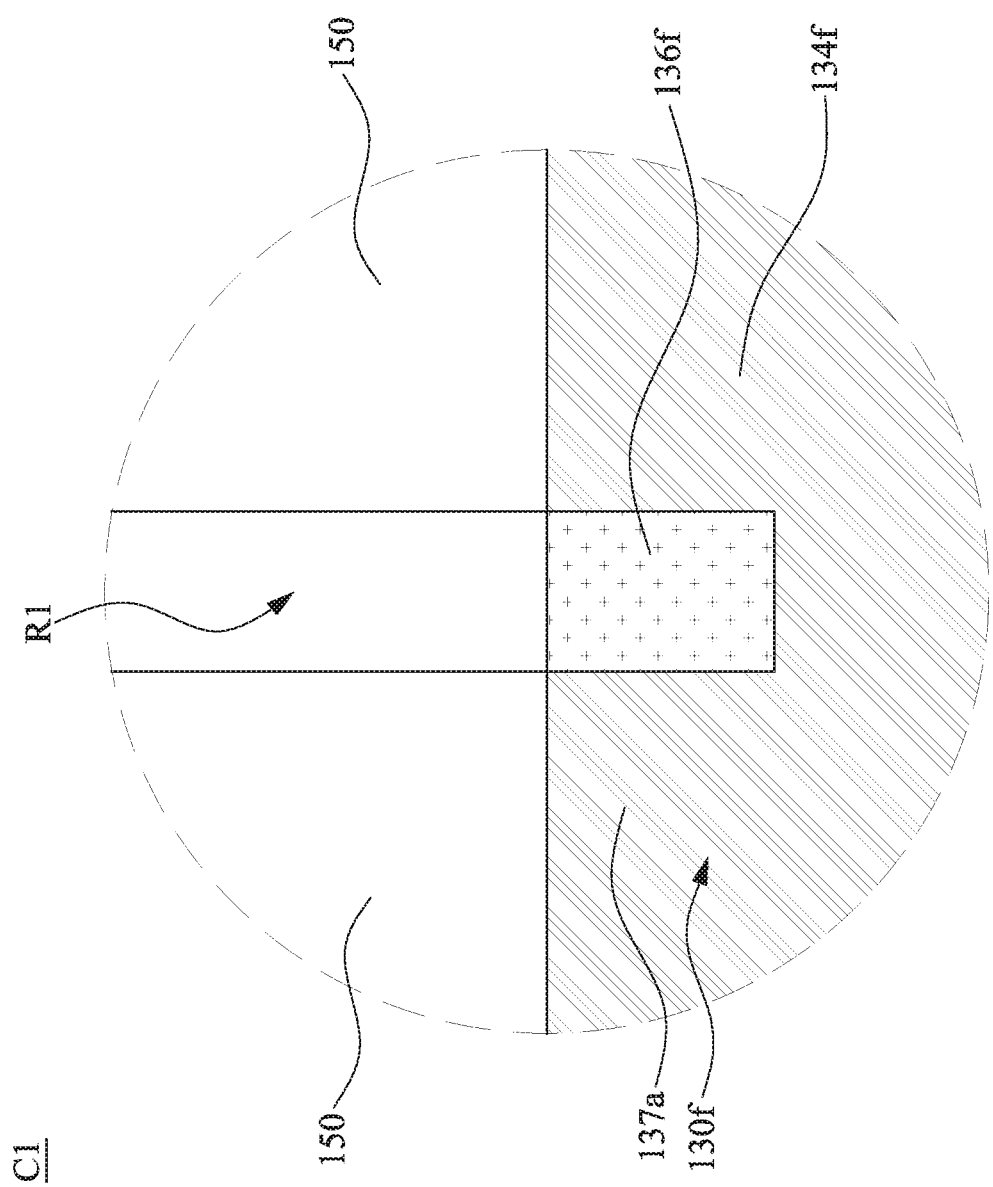
Figure 34D:
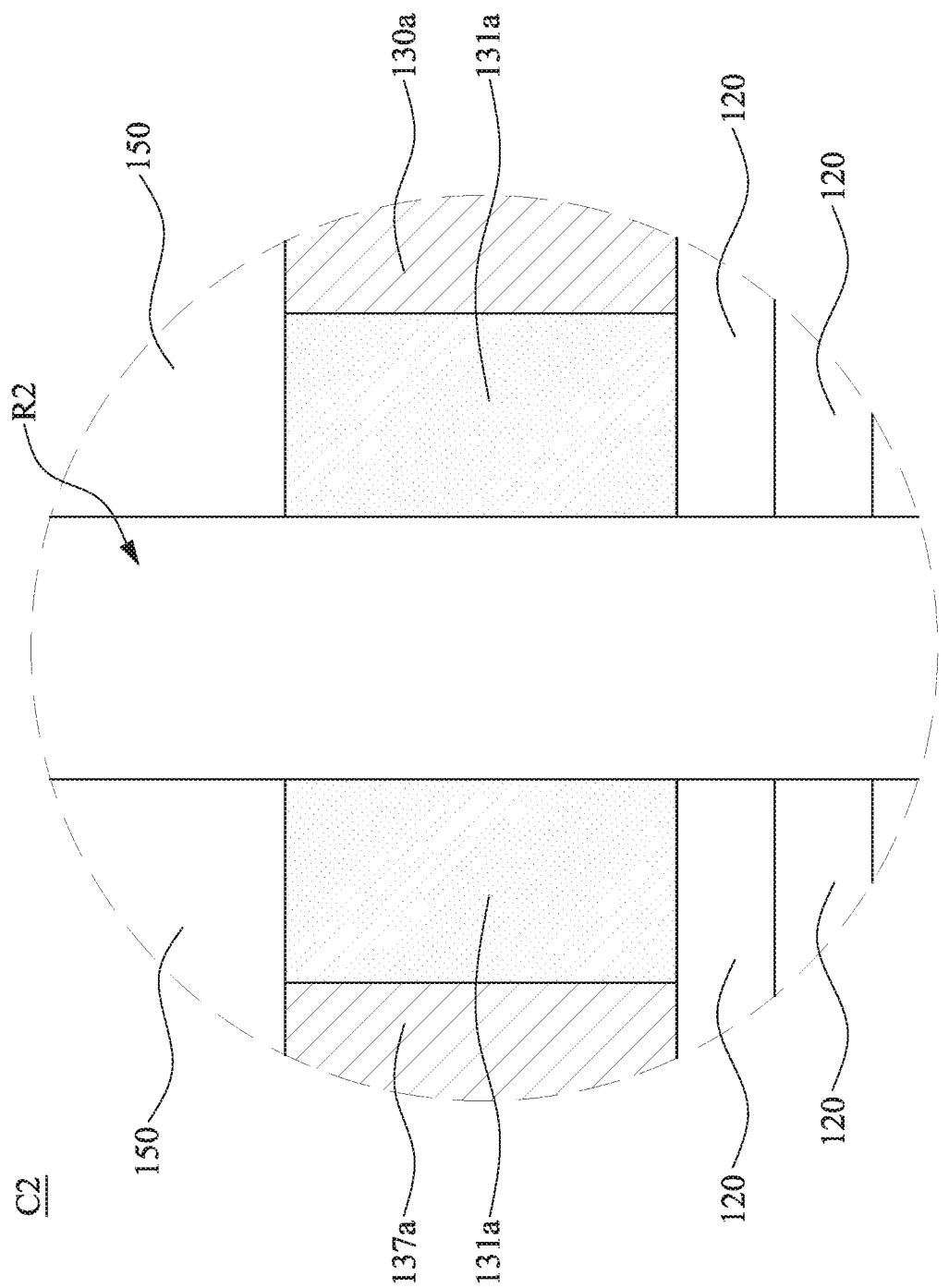

Reference is made to FIGS. 33, 34A, and 34D. FIGS. 34A and 34D are local enlarged views of the mask 200a according to FIG. 33 in regions C1 and C2, respectively. As shown in FIGS. 33, 34A, and 34D, the cleaning process 410 shown in FIG. 33 is performed on the capping layer 130a using at least one of oxygen, thereby oxidizing the capping layer 130a as illustrated in FIGS. 34A and 34D. The cleaning process 410 is designed to introduce at least one of oxygen to the capping layer 130a such that it is densified to enhance an anti-carbon effect of the capping layer 130a. Particularly, the capping layer 130a which has undergone the cleaning process 410 is oxidized to have a tightly-packed structure. In some embodiments, the capping layer 130a which has undergone the cleaning process 410 is an amorphous structure for anti-carbon dissociation/diffusion. After the capping layer 130a which has undergone the cleaning process 410 is treated by oxygen, the grains of material shrink and the capping layer is converted to an amorphous structure. This is used to provide an anti-carbon barrier, where the amorphous phase means fewer diffusion paths than with a polycrystalline structure.

In FIGS. 34A and 34D, the cleaning process 410 is applied to the capping layer 130a through the recesses R1 and R2 of the absorption layer 150 using the absorption layer 150 as a mask that effectively blocks the covered portions of the capping layer 130a and/or 130f from the cleaning process 410.

Referring to FIG. 34A, the capping layer 130a includes a first portion 134a uncovered by the absorption layer 150 and a second portion 137a covered by the absorption layer 150. The first portion 134a is within the recesses R1 of the absorber layer 150. In some embodiments, the first portion 134a of the capping layer 130a is spaced apart from the reflective ML 120 and the absorption layer 150. After the cleaning process 410, the first portion 134a is changed (oxidized), while the second portion 137a remains free of the cleaning process 410 and therefore is different from the first portion 134a in composition. For example, an atomic percentage of the oxide of the low-carbon solubility material in the first portion 134a of the capping layer 130a is greater than that in the second portion 137a of the oxide layer 130a. In some embodiments, an atomic percentage of the oxide of the low-carbon solubility material in the first portion 134a of the capping layer 130a is greater than that in another portion between the first portion 134a and the reflective ML 120.

In some embodiments, the first portion 134a of the capping layer 130a includes oxide of a low-oxygen reactive material, such as $RuO_2$, and a low-carbon solubility material, of which the oxide of the low-carbon solubility material has a carbon solubility lower than a carbon solubility of the oxide of the low-oxygen reactive material. In some embodiments, a carbon solubility of the first portion 134a of the capping layer 130a is lower than a carbon solubility of the second portion 137a of the capping layer 130a. In some embodiments, a carbon solubility of the first portion 134a of the capping layer 130a is lower than a carbon solubility of the another portion between the first portion 134a and the reflective ML 120. The first portion 134a serves as a diffusion barrier which reduces the carbon poisoning of the capping layer 130a.

In some embodiments, the first portion 134a of the capping layer 130a includes oxide of a niobium-containing material, such as $NbO_x$. For example, the first portion 134a of the capping layer 130a may include $Nb_2O_5$. In some embodiments, the first portion 134a may include RuNb, RuTi, RuZr, RuY, RuB, or combinations thereof.

Referring to FIG. 34D, the capping layer 130a includes a third portion 131a exposed by the recess R2 and the second portion 137a covered by the absorption layer 150 and the third portion 131a. After the cleaning process 410, the third portion 131a is changed (oxidized), while the second portion 137a remains free of the cleaning process 410 and therefore is different from the third portion 131a in composition. For example, an atomic percentage of the oxide of the low-carbon solubility material in the third portion 131a of the capping layer 130a is greater than that in the second portion 137a of the oxide layer 130a. In some embodiments, the third portion 131a of the capping layer 130a includes material that is substantially the same as that of the first portion 134a in the capping layer 130a shown in FIG. 34A. In some embodiments, nitrogenizing of the capping layer 130a may increase its hardness and etching resistance, as well as lower a carbon solubility of the capping layer.

Figure 34E:
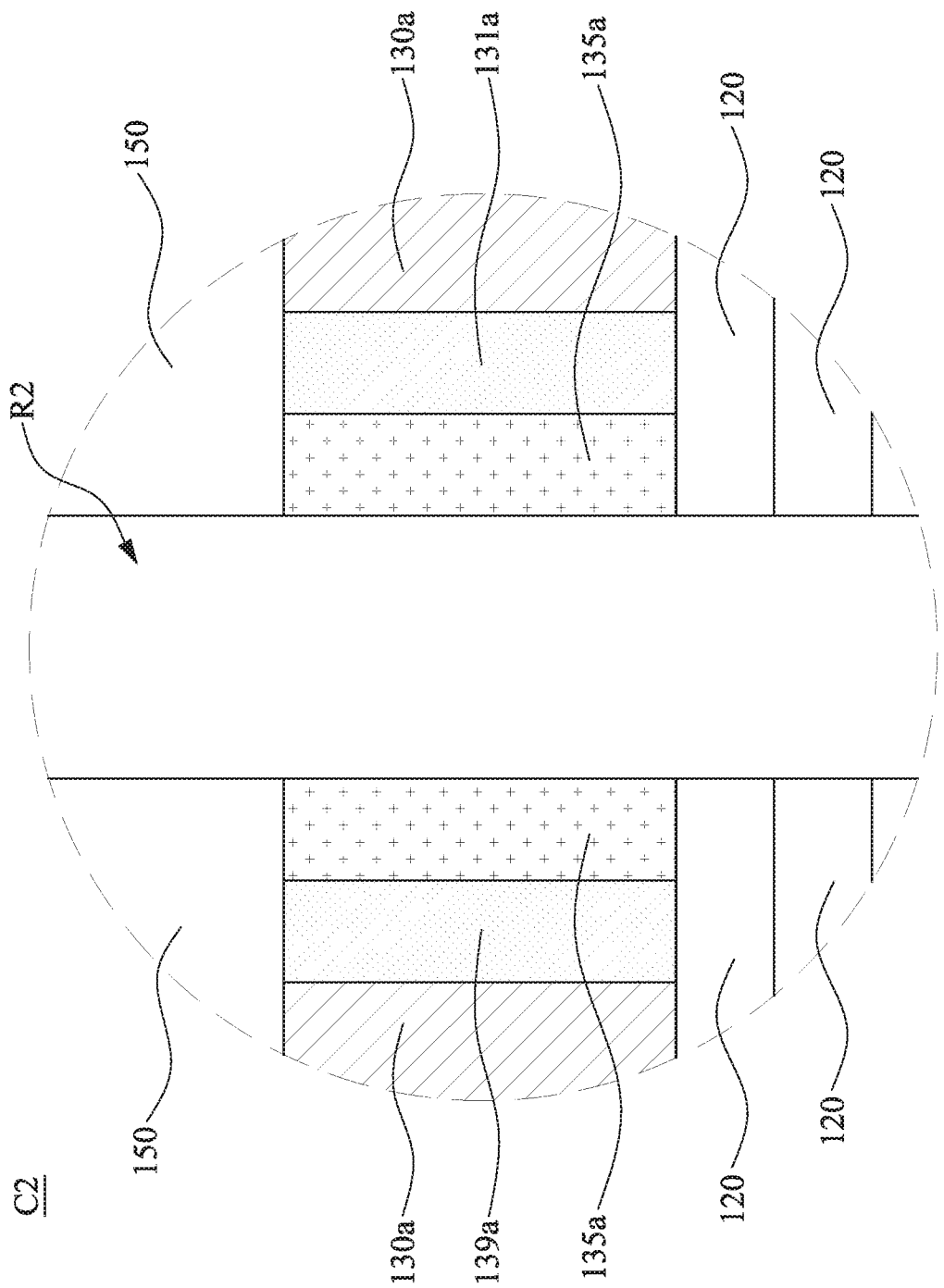

Reference is made to FIGS. 33, 34B, and 34E. FIGS. 34B and 34E are local enlarged views of the mask 200a according to FIG. 33 in regions C1 and C2, respectively.

In some embodiments, the cleaning process 410 is performed on the capping layer 130a as shown in FIG. 34A, thereby further oxidizing the capping layer 130a as illustrated in FIG. 34A to form a first oxide portion 136a and a second oxide portion 138a above the first oxide portion 136a as illustrated in 34B.

In some embodiments, the second oxide portion 138a includes oxide of a low-carbon solubility material. In some embodiments, the second oxide portion 138a is ruthenium-free. For example, if the second oxide portion 138a in the capping layer 130a shown in FIG. 34B includes an oxide material of a low-oxygen reactive material, such as $RuO_2$, then oxidizing of the capping layer 130a may convert $RuO_2$ to $RuO_4$ which will be vaporized and leave the oxide of the low-carbon solubility material in the capping layer 130a to form the second oxide portion 138a as shown in FIG. 34B. In addition, $RuO_2$ in the first portion 134a shown in FIG. 34A which does not convert to $RuO_4$ due to the oxidizing will form the first oxide portion 136a with the low-carbon solubility material as shown in FIG. 34B.

The second oxide portion 138a serves as a diffusion barrier which reduces the carbon poisoning of the capping layer 130a. Therefore, the second oxide portion 138a containing the low-carbon solubility material may lower the dissociation/diffusion of the carbon therein and reduce the carbon buildup on the surface of the capping layer 130a, such that the reflective properties of the mask 200a may be improved.

In some embodiments, the first oxide portion 136a includes ruthenium in which the carbon solubility thereof is about 0.3 atomic percentage, and the carbon solubility of the oxide of the low-carbon solubility material in the second oxide portion 138a is less than about 0.3 atomic percentage. In some embodiments, the second oxide portion 138a includes oxide of a niobium-containing material, such as $NbO_x$. For example, the second oxide portion 138a may include $Nb_2O_5$. In some embodiments, the second oxide layer 136d may include oxide of RuNb, RuTi, RuZr, RuY, RuB, or combinations thereof. In some embodiments, an atomic percentage of the oxide of the low-carbon solubility material in the second oxide portion 138a is greater than that in the first oxide portion 138a and the second portion 137a of the capping layer 130a. In some embodiments, the first oxide portion 136a includes material that is substantially the same as that of the first portion 134a in the capping layer 130a shown in FIG. 34A.

In some embodiments, the cleaning process 410 is performed on the capping layer 130a as shown in FIG. 34D, thereby further oxidizing the capping layer 130a as illustrated in FIG. 34D to form the third oxide portion 135a exposed by the recess R2 and the fourth oxide portion 139a covered by the absorption layer 150 and the third oxide portion 135a as illustrated in 34E.

In some embodiments, the third oxide portion 135a includes oxide of a low-carbon solubility material. In some embodiments, the third oxide portion 135a is ruthenium-free. For example, if the third oxide portion 135a in the capping layer 130a shown in FIG. 34E includes an oxide material of a low-oxygen reactive material, such as $RuO_2$, then oxidizing of the capping layer 130a may convert $RuO_2$ to $RuO_4$ which will be vaporized and leave the oxide of the low-carbon solubility material in the capping layer 130a to form the second oxide portion 135a as shown in FIG. 34E. In addition, $RuO_2$ in the third portion 131a shown in FIG. 34D which does not convert to $RuO_4$ due to the oxidizing will form the fourth oxide portion 139a with the low-carbon solubility material as shown in FIG. 34E.

The third oxide portion 135a serves as a diffusion barrier which reduces the carbon poisoning of the capping layer 130a. Therefore, the third oxide portion 135a containing the low-carbon solubility material may lower the dissociation/diffusion of the carbon therein and reduce the carbon buildup on the surface of the capping layer 130a, such that the reflective properties of the mask 200a may be improved.

In some embodiments, the third oxide portion 135a includes material substantially the same as that of the second oxide portion 138a in the capping layer 130a shown in FIG. 34B. In some embodiments, the fourth oxide portion 139a includes material that is substantially the same as that of the first oxide portion 136a in the capping layer 130a shown in FIG. 34B.

Figure 34F:
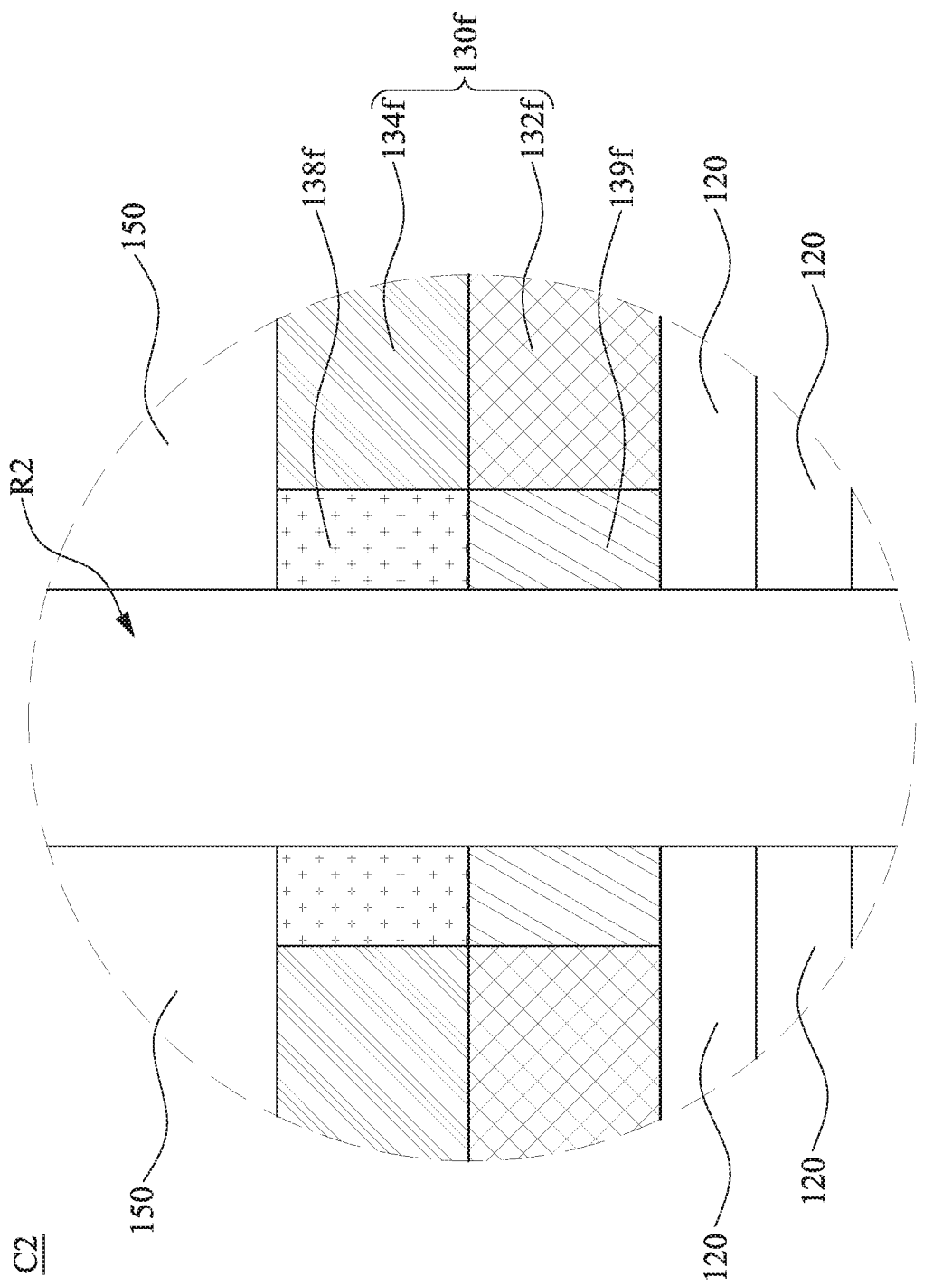

Reference is made to FIGS. 33, 34C, and 34F. FIGS. 34C and 34F are local enlarged views of the mask 200f according to FIG. 33 in regions C1 and C2, respectively. As shown in FIGS. 33, 34C, and 34F, the cleaning process 410 shown in FIG. 33 is performed on the capping layer 130f using at least one of oxygen, thereby oxidizing the capping layer 130f as illustrated in FIGS. 34C and 34F. The cleaning process 410 is designed to introduce at least one of oxygen to the capping layer 130f such that it is densified to enhance an anti-carbon effect of the capping layer 130f. Particularly, the capping layer 130f which has undergone the cleaning process 410 is oxidized to have a tightly-packed structure. In some embodiments, the capping layer 130f which has undergone the cleaning process 410 is an amorphous structure for anti-carbon dissociation/diffusion. After the capping layer 130f which has undergone the cleaning process 410 is treated by oxygen, the grains of material shrink and the capping layer is converted to an amorphous structure. This is used to provide an anti-carbon barrier, where the amorphous phase means fewer diffusion paths than with a polycrystalline structure.

In FIGS. 34C and 34F, the cleaning process 410 is applied to the capping layer 130f through the recesses R1 and R2 of the absorption layer 150 using the absorption layer 150 as a mask that effectively blocks the covered portions of the capping layer from the cleaning process 410.

Referring to FIG. 34C, the capping layer 130f includes a first portion 136f uncovered by the absorption layer 150 and a second portion 137f covered by the absorption layer 150. The first portion 136f is within the recesses R1 of the absorber layer 150. In some embodiments, the first portion 136f of the capping layer 130f is spaced apart from the reflective ML 120 and the absorption layer 150. After the cleaning process 410, the first portion 136f is changed (oxidized), while the second portion 137f remains free of the cleaning process 410 and therefore is different from the first portion 136f in composition. For example, an atomic percentage of the oxide of the low-carbon solubility material in the first portion 136f of the capping layer 130f is greater than that in the second portion 137f of the capping layer 130f. In some embodiments, an atomic percentage of the oxide of the low-carbon solubility material in the first portion 134a of the capping layer 130a is greater than that in another portion between the first portion 134a and the first metal layer 132f as shown in FIG. 18B.

In some embodiments, the first portion 136f of the capping layer 130f includes oxide of a low-carbon solubility material. In some embodiments, the oxide of the low-carbon solubility material of the first portion 136f has a carbon solubility lower than a carbon solubility of another portion between the first portion 136f and the first metal layer 132f as shown in FIG. 18B. In some embodiments, the oxide of the low-carbon solubility material of the first portion 136f has a carbon solubility lower than a carbon solubility of the second portion 137f of the capping layer 130f. The first portion 136f serves as a diffusion barrier which reduces the carbon poisoning of the capping layer 130f.

In some embodiments, the first portion 136f of the capping layer 130f includes oxide of a niobium-containing material, such as $NbO_x$. For example, the first portion 136f of the capping layer 130f may include $Nb_2O_5$. In some embodiments, the first portion 136f may include RuNb, RuTi, RuZr, RuY, RuB, or combinations thereof. In some embodiments, the first portion 136f of the capping layer 130f is ruthenium-free.

Referring to FIG. 34F, the capping layer 130f includes third and fourth portions 138f and 139f exposed by the recess R2. After the cleaning process 410, the third and fourth portions 138f and 139f are changed (oxidized). In some embodiments, the third portion 138f of the capping layer 130f includes material that is substantially the same as that of the first portion 136f in the capping layer 130f shown in FIG. 34C. In some embodiments, the fourth portion 139f of the capping layer 130f includes material that is substantially the same as that of the oxide layer 136g of the capping layer 130g as shown in FIGS. 19A and 19B.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. The capping layer of the mask is designed to function as an anti-carbon barrier layer to protect the reflective ML from carbon buildup formed thereon, in which such carbon buildup may absorb the light (radiation) projected onto the mask. In some embodiments, the capping layer includes a low-carbon solubility material. The capping layer containing the low-carbon solubility material may lower the dissociation/diffusion of the carbon into metal and reduce the carbon buildup on the surface thereof, such that the reflective properties of the mask may be improved.

In some embodiments of the present disclosure, a method of forming a mask includes forming a reflective multilayer over a substrate; forming a capping layer over the reflective multilayer, in which the capping layer includes a ruthenium-containing material and a low carbon solubility material that has a carbon solubility lower than a carbon solubility of the ruthenium-containing material; forming an absorption layer over the capping layer; and etching the absorption layer until exposing the capping layer.

In some embodiments of the present disclosure, a method of forming a mask includes forming a reflective multilayer over a substrate; forming a ruthenium-containing layer over the reflective multilayer; forming a niobium-containing layer over the first capping layer, forming an absorption layer over the niobium-containing layer; and etching the absorption layer until exposing the niobium-containing layer.

In some embodiments of the present disclosure, a mask includes a substrate, a reflective multilayer, a capping layer, and a patterned absorption layer. The reflective multilayer is over the substrate. The capping layer is over the reflective multilayer. The capping layer includes a ruthenium-containing material and a low carbon solubility material that has a carbon solubility lower than a carbon solubility of the ruthenium-containing material. The patterned absorption layer is over the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a mask comprising:
   forming a reflective multilayer over a substrate;
   forming a capping layer over the reflective multilayer, wherein the capping layer comprises a ruthenium-containing material and a low carbon solubility mate- rial that has a carbon solubility lower than a carbon solubility of the ruthenium-containing material;

performing an oxygen plasma process on the capping layer to oxidize the low carbon solubility material of the capping layer;

after performing the oxygen plasma process on the capping layer, forming an absorption layer over the capping layer; and etching the absorption layer until exposing the capping layer.

2. The method of claim 1, wherein the low carbon solubility material comprises a niobium-containing material.

3. The method of claim 1, wherein the low carbon solubility material comprises RuNb, RuTi, RuZr, RuY, RuB, or combinations thereof.

4. The method of claim 1, wherein the ruthenium-containing material is less reactive with oxygen than the low carbon solubility material.

5. The method of claim 1, further comprising:
oxidizing the low carbon solubility material of the capping layer subsequent to etching the absorption layer.

6. The method of claim 5, wherein oxidizing the low carbon solubility material of the capping layer is performed such that a surface of the etched absorption layer is oxidized to form an anti-reflective layer.

7. The method of claim 1, further comprising forming an anti-reflective layer over the absorption layer prior to etching the absorption layer.

8. The method of claim 1, further comprising vaporizing the ruthenium-containing material of a portion of the capping layer.

9. The method of claim 8, wherein the capping layer has a first portion, and a second portion between the first portion and the absorption layer, and vaporizing the ruthenium-containing material is performed such that an atomic percentage content of the ruthenium-containing material in the second portion is lower than an atomic percentage content of the ruthenium-containing material in the first portion.

10. The method of claim 8, wherein the capping layer has a first portion exposed by the etched absorption layer and a second portion covered by the etched absorption layer, and vaporizing the ruthenium-containing material is performed such that an atomic percentage content of the ruthenium-containing material in the second portion is greater than an atomic percentage content of the ruthenium-containing material in the first portion.

11. The method of claim 1, wherein an atomic percentage content of the low-carbon solubility material in the capping layer is in a range from about 5% to about 80%.

12. A method of forming a mask comprising:
forming a reflective multilayer over a substrate;
forming a ruthenium-containing layer over the reflective multilayer;
forming a niobium-containing layer over the ruthenium-containing layer, wherein the niobium-containing layer is ruthenium-free;
forming an absorption layer over the niobium-containing layer; and
etching the absorption layer until exposing the niobium-containing layer.

13. The method of claim 12, wherein a carbon solubility of the niobium-containing layer is lower than a carbon solubility of the ruthenium-containing layer.

14. The method of claim 12, wherein the ruthenium-containing layer is niobium-free.

15. The method of claim 12, further comprising oxidizing the niobium-containing layer to lower a carbon solubility thereof prior to forming the absorption layer.

16. The method of claim 12, further comprising nitrogenizing the niobium-containing layer to lower a carbon solubility thereof.

17. The method of claim 12, further comprising:
oxidizing a surface of the etched absorption layer to form an anti-reflective layer.

18. A mask comprising:
a substrate;
a reflective multilayer over the substrate;
a capping layer over the reflective multilayer, wherein the capping layer comprises a ruthenium-containing material and a low carbon solubility material that has a carbon solubility lower than a carbon solubility of the ruthenium-containing material;
a patterned absorption layer over the capping layer; and
an anti-reflective layer over the patterned absorption layer and in contact with the capping layer.

19. The mask of claim 18, wherein atomic percentage content of the low-carbon solubility material in the capping layer is in a range from about 5% to about 80%.

20. The mask of claim 18, wherein the low carbon solubility material comprises RuTi, RuZr, RuY, RuB, or combinations thereof.

* * * * *